(12) United States Patent
Merkle et al.

(10) Patent No.: US 10,949,166 B2
(45) Date of Patent: Mar. 16, 2021

(54) MECHANICAL COMPUTING SYSTEMS

(71) Applicant: CBN Nano Technologies Inc., Ottawa (CA)

(72) Inventors: Ralph C. Merkle, Santa Clara, CA (US); Robert A. Freitas, Jr., Pilot Hill, CA (US); James Ryley, Downey, CA (US); Matthew Moses, Lafayette, CO (US); Tad Hogg, Mountain View, CA (US)

(73) Assignee: CBN Nano Technologies Inc., Ottawa (CA)

(*) Notice: Subject to any disclaimer, the term of this patent is extended or adjusted under 35 U.S.C. 154(b) by 0 days.

(21) Appl. No.: 16/573,435

(22) Filed: Sep. 17, 2019

(65) Prior Publication Data
US 2020/0026490 A1    Jan. 23, 2020

Related U.S. Application Data

(63) Continuation-in-part of application No. 14/986,568, filed on Dec. 31, 2015, now Pat. No. 10,481,866.

(51) Int. Cl.
| | | |
|---|---|---|
| *G06F 5/01* | (2006.01) | |
| *H01B 3/30* | (2006.01) | |
| *H01B 3/18* | (2006.01) | |
| *H03K 19/20* | (2006.01) | |

(52) U.S. Cl.
CPC ............ *G06F 5/01* (2013.01); *H01B 3/18* (2013.01); *H01B 3/307* (2013.01); *H03K 19/20* (2013.01)

(58) Field of Classification Search
CPC .. G06N 10/00; H03K 2017/515; H03K 19/20; H01B 3/18; H01B 3/307; G06F 5/01
See application file for complete search history.

(56) References Cited

U.S. PATENT DOCUMENTS

| | | |
|---|---|---|
| 2,542,258 A | 11/1947 | Newbold |
| 2,621,855 A | 1/1951 | Hauser |
| 3,273,794 A | 9/1966 | Lieberman et al. |
| 3,403,459 A | 10/1968 | Divilbliss |
| 3,673,688 A | 7/1972 | Garlick |
| 3,707,619 A | 12/1972 | Shapiro |
| 3,718,279 A | 2/1973 | Westfall |
| 3,721,806 A | 3/1973 | Stothart |
| 3,747,844 A | 7/1973 | Youngman |
| 3,916,155 A | 10/1975 | Philips |
| 3,961,171 A * | 6/1976 | Freeman .............. G06F 17/15 708/212 |
| 3,963,098 A * | 6/1976 | Lewis ................ B66B 1/3492 187/394 |

(Continued)

OTHER PUBLICATIONS

Athas, Koller, Tzartzanis, & Chou. Low-Power Digital Systems Based on Adiabatic-Switching Principles. *IEEE Transactions on Very Large Scale Integration (VLSI) Systems.* (1994) vol. 2, pp. 398-407.

(Continued)

*Primary Examiner* — Daniel I Walsh

(57) ABSTRACT

Systems and methods are disclosed for creating mechanical computing mechanisms and Turing-complete systems which include combinatorial logic and sequential logic, and which are energy-efficient.

19 Claims, 39 Drawing Sheets

(56) References Cited

U.S. PATENT DOCUMENTS

| | | | | |
|---|---|---|---|---|
| 4,051,998 | A * | 10/1977 | Zabel | B67D 7/228 |
| | | | | 705/413 |
| 4,561,049 | A * | 12/1985 | Deleganes | G06F 3/0485 |
| | | | | 345/184 |
| 4,835,371 | A | 5/1989 | Rogers | |
| 5,084,609 | A | 1/1992 | Saber | |
| 5,196,841 | A * | 3/1993 | Harder | E05B 65/0075 |
| | | | | 340/5.54 |
| 5,357,548 | A | 10/1994 | Merkle | |
| 5,378,940 | A * | 1/1995 | Knight, Jr. | H03K 19/0019 |
| | | | | 326/121 |
| 5,946,674 | A | 8/1999 | Nordin et al. | |
| 6,266,569 | B1 | 7/2001 | Shapiro et al. | |
| 6,311,757 | B1 | 11/2001 | Schuette et al. | |
| 6,441,405 | B1 * | 8/2002 | Smith | G11C 23/00 |
| | | | | 257/103 |
| 6,774,222 | B1 | 8/2004 | Schneider | |
| 6,987,402 | B2 | 1/2006 | Lee et al. | |
| 7,009,350 | B1 | 3/2006 | Gold | |
| 7,414,437 | B1 | 8/2008 | Blick et al. | |
| 8,365,137 | B2 | 1/2013 | Fant | |
| 8,436,637 | B1 * | 5/2013 | Ditto | H03K 19/20 |
| | | | | 326/7 |
| 8,855,248 | B2 | 10/2014 | Barner | |
| 9,150,405 | B2 | 10/2015 | Carter et al. | |
| 10,122,365 | B2 * | 11/2018 | Pascall | G06F 7/388 |
| 10,222,822 | B2 * | 3/2019 | Gilbert | G02F 1/3526 |
| 10,481,866 | B2 * | 11/2019 | Merkle | G06F 7/388 |
| 10,664,233 | B2 * | 5/2020 | Merkle | G06F 5/01 |
| 10,678,293 | B2 * | 6/2020 | Pascall | H03K 19/02 |
| 10,683,924 | B1 * | 6/2020 | Ryley, III | F16H 53/025 |
| 2003/0040168 | A1 | 2/2003 | Cain et al. | |
| 2003/0098488 | A1 | 5/2003 | O'Keeffe et al. | |
| 2003/0172205 | A1 * | 9/2003 | Bastian | G06C 15/00 |
| | | | | 710/45 |
| 2004/0090210 | A1 | 5/2004 | Becker et al. | |
| 2004/0247241 | A1 | 12/2004 | Briggs | |
| 2005/0156155 | A1 | 7/2005 | Atanackovic | |
| 2007/0095886 | A1 | 5/2007 | Belton | |
| 2007/0188846 | A1 * | 8/2007 | Slicker | H01H 1/0036 |
| | | | | 359/290 |
| 2009/0167348 | A1 * | 7/2009 | Dorairaj | H03K 19/1733 |
| | | | | 326/40 |
| 2011/0035866 | A1 | 2/2011 | Ricca | |
| 2011/0278365 | A1 | 11/2011 | Swartz | |
| 2012/0265980 | A1 | 10/2012 | Moon et al. | |
| 2015/0186683 | A1 | 7/2015 | Fiske | |
| 2016/0006519 | A1 * | 1/2016 | Lail | H04B 10/90 |
| | | | | 455/899 |
| 2017/0069860 | A1 | 3/2017 | Zorlutuna | |
| 2017/0192748 | A1 * | 7/2017 | Merkle | H01B 3/307 |
| 2018/0006804 | A1 | 1/2018 | Fiske | |
| 2018/0293493 | A1 * | 10/2018 | Kalamkar | G06T 1/20 |
| 2019/0144035 | A1 | 5/2019 | Doerksen et al. | |
| 2019/0206861 | A1 | 7/2019 | Beigel et al. | |
| 2020/0026490 | A1 * | 1/2020 | Merkle | H01B 3/18 |

OTHER PUBLICATIONS

Axelsen & Gluck. A Simpe and Efficient Universal Reversible Turring Machine. (2011) vol. 2018: DIKU, Dept. of Computer Science, University of Copenhagen.
CH Bennett. Logical reversibility of computation. *IBM Journal of Research and Development.* (1973) vol. 17, pp. 525-532.
Charles Bennett. The Thermodynamics of Computation: A Review. *International Journal of Theoretical Physics.* (1982) vol. 21, pp. 905-940.
Charles Bennett & Landauer. The Fundamental Physical Limits of Computation. *Scientific American.* (1985).
Berut et al. Experimental verification of Landauer's principle linking information and thermodynamics. *Nature.* (2012) vol. 483, pp. 187-189: Nature Publishing Group.
Boruah & Dutta. DNA Computing Models for Boolean Circuits and Logic Gates. *2015 IEEE International Conference on Computational Intelligence & Communication Technology.* (2015) pp. 529-533.
Bradley. Mechanical Computing in Microelectromechanical Systems (MEMS). *Air Force Institute of Technology.* (2003) pp. 172. Ohio.
Bray & Duke. Conformational spread: the propagation of allosteric states in large multiprotein complexes. *Annu Rev Biophys Biomol Struct.* (2004) vol. 33, pp. 53-73.
Buck. The Cryotron—a superconductive computer component. *Proceedings of the IRE.* (1956) vol. 44, pp. 482-493.
Chowdhury. Micro-Electro-Mechanical-Systems-Based Single-Device Digital Logic Gates for Harsh Environment Applications. *Department of Electrical and Computer Engineering.* (2013) vol. Ph.D., pp. 170: The University of Utah.
Debenedicitis. Reversible Logic for Supercomputing. *ACM.* (2005).
Drexler. Nanomechanical Computation Systems. *Nanosystems Molecular Machinery, Manufacturing, and Computation.* (1992) pp. 342-371. New York: John Wiley & Sons, Inc.
Ekinci & Roukes. Nanoelectromechanical systems. *Review of Scientific Instruments.* (2005) vol. 76, pp. 061101.
Feynman. Quantum Mechanical Computers. *Foundations of Physics.* (1986) vol. 16, pp. 507-531.
Forrest. Integrated nanosystems for Atomically Precise Manufacturing. U. S. D. o. Energy (Ed.). (2015). Berkely, CA, US.
Frank. Introduction to Reversible Computing: Motivation, Progress, and Challenges. *Second Conference on Computing Frontiers.* (2005) pp. 385-390. Tallahassee, FL, US.
Frantz, Baldridge, & Siegel. Application of Structural Principles to the Design of Triptycene-Based Molecular Gears with Parallel Axes. *CHIMIA International Journal for Chemistry.* (2009) vol. 63, pp. 201-204.
Gosselin & Angeles. Singularity analysis of closed-loop kinematic chains. *IEEE Transactions on Robotics and Automation.* (1990) vol. 6, pp. 281-290.
Hall. Nanocomputers and Reversible Logic. *Nanotechnology.* (1994) vol. 5, pp. 157-167.
Han, Globus, Jaffe, & Deardorff. Molecular dynamics simulations of carbon nanotube-based gears. *Nanotechnology.* (1997) vol. 8, pp. 95-102.
Heinrich, Lutz, Gupta, & Eigler. Molecule Cascades. *Science.* (2002) vol. 298, pp. 1381-1387.
Isobe, Hitosugi, Yamasaki, & Iizuka. Molecular bearings of finite carbon nanotubes and fullerenes in ensemble rolling motion. *Chemical Science.* (2013) vol. 4, pp. 1293.
Kam, Liu, Stojanovi, Markovic, & Alon. Design, Optimization, and Scaling of MEM Relays for Ultra-Low-Power Digital Logic. *IEEE Transactions on Electron Devices.* (2011) vol. 58, pp. 236-250.
Khuong, Dang, Jarowski, Maverick, & Garcia-Garibay. Rotational dynamics in a crystalline molecular gyroscope by variable-temperature 13C NMR, 2H NMR, X-ray diffraction, and force field calculations. *J Am Chem Soc.* (2007) vol. 129, pp. 839-845.
Kottas, Clarke, Horinek, & Michl. Artificial Molecular Rotors. *Chem. Rev.* (2005) vol. 105, pp. 1281-1376.
Landaur. Irreversibility and Heat Generation in the Computing Process. *IBM Journal of Research and Development.* (1961).
Mahboob, Nishiguchi, Fujiwara, & Yamaguchi. Interconnect-free parallel logic circuits in a single mechanical resonator. *Nature Communications.* (2011) vol. 2, pp. 198.
Manzano et al. Step-by-step rotation of a molecule-gear mounted on an atomic-scale axis. *Nature Materials.* (2009) vol. 8, pp. 576: Nature Publishing Group.
R. Merkle. Two Types of Mechanical Reversible Logic. *Nanotechnology.* (1990) vol. 4, pp. 114-131.
R. C. Merkle. Reversible Logic. R. C. Merkle (Ed.), *Nanotechnology.* (2007) vol. 2007, pp. Summary of resources on reversible logic: Zyvex.
Modi et al. Design, Analysis and Fabrication of a Microflexural and Gate. *13th National Conference on Mechanisms and Machines (NaCoMM07).* (2007). Bangalore, India.
Moon & Jeong. An efficient charge recovery logic circuit. *IEEE Journal of Solid-State Circuits.* (1996) vol. 31, pp. 514-522.

(56) References Cited

OTHER PUBLICATIONS

Okamoto, Tanaka, & Saito. DNA Logic Gates. *J Am Chem Soc.* (2004) vol. 126, pp. 9458-9463.
Orbach, Remacle, Levine, & Willner. Logic reversibility and thermodynamic irreversibility demonstrated by DNAzyme-based Toffoli and Fredkin logic gates. *PNAS.* (2012) vol. 109, pp. 21228-21233.
Park & Kim. Singularity Analysis of Closed Kinematic Chains. *Journal of Mechanical Design.* (1999) vol. 121, pp. 32-38.
Plummer & Greenwood. The history of Nuclear Weapon Safety Devices. S. n. Laboratories (Ed.). (1998). Albuquerque, NM, US.
Reif. Mechanical Computing: The Computational Complexity of Physical Devices. R. Meyers (Ed.), *Encyclopedia of Complexity and System Science.* (2009) pp. 5466-5482: Springer-Verlag.
Remon et al. Reversible molecular logic: a photophysical example of a Feynman gate. *Chemphyschem.* (2009) vol. 10, pp. 2004-2007.
Roukes. Mechanical Computing, Redux? *Electron Devices Meeting, IEDM Technical Digest.* (2004) vol. 13-15 Dec. 2004, pp. 539-542.
Roy, Sethi, Topolancik, & Vollmer. All-Optical Reversible Logic Gates with Optically Controlled Bacteriorhodopsin Protein-Coated Microresonators. *Advances in Optical Technologies.* (2012) vol. 2012, pp. 1-12.
Sharma, Ram, & Amarnath. Mechanical Logic Devices and Circuits. *14th National Conference on Machines and Mechanisms* (NaCoMM-09). (2009) pp. 235-239.
Skakoon. There's the Rub. *Mechanical Engineering.* (2009) vol. 131, pp. 41-45. New York: Springer.
Svoboda. Computing Mechanisms and Linkages. H. James (Ed.). (1965) pp. 359. New York: Dover Publications.
Toffoli. Technical Report MIT/LCS/TM-151—Reversible Computing. *Automata, Languages and Programming, Seventh Colloquium.* (1980) pp. 632-644. Noordwijkerhout, Netherlands: Springer Verlag.
Toffoli & Fredkin. Conservative Logic. *International Jounral of Theoretical Physics.* (1982) vol. 21, pp. 219-253.
Touretzky. Building the Pascaline: Digital Computing Like It's 1642. (2015). pittsburg, PA, US: Computer Sicence Department, Carnagie Mellon University.
Wang, Liu, Zhang, Guo, & Gao. Molecular Rotors Observed by Scanning Tunneling Microscopy. W. Zhou & Z. Wang (Eds.), *Three-Dimensional Nanoarchitectures.* (2011) pp. 287-316.
Wenzler, Dunn, Toffoli, & Mohanty. A nanomechanical Fredkin gate. *Nano Lett.* (2014), Dec. 18, 2013 ed., vol. 14, pp. 89-93.
Frank. Back to the Future: The Case for Reversible Computing. (2018) pp. 1-19. arXiv.org: arXiv:1803.02789.
Hogg, Moses, & Allis. Evaluating the Friction of Rotary Joints in Molecular Machines. arXiv.org. (2017).
Hong, Lamson, Dhuey, & Bokor. Experimental Test of Landauers Principle in Single-Bit Operations on Nanomagnetic Memory Bits. *Science Advances.* (2016) vol. 2, pp. e1501492.
Ion, Wall, Kovacs, & Baudisch. Digital Mechanical Metamaterials. *Proceedings of the 2017 CHI Conference on Human Factors in Computing Systems—CHI '17.* (2017) pp. 977-988.
R. Merkle et al. Molecular Mechanical Computing Systems. (2016). Institute for Molecular Manufacturing.
R. Merkle et al. Mechanical computing systems using only links and rotary joints. *ASME Journal on Mechanisms and Robotics.* (2018) vol. 10, pp. 061006.
Raney et al. Stable propagation of mechanical signals in soft media using stored elastic energy. *Proc Natl Acad Sci U S A.* (2016), Aug. 16, 2016 ed., vol. 113, pp. 9722-9727.
Serra-Garcia. Turing complete mechanical processor via automated nonlinear system design. (2019), Jun. 14, 2019 ed., pp. 12.
Song et al. Additively manufacturable micro-mechanical logic gates. *Nature Communications.* (2019) vol. 10.
Zhang et al. Simultaneous and Coordinated Rotational Switching of All Molecular Rotors in a Network. *Nature Nanotechnology.* (2016) vol. 11, pp. 706-712.

\* cited by examiner

MECHANICAL COMPUTING SYSTEMS

CROSS-REFERENCE TO RELATED APPLICATIONS

The present application is a continuation-in-part of U.S. application Ser. No. 14/986,568 filed 2015 Dec. 31, incorporated herein by reference.

FEDERALLY SPONSORED RESEARCH

Not applicable.

SEQUENCE LISTING OR PROGRAM

Not applicable.

TECHNICAL FIELD

The present invention relates to the field of computer technology or computer systems relating to general purpose devices that can be programmed to carry out a set of arithmetic or logical operations. More specifically, the present invention is directed to mechanical computing, wherein a mechanical computer is built from mechanical components rather than electronic components.

BACKGROUND

Methods for mechanical computation are well-known in the prior art. (Svoboda, "Computing Mechanisms and Linkages," New York, Dover Publications, 1965; Bradley, "Mechanical Computing in Microelectromechanical Systems (MEMS)," AIR FORCE INSTITUTE OF TECHNOLOGY, AFIT/GE/ENG/03-04, Ohio, 2003; Sharma, Ram et al., "Mechanical Logic Devices and Circuits," 14th National Conference on Machines and Mechanisms (NaCoMM-09), 2009) However, while the earliest example of a Turing-complete design is probably Babbage's Analytical Engine, which was described in 1837 (although never built), the vast majority of previous proposals for mechanical computing are not Turing-complete systems. Rather, they are either special-purpose devices not intended to address general-purpose computing at all, or they are partial systems or mechanisms, lacking crucial capabilities which would allow them to provide Turing-complete systems. For example, with respect to partial systems or mechanisms, known examples include logic gates built from custom parts, kits, or even toys like Lego. Note that mechanical logic gates alone, even universal ones, do not by themselves permit Turing-complete computing; some memory means is also required. Turing-complete computing requires a means for combinatorial logic, as well as a means for sequential logic.

The mechanical computing literature also includes molecular-scale implementations of various computational components (again, often not Turing-complete systems), including (Drexler, "Nanosystems: Molecular Machinery, Manufacturing, and Computation," New York, John Wiley & Sons, 1992; Hall, "Nanocomputers and Reversible Logic," Nanotechnology, 1994; Heinrich, Lutz et al., "Molecule Cascades," Science, 2002; Remon, Ferreira et al., "Reversible molecular logic: a photophysical example of a Feynman gate," Chemphyschem, 12, 2009; Orbach, Remacle et al., "Logic reversibility and thermodynamic irreversibility demonstrated by DNAzyme-based Toffoli and Fredkin logic gates," PNAS, 52, 2012; Roy, Sethi et al., "All-Optical Reversible Logic Gates with Optically Controlled Bacteriorhodopsin Protein-Coated Microresonators," Advances in Optical Technologies, 2012).

While previous designs for mechanical computing vary greatly, previous proposals capable of Turing-complete computing (as opposed to limited-purpose devices) tend to reply upon a substantial number of basic parts (or "primitives") including various types of gears, linear motion shafts and bearings, springs (or other energy-storing means, e.g., some designs use rubber bands), detents, ratchets and pawls, or other mechanisms which have the potential to be energy-dissipative, as well as increasing the complexity of the device. Note that such designs require these various primitives to function properly; they are not optional.

That the use of many types of basic parts in a mechanical system can complicate design, manufacture, and assembly, as well as potentially reducing reliability, is obvious. Reducing the complexity of mechanisms is a common inventive goal.

Note also that many of the mechanisms used in previous proposals for mechanical computing generate substantial friction. Removing such mechanisms would have benefits beyond reducing device complexity, including reduced energy expenditure. However, judged by the prevalence of friction-generating mechanisms in mechanical computing systems, it is difficult to design around this issue.

Perhaps less evident than friction are other modes of energy dissipation, including vibrations, which may, e.g., create heat, or generate acoustic radiation. For example, ratchets and pawls, detents, or other mechanisms which involve the relatively uncontrolled impact of one piece of a mechanism upon another can lead to energy-dissipating vibrations, and so the removal of these types of mechanisms would also have benefit.

Waste heat is a well-known issue for computational systems, electronic or mechanical, which dissipate far more energy per bit operation than is required in theory. In theory, computations can be performed where the energy dissipated is only $\ln(2) k_B T$ per irreversible bit operation. This is called the Landauer Limit (Landauer, "Irreversibility and Heat Generation in the Computing Process," IBM Journal of Research and Development, 1961) and has been confirmed experimentally (Berut, Arakelyan et al., "Experimental verification of Landauer's principle linking information and thermodynamics," Nature, 7388, Nature Publishing Group, 2012).

Note that the Landauer Limit only applies to irreversible operations. Reversible operations can, in theory, dissipate zero energy. While conventional computers are generally not built upon reversible hardware, reversible computing has been studied for decades (Landauer, "Irreversibility and Heat Generation in the Computing Process," IBM Journal of Research and Development, 1961; Bennett, "The Thermodynamics Of Computation," International Journal of Theoretical Physics, 12, 1973; "Logical reversibility of computation," IBM Journal of Research and Development, 6, 1973; Toffoli, "Technical Report MIT/LCS/TM-151—Reversible Computing," Automata, Languages and Programming, Seventh Colloquium, Noordwijkerhout, Netherlands, Springer Verlag, 1980; Toffoli and Fredkin, "Conservative Computing," International Jounral of Theoretical Physics, 3/4, 1982; Bennett and Landauer, "The Fundamental Physical Limits of Computation," Scientific American, 1985; Feynman, "Quantum Mechanical Computers," Foundations of Physics, 6, 1986). For a general overview of reversible computing from a software perspective, see (Perumalla, "Introduction to Reversible Computing," CRC Press, 2014).

Whether reversible or irreversible, novel designs for mechanical computational systems that have the potential to reduce device complexity (along with the associated design, manufacturing and assembly costs) and use less energy per bit operation than existing designs, would be quite useful. Not being subject to the Landauer Limit, reversible designs have the potential to ultimately use the least energy. However, existing computing systems use energy so far in excess of the Landauer Limit that even irreversible designs could greatly improve upon the state of the art.

SUMMARY

Embodiments of the invention include mechanical computing mechanisms and computational systems which have lower energy dissipation, a smaller number of basic parts, and other advantages over previous systems. Multiple embodiments are disclosed including mechanical link logic, mechanical flexure logic, and mechanical cable logic, along with design paradigms (including both mechanical designs, principles, and a novel classification system which categorizes systems as Types 1 through 4) that teach how to apply the general principles to other embodiments.

BRIEF DESCRIPTION OF THE DRAWINGS

For a more complete understanding of the present invention, reference is now made to the following descriptions taken in conjunction with the accompanying drawings, in which:

FIG. 48b depicts a top view of the right half of the finite state machine shown in FIG. 48a.

DETAILED DESCRIPTION

Definitions

Figure 1:
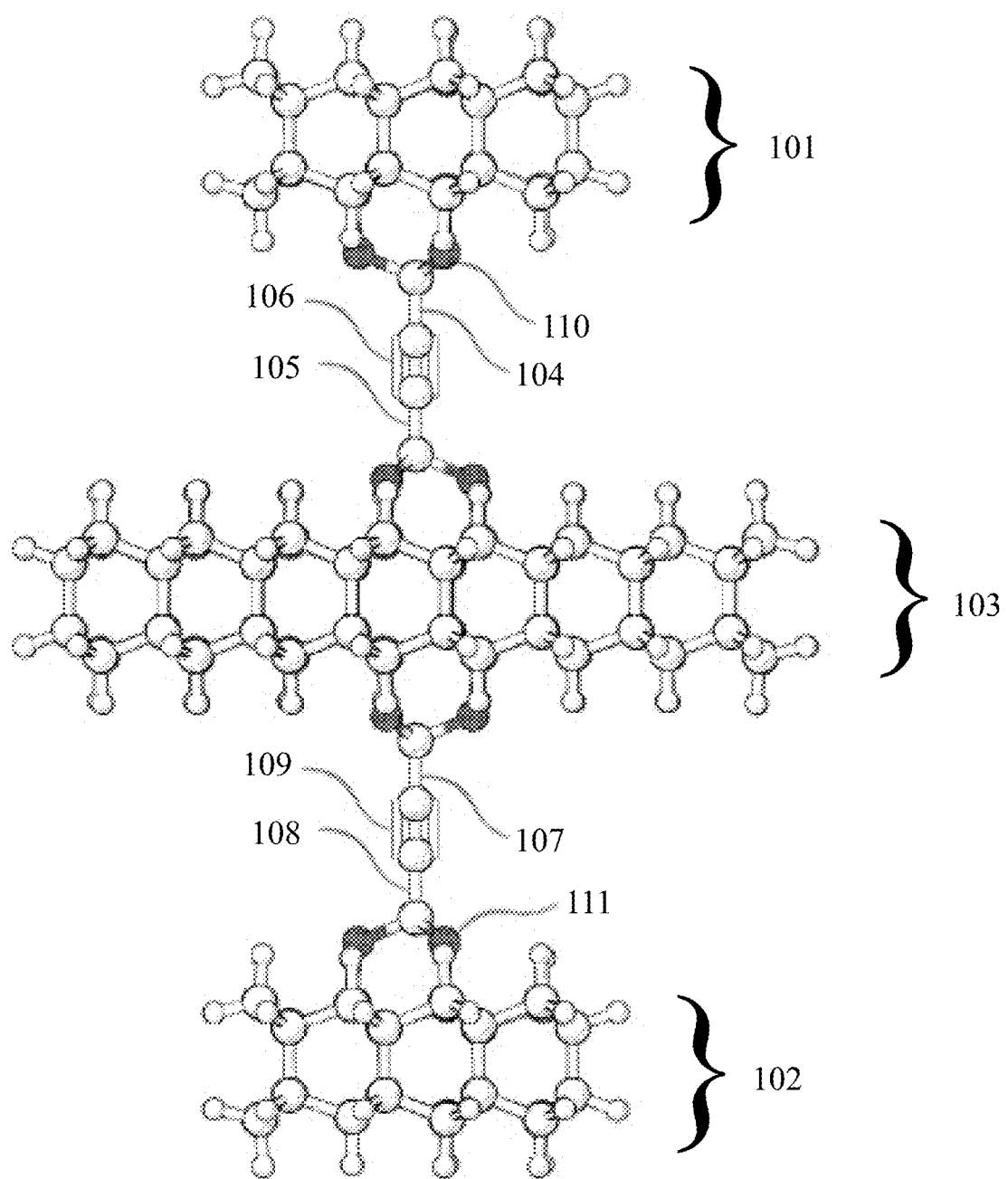
FIG. 1 depicts a side view of a molecular rotary joint.

The following definitions are used herein:

"Anchor block" means one or more rigid structures to which basic parts or higher-level assemblies can be attached, and which may also serve as heat sinks. Note that even when written in the singular, there may be more than one anchor block, as design needs dictate. The shape of an anchor block can be arbitrary ("block" should not be taken to mean that the structure is necessarily rectangular, or any simple shape). An anchor block can be made from any appropriate material, not limited to, but including any of the materials suggested herein from which basic parts could be made. An anchor block is assumed to be present as needed whether explicitly stated or not.

"Anchored" means attached to an anchor block, or otherwise rendered immobile with respect to other relevant basic parts or mechanisms. Anchoring may be permanent or conditional (e.g., depending on data inputs or clock signals), and a conditionally anchored part may be referred to by its relevant conditional state (i.e., if the part is unanchored in a given situation, it may be referred to as unanchored, and vice versa).

"Atomically-precise" means where the identity and position of each atom in a structure are specified by design. Structures such as naturally-occurring or bulk-manufactured crystals or quasicrystals, having surface irregularities, impurities, holes, dislocations or other imperfections, are not atomically-precise. Atomically-precise can, but does not have to, include knowledge of isotopic composition.

A "balance" is a structure which transmits movement through one side or route of a mechanism versus another. Balances can be used, e.g., to perform computations and to route data. A balance may have any number of inputs and outputs, some of which may be anchored, or conditionally anchored (as when connected to a lock). The word "balance" and forms thereof may also be used in its traditional sense (e.g., equal masses or forces 'balance' each other) as context dictates.

A "basic part" is a fundamental building block, or primitive, of a mechanism or computational system. For example, the basic parts of MLL are links and rotary joints, the basic parts of MFL are links and flexures, and the basic parts of MCL are cables, pulleys, and knobs. "Basic part" is synonymous with "primitive," and the distinction between a basic part and a mechanism is that basic parts are, at least in their simplest implementations (e.g., a pulley is a basic part because it can be monolithic, but some implementations of a pulley could require an axle as a separate part), not obviously logically divisible into smaller parts.

A "cable" is a flexible structure used to transmit tensile forces, e.g., directly, or via pulleys.

"Coaxial" refers to rotary joints which share the same axis of rotation. The term may also be applied to the analogous concept in co-planar mechanisms which have multiple joints that share common arcs of movement.

"Computing system" and forms thereof including "computational system" means a system for carrying out general-purpose computations. Such systems are Turing-complete. Devices only capable of solving a single, or a limited class of, problems, such as planimeters, harmonic synthesizers or analyzers, equation solvers, function generators, and differential analyzers, are not capable of general-purpose computing, and are therefore not "computing systems." Power sources, motors, clock signal generators, or other components ancillary to Turing-complete computational means are not part of a computing system. Different types of computational systems may be interfaced. For example, an MLL system could take its input, provide its output, or otherwise interact with other mechanical or electronic computing components, systems, sensors, or data sources, although such a system would only constitute an MLL computational system if the MLL components themselves provide Turing-complete computational means.

"Co-planar" refers to a mechanism that moves in one or more parallel planes. The term is used to differentiate essentially flat (but potentially multi-layer) implementations of mechanisms from those which utilize movement in non-parallel planes. The distinction is largely one of convenience for naming and visualization, as the mechanisms described herein can be constructed in either a co-planar or non-co-planar manner.

"Data link" means a link that aids in transferring data, from one location to another. A data link may be simply called a "link" when context makes the meaning clear.

"Dry switching" as applied to the mechanical computational components described herein means that no force is applied to mechanisms that are not free to move in some way.

A "flexure" is a type of bearing which allows movement through bending of a material, rather than sliding or rolling.

"Fork" means a branch in a line allowing one data link to be coupled to more than one other data link. A fork can, e.g., allow the copying of one input/output to multiple links or lines.

"Input" means the data, for example encoded by physical position, supplied to a mechanism, e.g., for purposes of storing the data in memory, transmitting the data elsewhere, performing combinatorial logic on the data, or actuating the mechanism (e.g., via a clock signal). For a variety of reasons, including that the input to one mechanism can be the output from another, that some mechanisms use the same data as both inputs and outputs (e.g., a circular shift register or other mechanisms with a feedback loop), and because some embodiments permit reversibility, there may be little distinction between "inputs" and "outputs," the use of one term or the other being more for didactic purposes. Therefore, regardless of which term is used, both are assumed to apply if appropriate in a given context.

"Line" means a sequence of connected data links. Also called a "data line."

"Link" means a rigid structure or body connected to one or more rotary joints.

A "lock" is a structure with a plurality of inputs where one or more of the inputs being set to some pre-defined range of values results in the other inputs being locked. For example, in a two-input lock, upon setting one of the inputs to a non-zero value, the other input is locked until the non-zero input is returned to zero. In a two-input binary lock, the non-zero value being set would typically be 1, but the lock mechanism may engage well before the input actually reaches 1 (e.g., an input of 0.1 on one input may be sufficient to lock the other input).

"Logic gate" includes traditionally-irreversible gates such as AND, CNOT, NAND, NOT, OR, NOR, XNOR, XOR, reversible gates such as Fredkin and Toffoli gates, or other mechanisms which provide combinatorial logic (e.g., reversible implementations of traditionally-irreversible gates, or special-purpose logic gates).

"MCL" stands for Mechanical Cable Logic, a paradigm for creating computational systems and mechanisms thereof, using cables, knobs, and pulleys.

A "mechanism" is a combination of basic parts forming an assembly of a level of complexity between that of a basic part and a computational system. For example, in MLL, lines, locks, balances, logic gates, and shift registers are all components, as are any sub-assemblies which include more than one basic part. By virtue of being basic parts, links and rotary joints, or any other basic parts, are not mechanisms.

"MFL" stands for Mechanical Flexure Logic, a paradigm for creating computational systems and mechanisms thereof, using links and flexures.

"MLL" stands for Mechanical Linkage Logic, a paradigm for creating computational systems and mechanisms thereof, using links and rotary joints. Note that as the first and most extensively described embodiment, details are provided for MLL that are not necessarily repeated for MFL, MCL, or other embodiments. For example, clocking is described extensively in the context of MLL, but not other embodiments. Due to the analogous logical and mechanical nature of the various embodiments presented, given the teachings herein, it will be apparent how to apply information presented for one embodiment to other embodiments.

"Not-coaxial" refers to two or more rotary joints which do not share the same axis of rotation, or the analogous concept in co-planar mechanisms.

"Output" means the data, for example encoded by physical position, provided by a mechanism. See "Input" for additional detail and comments on the interchangeability of the two terms.

A "pulley" is a mechanism which facilitates the routing of, and/or transmission of forces by, one or more cables. Traditionally, pulleys rotate as the cable moves, but this is not necessary, e.g., a cable could slide over a pulley's surface if the energy dissipation incurred was suitably low. Pulleys may be anchored or unanchored. Unanchored pulleys may be free to move as dictated by their attached cables, or may have their movements constrained by a track, groove, or other guiding means.

"Rotary joint" means one or more connections between rigid bodies that allow rotational motion about an axis. Rotary joints may be anchored or unanchored.

"Support link" means a link that provides physical support or kinematic restraint for other links.

"Turing-complete" has its standard meaning as used in the field of computer science, with the caveat that, since real-world systems have bounded memory, time, and other parameters, such practical limitations are acknowledged to exist, and so the term "Turing-complete," when applied to an actual system, may be taken to include such limitations (resulting in what may be more precisely called a "linear bounded automata").

INTRODUCTION

Herein it is first shown that a mechanical computational system can be designed solely from two basic parts: links, and rotary joints (plus an anchor block to which these basic parts can be affixed; this will be subsequently assumed and not necessarily mentioned each time), using a design paradigm referred to as Mechanical Linkage Logic ("MLL"). Subsequently, the paradigms of MLL are generalized to show other ways in which simple and efficient mechanical computing systems can be designed, such as Mechanical Flexure Logic ("MFL") and Mechanical Cable Logic ("MCL") (any of which could also be used in combination). Part of this generalization also includes the description of a novel classification system based on ways in which mechanical computing systems can dissipate energy.

These new paradigms can simplify the design and construction of mechanical computing mechanisms and systems, and reduce or eliminate major sources of energy dissipation, such as friction and vibration, while still operating at useful computational speeds. Such computational systems can also be designed to operate reversibly. These, and other factors, offer various benefits over previously-proposed computing systems.

Embodiments of the invention provide all the mechanisms necessary to create Turing-complete computational systems. For example, using MLL, this includes lines, logic gates, locks, and balances, and more complex mechanisms such as shift registers, each requiring no basic parts other than links and rotary joints. Other embodiments (e.g., MFL and MCL) provide analogous basic parts and mechanisms to also permit the creation of Turing-complete computational systems.

Energy-Efficient Mechanical Computing

As discussed herein, mechanical computing systems can dissipate energy in several ways, including friction (including drag caused by thermal movement at the atomic level), and vibrations, which can be caused not only by running a mechanical system fast enough to excite its resonant frequencies (something which can be avoided by controlling clock speed), but by part-to-part impacts or relatively unconstrained releases of energy. Examples of such part-to-part impacts and relatively uncontrolled releases of energy include the snapping motions of ratchet and pawl mechanisms, and detents.

Given these issues, four categories are defined for mechanical computing devices:

Type 1: Devices which store potential energy (e.g., in a spring) and which then release this energy in a manner unconstrained by the computational degrees of freedom. Devices which use ratchets and pawls, or detents, are examples of a Type 1 device, as the release of stored energy by the ratchet and pawl or detent are assumedly not tied to the computational degrees of freedom. In such a device, if, e.g., a ratchet and pawl were present, while the snapping motion of the pawl might occur with a periodicity controlled by a clock system, the energy release of that snapping motion would not be tied to the clock frequency. Rather, the speed of the energy release would be a function of, e.g., the force applied to, and the mass of, the pawl, regardless of the overall computational speed of the system. The resulting collision of the pawl with the ratchet could generate vibrations which waste energy.

Type 2: Devices which store potential energy, and then release this energy in a manner controlled by the computational degrees of freedom. For example, in the MLL systems described herein, if a spring was to be placed between links in a line, as the system drove the line back and forth, the spring would compress and decompress. This compression and decompression would take place gradually, at the frequency imposed by a system clock. The spring would not be allowed to snap an unconstrained part into place at a speed which, from the perspective of the system clock, is arbitrary. Rather, the movement of the spring and attached parts is governed by the computational degrees of freedom. Note that also in the above scenario, the spring is part of a continuous linkage, and so no collision of parts occurs like when a ratchet is impacted by its pawl. This can also help reduce dissipated energy. And, even if part collisions do occur (e.g., see the descriptions of knobs in MCL systems), since the speed with which such contacts occur can be coupled to the computational degrees of freedom, it is possible to choose speeds which do not dissipate unacceptable amounts of energy (and in fact, by driving such impacts with the system clock, which preferably uses a sine wave-like signal, even a relatively fast switching speed can result in very low part velocities at the moment of impact).

Type 3: Devices which do not store more than trivial amounts of potential energy, but have parts with non-trivial unconstrained degrees of freedom. For example, depending on the implementation, systems could be created using MLL where, due to one or more locks being in the blank (0,0) position, connected links are free to move in an essentially random manner due to thermal noise, system vibrations, or other causes. Among other issues, such unconstrained movement can result in having to expend energy to periodically set mechanisms to a known state to ensure reliable operation. (Note that such situations can be avoided with properly designed systems, and this is presented as exemplary only).

Type 4: Devices which do not store more than trivial amounts of potential energy, and have no more than trivial unconstrained degrees of freedom. For example, a properly designed MLL system where all movement is, directly or indirectly, coupled to data inputs and/or the system clock. No components are allowed to freely "float" as might a link connected only to a lock in the blank state. With respect to defining "trivial" unconstrained degrees of freedom, this means those which occur in a small enough portion of the overall system (e.g., one particular type of mechanism has this issue, but the mechanism is rare in the overall system), or those that occur infrequently enough, that they do not materially affect overall energy dissipation. An example of infrequently-occurring unconstrained degrees of freedom would be when some system mechanisms have temporarily unconstrained degrees of freedom during an initialization or reset process. Such processes might only be needed very infrequently compared to standard computation operations, and so would contribute very little to a system's energy dissipation. With respect to defining "trivial" when used in reference to potential energy, note that all mechanical systems will store some potential energy. For example, in theory, even very rigid links deform slightly when force is applied to them. Assuming no permanent deformation, they thus technically store potential energy. Such unavoidable potential energy storage is considered trivial. The point of Type 3 and Type 4 systems is the avoidance of systems which purposefully store potential energy for later release, such as in a system with springs, where those springs and their potential energy are required for the system to function properly.

Note that lack of substantial deformation is not the only way to achieve a Type 3 or Type 4 system. Flexures may have substantial deformation, but can be designed to store trivial amounts of either total or net potential energy, as is explained herein. These categories are generally ordered by their potential for energy efficiency, with Type 1 devices being the least efficient, and Type 4 devices being the most efficient. That being said, the energy efficiency of specific systems depends on implementation details. A Type 2 system could be less efficient than a Type 3 system. A poor implementation could make any system energy inefficient. Due to the use of ratchets and pawls, detents, springs, or other mechanisms which store and then release potential energy in a manner not tied to computational degrees of freedom, all pre-existing Turing-complete systems for mechanical computing can be categorized as Type 1.

Mechanical Linkage Logic

An MLL system is built from various basic parts or primitives. In the embodiments described, these are rotary joints and links, which together form mechanical linkages. Mounted on an anchor block, rotary joints and links can be used to create higher-order mechanisms such as data transmission lines, locks, and balances. Still higher order mechanisms, including logic gates (both reversible and irreversible) and shift registers can be created by combining locks and balances, or implemented more directly using links and rotary joints. This suffices to build a complete computational system.

To demonstrate this, using only links and rotary joints, the design of data lines, logic gates, locks, and balances is explained. Subsequently, using some of these mechanisms, the building of a shift register is described. Shift registers are simple, yet when combined with one or more logic gates which provide for universal combinatorial logic, contain all the fundamental elements required for computation. If the basic parts can build a shift register and appropriate logic gates, it follows that an entire computational system can be built.

Note that most of the mechanisms described are tailored towards binary computational systems. As a result, most links will move between two allowed positions. Some exceptions exist however, such as designs where, for example, when one input is 1, the mechanism drives one or more other inputs "backwards" (uses of words such as "forward," backward" and other directions being didactic conventions only, since no particular directions need be used in actual mechanisms, nor do such directions need to be consistent from one mechanism to the next). In other words, given a two bit input that starts at (0,0), an input of 1 could cause the mechanism to end up in a state such as (1,−1) or (1,−0.5) rather than (1,0). As long as the system is designed to correctly handle such kinematics, this need not be a problem. Also, links internal to the implementation of various mechanisms may move between more than two allowed positions, even if the inputs and outputs are still binary. Binary is used for exemplary purposes because it is the most common type of computational system used in conventional computers. Ternary, quaternary, or other non-binary computational systems could obviously be built using the teachings herein.

The mechanisms herein were frequently simulated or diagrammed with Linkage v3 (free from www.linkagesimulator.com), Autodesk Inventor 2015/2016, or for molecular models, HyperChem, GROMACS, or Gaussian. Many of the figures herein represent sub-assemblies taken out of the context of a complete computational system. As a result, they are not necessarily functional as shown. For example, a given mechanism may not being fully constrained as depicted because, in a complete system, the mechanism would attach to other components to satisfy missing constraints, or would attach to some manner of actuation (e.g., a clock signal). Realistic routing of data has sometimes been omitted in favor of, e.g., straight lines, for clarity. Ancillary support structures, such as anchor blocks, or links which serve only to provide rigidity ("support links"), are generally omitted.

Some diagrams depict parts within mechanisms which are not basic parts of MLL. The most prevalent example of this is the use of linear slides in Linkage models. This is a programmatic convenience because some method of driving inputs is required to run a simulation in Linkage. In an actual system, linear slides would be replaced with, e.g., connections to appropriate inputs/outputs, such as data lines or clock signals. Note that the kinematic solver used by Linkage v3 has no concept of clock cycles, so it cannot drive various inputs sequentially. And, Linkage, and other programs, may fail on valid mechanisms simply because the solver cannot compute the kinematics correctly. Due to these, and other, caveats, the figures herein should not be taken as complete, working mechanisms, but rather as didactic examples which, given the teachings herein, can be readily adapted to create working mechanisms, and combined to create complete computational systems.

Rotary Joints

Friction in a rotary joint can be made smaller and smaller as the size of the rotary joint gets smaller and smaller. At the molecular scale, a rotary joint comprising two atoms rotating around a single bond arguably has zero contact area, and various rotary joints which rotate around the axis of single chemical bonds have been analyzed and found to have very little friction. For example, carbon-carbon single bonds, using carbon atoms mounted on diamond supports, are one way to create a rotary joint that provides rotation with very little energy dissipation.

FIG. 1 depicts a molecular model of one possible implementation of a rotary joint being used to hold a rotating member. An upper support structure 101 and lower support structure 102, which would be connected to, e.g., an anchor block, in a complete device, are used to connect a set of upper and lower bonds, along the same axis of rotation, to a rotating member 103. The upper bonds include upper carbon-carbon single bond 104, upper carbon-carbon single bond 105, and upper carbon-carbon triple bond 106. The lower bonds include lower top carbon-carbon single bond 107, lower bottom carbon-carbon single bond 108, and lower carbon-carbon triple bond 109

The rotary joint is bonded to the support structures by several oxygen atoms, including upper oxygen atom 110 and lower oxygen atom 111. The rotating member 103 as depicted is a roughly circular slab of diamond, but this is representative only, as are the other structures. The rotating member could be a link, a flywheel (e.g., to generate a clock signal), or anything else that needs to rotate, in any shape.

Molecular dynamics simulations indicate that, with or without the acetylenic units exemplified by upper carbon atoms and triple bond 106 and lower carbon atoms and triple bond 109, this structure allows rotation with remarkably little drag. However, interposing an acetylenic unit between the surrounding single bonds further reduces the energy dissipation of such a rotary joint.

Given this example it will be obvious that varied implementations, including other molecular structures, could provide the same type of mechanism. For example, with small modifications to the model depicted in FIG. 1, the oxygen atoms exemplified by oxygen atom 110 and oxygen atom 111, might be replaced with nitrogen, or another element with an appropriate valence, bond strength, and steric properties. Similarly, carbon could be replaced with silicon or other appropriate elements. Or, entirely different structures could be used, including carbon nanotubes or other structures, preferably those which can stiffly hold molecular-scale rotary joints.

Additionally, such a rotary joint does not need to consist of only a single bond or pair (e.g., upper and lower) of bonds. For example, in larger implementations, the rotary joint could be replaced with a vee jewel bearing, a rolling element bearing, nested fullerenes (e.g., carbon nanotubes), or any one of many ways known to allow rotation, preferably with low friction. Also, multiple co-axial rotary joints can be used to create a stronger joint (e.g., using a structure similar to the interdigitated design of a door hinge). And, at the molecule scale, adding additional rotary joints on the same rotational axis could further reduce the rotational barrier if appropriate attention is paid to symmetry. Note that while a rotary joint can be formed using one bond, device strength and stiffness can benefit from a rotating part being held on two sides, as depicted in FIG. 1, and/or using multiple bonds, such as in the "door hinge" example. With respect to molecular-scale embodiments, for ease of description, rotary joints may be referred to as rotating about a single bond, although in some cases it would be more precise to say that multiple bonds may be used to form a single axis of rotation for the overall rotary joint.

The magnitude of the rotational barriers, the torque required to overcome them, the length of the lever arms (e.g., links), and the time to rotate the link through the necessary range of the rotary joint (and how far that range is) all depend on the design of a particular system. As an example, molecular dynamics simulations show that the energy required to rotate a link connected to a molecular rotary joint through one radian at a speed of $1 \times 10E9$ radians/sec and a temperature of 180K can be below $1 \times 10E-25$ J. The Landauer Limit is $1.72 \times 10E-21$ J at 180K. This number is so far above the $1 \times 10E-25$ J figure for a one radian rotation of a link around a rotary joint that even mechanisms that use many rotary joints to perform a single bit operation could do so under the Landauer Limit. Further, it is expected that viscous drag from rotary joints, and energy loss from other vibrational modes, will rapidly decrease as operating temperature decreases due to phonons becoming frozen out.

Links

At their most basic, links are stiff, rod-like structures, although some implementations may have different or substantially more complex shapes. Most of the analysis herein which requires estimations of values such as link mass, resonant frequencies, and heat conduction, assume a link is composed of a diamond rod approximately 20 nm in length and 0.5-0.7 nm in diameter. However, links could be larger, or smaller, or completely different in shape (as seen in the non-co-planar lock examples).

One of the smallest ways to implement a link would be to use a single covalent bond as a link. For example, there are many molecules which have more than one possible configuration, and the transition between configurations ("conformers") could constitute the movement of a link. One specific example is cyclohexane, which has several possible conformations, including two chair conformations, the basic boat conformation, and the twist boat conformation. Switching between different conformations can occur through bond rotation (although other changes, such as changes in bond angle or torsion, may also be present and used), similar to that in the previously-described rotary joint, and results in the movement of one or more of the atoms in the structure.

The ability of such molecular conformational changes to propagate over relatively long distances and through complex networks is known to exist in biology, where it is termed "conformational spread". (Bray and Duke, "Conformational spread: the propagation of allosteric states in large multiprotein complexes," Annu Rev Biophys Biomol Struct, 2004), and it will be apparent that synthetic systems could be designed that work on the same principles as larger linkages, but using only a single bond as a link. Such designs could allow link lengths in the angstrom range.

Figure 2:
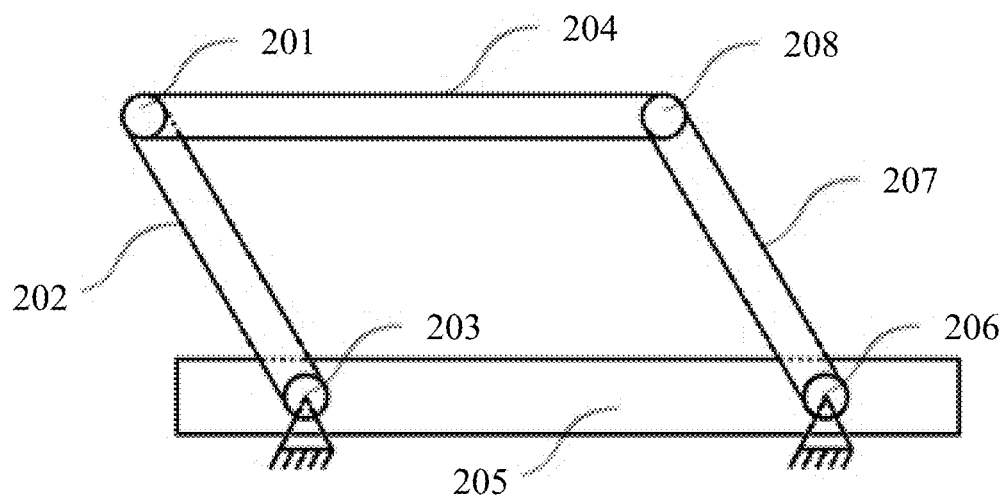
FIG. 2 depicts a side view of a four-bar linkage.

Regardless of the exact implementation of links and rotary joints, one of the basic tasks in a computational system is to move data from place to place. The exemplary systems described use links connected by rotary joints to move data. While many types of linkages would work, including linkages that provide true straight-line movement, 4-bar linkages are frequently used as an exemplary manner of precisely constraining link movement. FIG. 2 depicts a side view of such a 4-bar linkage (note that these are sometimes called 3-bar linkages, since the support structure may or may not be considered an additional bar), comprising an anchor block 205, left support link 202, right support link 207, and data link 204, wherein the lower end of the left support link 202 is connected to the left side of the anchor block 205 by left anchored rotary joint 203 and the lower end of the right support link 207 is connected to the right side of the anchor block 205 by right anchored rotary joint 206, and the upper end of the left support link 202 is connected to the left side of the data link 204 by upper left rotary joint 201 and the upper end of the right support link 207 is connected to the right side of the data link 204 by upper right rotary joint 208. Left anchored rotary joint 203 and right anchored rotary joint 206 are prevented from moving with respect to each other by the anchor block 205. Data link 204 transmits the movement of one support link to another support link. The left support link 202 and right support link 207 are shown shifted to the left. The left-leaning support links put the data link 204 in a position to the left of the left anchored rotary joint 203 and right anchored rotary joint 206. Arbitrarily, this left position can be called "0" or "low", while if the left support link 202 and right support link 207 were leaning to the right, that position could be called "1" or "high." This provides a basis for a binary system of data storage and transfer.

It will be apparent, even in the absence of the anchored rotary joint symbol, that left anchored rotary joint 203 and right anchored rotary joint 206 are anchored rotary joints because they terminate on anchor block 205. In subsequent figures the anchor block may not be explicitly shown. Rather, the diagrammatic convention is often adopted where unfixed rotary joints are depicted as a circle at the intersection of multiple links (which are generally represented as straight lines or bars, although some may have more complex shapes), while fixed or anchored rotary joints are depicted as a circle and a triangle with short diagonal lines at its base. In other figures, generally to reduce complexity, some of these conventions may be changed or eliminated. The figure descriptions and context will make it obvious how such diagrams are to be interpreted.

As has already been described, information can be transmitted along the length of a single data link. However, more complex transmission and routing of data can be useful. One data link can be connected to any number of other data links to continue the transmission of data. Data transmission can continue in a straight line across additional support links (while effectively just a longer data link, it may be useful to include additional support links to increase stiffness), or can change direction at rotary joints, at whatever angle and in whatever plane desired. And, one link can connect to multiple other links not only sequentially, but also through forking structures, effectively copying the data for use in multiple locations. This provides considerable flexibility in routing data.

Data transmission may occur in both directions. Movement of a first data link causes a second data link to move, and movement of the second data link causes the first data link to move. By this means every data link in the chain is tied to its neighbors. All the data links in a chain, which can be of some significant length, can be made to share a common movement, a property that can be used to share a single binary value along the entire length of the chain. A set of connected links is called a line.

Scale

MLL could be implemented using basic parts of virtually any size desired. For example, at macroscopic scales, conventional machining or 3D printing could be used, with, e.g., vee jewel bearings or rolling-element bearings for rotary joints and conventional beams or rods for links. At a smaller scale, e.g., 3D printing, lithography-based techniques, or any of the other well-known ways in which NEMS/MEMS devices can be manufactured, could be used to create devices with mechanisms in the nanometer to micron range. At an even smaller scale, MLL mechanisms could be molecular-scale. Due to the higher operational frequencies and reduced energy dissipation which tend to be afforded by smaller parts, MLL systems would preferably be implemented at the smallest scales feasible (while taking into account factors such as performance requirements and budget). For this reason, while most of the teachings herein are scale-independent, estimations of energy dissipation focus on an exemplary molecular-scale embodiment.

Molecular bearings, gears, and rotors have been studied both theoretically and experimentally, and representative literature includes (Han, Globus et al., "Molecular dynamics simulations of carbon nanotube-based gears," Nanotechnology, 1997; Kottas, Clarke et al., "Artificial Molecular Rotors," Chem. Rev., 2005; Khuong, Dang et al., "Rotational dynamics in a crystalline molecular gyroscope by variable-temperature 13 C NMR, 2H NMR, X-ray diffraction, and force field calculations," J Am Chem Soc, 4, 2007; Frantz, Baldridge et al., "Application of Structural Principles to the Design of Triptycene-Based Molecular Gears with Parallel Axes," CHIMIA International Journal for Chemistry, 4, 2009; Wang, Liu et al., "Molecular Rotors Observed by Scanning Tunneling Microscopy," Three-Dimensional Nanoarchitectures, 2011; Isobe, Hitosugi et al., "Molecular bearings of finite carbon nanotubes and fullerenes in ensemble rolling motion," Chemical Science, 3, 2013; Carter, Weinberg et al., "Rotary Nanotube Bearing Structure and Methods for Manufacturing and Using the Same," U.S. Pat. No. 9,150,405, 2015).

Molecular motors, while not necessarily required to drive MLL systems, are commonplace enough now that entire books and conferences are devoted to the topic. (Joachim and Rapenne, "Single Molecular Machines and Motors: Proceedings of the 1st International Symposium on Single Molecular Machines and Motors," Springer, 2013; Credi, Silvi et al., "Molecular Machines and Motors," Topics in Current Chemistry, Springer, 2014)

Additionally, molecular-scale computing, in various forms (generally not Turing-complete), already exists. (Heinrich, Lutz et al., "Molecule Cascades," Science, 2002; Reif, "Mechanical Computing: The Computational Complexity of Physical Devices," Encyclopedia of Complexity and System Science, Springer-Verlag, 2009; Remon, Ferreira et al., "Reversible molecular logic: a photophysical example of a Feynman gate," Chemphyschem, 12, 2009; Orbach, Remacle et al., "Logic reversibility and thermodynamic irreversibility demonstrated by DNAzyme-based Toffoli and Fredkin logic gates," PNAS, 52, 2012; Roy, Sethi et al., "All-Optical Reversible Logic Gates with Optically Controlled Bacteriorhodopsin Protein-Coated Microresonators," Advances in Optical Technologies, 2012).

In addition to other techniques present in the literature, molecular-scale MLL mechanisms and computational systems could be created using, e.g., molecular manufacturing using mechanosynthesis, or assembly of properly functionalized molecules using atomic force microscopy-type equipment. Conventional chemistry or self-assembly (including DNA origami-type techniques) may also be a feasible route for manufacturing molecular-scale MLL mechanisms. Given the very limited number of basic parts required (e.g., links and rotary joints in MLL) for the presented embodiments, synthesis and assembly of the necessary basic parts and mechanisms is in many ways simpler than the complexities of manufacturing a conventional electronic computer or than implementing previous proposals for mechanical computing.

Energy Dissipation

As noted, an entire MLL system can be constructed with nothing but links and rotary joints. Since, particularly at the molecular-scale, there is very little energy loss from rotation around a well-designed rotary joint, a complete computational system can be designed which dissipates very little energy. Additional MLL design paradigms (e.g., torque and mass balancing to reduce or prevent acoustic radiation) are also discussed herein, and these can help reduce energy dissipation even further. Beyond the physical design of the computational system, operating conditions can also affect energy dissipation. For example, if an MLL system is operated in a vacuum, acceleration and deceleration of links takes place smoothly, and the applied forces are small enough that deformation of basic parts contributes negligible energy dissipation, energy dissipation may be reduced further.

The design of MLL mechanisms, and their interaction with the clocking system, may also affect energy dissipation. For example, MLL systems can be designed such that, by using clock phases appropriately, force is not applied to mechanisms that are not free to move (e.g., such a system does not try to move a locked mechanism without first unlocking it). This is the MLL version of "dry switching," a term normally used in the field of relays to indicate that switches have no voltage across them when changing state, but herein will be used in the context of MLL. Note that while it is a major novel finding of MLL that complete computational systems can be designed with nothing beyond links and rotary joints, MLL systems may incorporate, or interface with, additional components. For example, it is described herein how cams and cam followers are one way to generate clock signals. However, even though cams and cam followers can be designed (as is explained herein) to have minimal energy dissipation, such mechanisms are ancillary to, not actually part of, MLL. Motors or other ways of powering the movement of MLL systems are another example of a function that may be coupled to an MLL system, but are not considered part of MLL, and the same could be said for, for example, input/output interfaces which bridge, e.g., MLL and electronic systems or non-MLL mechanical systems.

Any mechanical system can dissipate substantial energy if run fast enough to excite internal mechanical resonances. To keep power dissipation as low as possible, proper design can avoid low frequency vibrational modes being coupled to the clock, and the remaining vibrational modes can be computed and avoided by picking a speed of operation slow enough to avoid exciting them, as well as a clocking waveform that minimizes their excitation. In a molecular-scale mechanical system such resonant frequencies can be in the gigahertz range, and the limits they impose on switching speed can therefore be correspondingly high.

The switching speed of an MLL system will, just as in electronic computers, be determined by one or more clocks which produce clock signals. If the frequency spectrum of a clock signal has a component of its energy at or above the resonant frequencies of the mechanisms to which it is attached, then a greater fraction of the clock energy could be dissipated than is necessary.

In an MLL system, changes in a clock signal are preferably gradual so as not to generate higher frequency components. For example, the gradual changes inherent in a sine wave-like transition between 0 and 1 (potentially with flat areas at 0 and 1 between transitions to allow for non-perfect synchronization of mechanisms between different clock phases) allow a clock signal to avoid placing greater strain on system mechanisms than necessary as parts accelerate and decelerate more uniformly than if, e.g., a square wave, was used.

There are many ways of generating clock signals. One way of generating a gradually-changing clock signal is to use a spinning mass whose rotational motion is converted into linear or quasi-linear motion. This is, conceptually, the equivalent of a flywheel and crank, and such a device can be made with only links and rotary joints. Some embodiments of MLL systems may couple to other methods of generating clock signals, such as spring and mass systems, or cams and cam followers, which are described herein.

Several possible sources of energy dissipation were analyzed, including stress induced thermal disequilibrium, and acoustic radiation. These were not the primary limiting factors in operating frequency, at least for the exemplary systems analyzed (e.g., molecular-scale, diamond-based systems). Mechanical resonances and inertia are the primary limits to switching speed for these systems.

While thermal equilibration turns out not to be a limiting factor for the exemplary systems analyzed, in some situations it could be, and one objective when seeking to minimize energy dissipation could be to operate mechanisms isothermally. For this reason, short thermal equilibration times can be desirable. To achieve this, the basic parts of the system are preferably well-coupled to one or more thermal reservoirs. For example, links are generally bonded to a rotary joint which is bonded to an anchor block, or to rotary joints that bond to other links, which are in turn bonded to an anchor block. While the exact path length can vary based on the implementation, this tends to keep the path from any link to an anchor block, which can serve as a thermal reservoir, short.

Note that diamond is used as an exemplary anchor block material (and may also be used for basic parts), for among other reasons, due to its high stiffness (Young's Modulus of about 1000 Gpa). Diamond also has good heat conduction, which can be over 2000 W/mK in natural diamond, and higher in defect-free and isotopically purified diamond (a principle which applies to other materials as well). Many other materials could be used, for both anchor blocks and basic parts, although high stiffness would be preferred for various reasons, including raising the frequency of resonant vibrations, and good heat conduction would be preferred if fast thermal equilibration is desired. Other exemplary materials include Carbyne (Young's Modulus of 32,100 GPa), various Fullerenes (e.g., carbon nanotubes can have Young's Moduli of over 1000 GPa, thermal conductivity of 3180-3500 W/mK or higher), Silicon Carbide (Young's Modulus of 450 GPa), and Silicon (Young's Modulus of 130-185 GPa, thermal conductivity of 148 W/mK). Note that these values are approximate, and generally represent values measured at 300K (room temperature). The values may vary substantially depending on a material's atomic structure, purity, isotopic composition, size and shape, and temperature. For example, while Silicon's thermal conductivity is 148 W/mK at 300K, it can exceed 3000 W/mK at temperatures around 20K.

Further, note that MLL systems need not be composed of only one type of material. Various materials each have different pros and cons, including not only bulk properties such as stiffness, thermal conductivity, and thermal expansion, but at the molecular scale, the strength of individual bonds may become important, as may be the exact size of various basic parts and their inter-atomic spacing (e.g., so that they mesh properly with other basic parts, among other concerns). Given this, MLL systems may use a variety of different materials.

The estimated thermal equilibration time of one exemplary molecular-scale embodiment using diamond links about 20 nm in length is ~0.54 ps. Given this, even a few nanoseconds of thermal equilibration makes the energy dissipated due to thermal disequilibrium essentially 0. Therefore, thermal equilibration time is not the limiting factor in switching time for such an embodiment.

In theory, a reversible operation can be carried out with 0 energy, while irreversible operations result in the dissipation of ln(2) kBT of heat (~3×10-21 J at room temperature) per bit erased, regardless of the hardware's efficiency (the Landauer Limit). To reduce the energy dissipation of a program running on a conventional (irreversible) computer, the logic elements of the hardware might be redesigned to dissipate less energy during the computational process. This could result in a significant improvement in energy efficiency because a conventional computer dissipates much more than ln(2) kBT per erased bit. In fact, even when executing instructions that erase no bits at all, a conventional computer dissipates much more than ln(2) kBT per operation. As a consequence, it is possible to reduce the energy dissipation of a conventional computer without paying any attention to reversibility.

However, if the energy efficiency of a computer is improved to the point that the Landauer Limit becomes significant, reversibility becomes important, as it allows computations to be carried out under the Landauer Limit. Consequently, MLL mechanisms are designed to allow reversibility, although both reversible and irreversible computational systems can be implemented using MLL. Note that reversibility can occur at several levels. For example, an individual Fredkin gate is reversible. However, reversibility may also be implemented at higher levels, such as when using a retractile cascade to uncompute a series of previous computations. Such techniques are well-known in the literature, along with appropriate clocking schemes such as Bennett Clocking and Landauer Clocking.

Conventional Logic Gates

Links and rotary joints not only serve as the basic parts for moving data from place to place, but also form the basis for logic gates. An important finding of MLL is that any logic gate, reversible or irreversible, can be implemented with only links and rotary joints, affixed to an anchor block to hold them in place (and which may also serve as a thermal sink).

Figure 3:
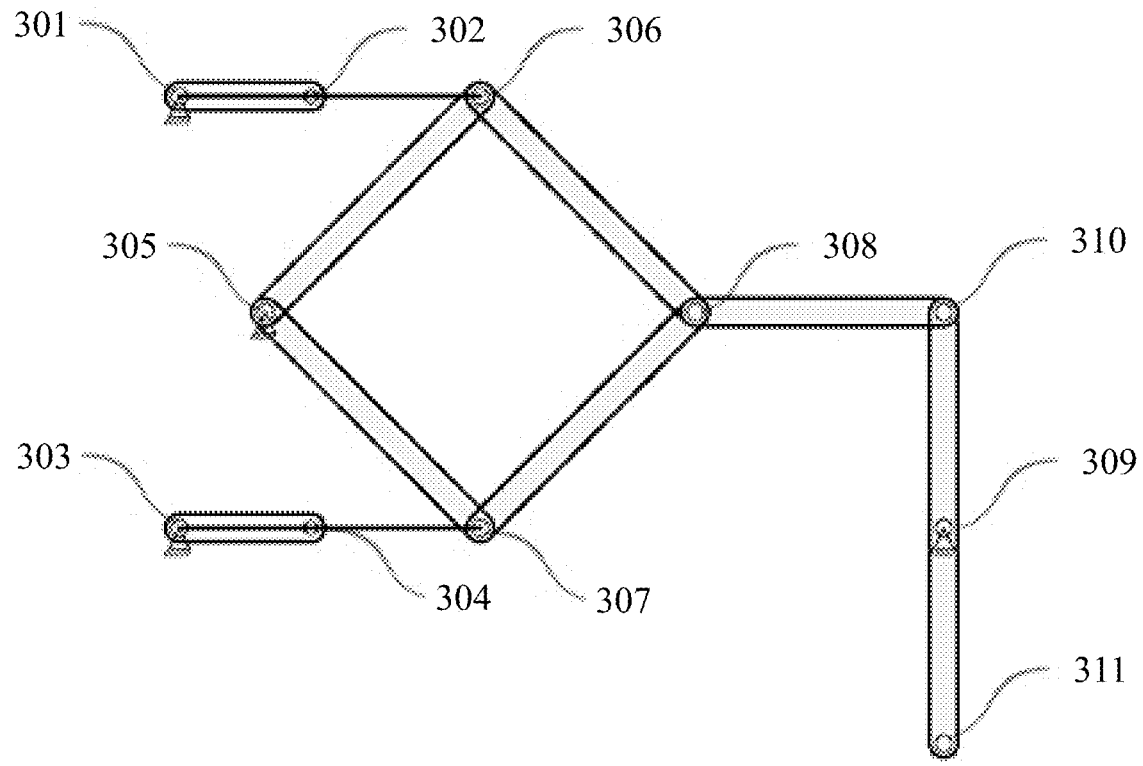
FIG. 3 depicts a top view of a mechanism which can serve as the basis for a NAND or AND gate.

For example, FIG. 3 shows a mechanism that can serve as both an AND and a NAND gate. Anchor 301 and linear slide 302 serves as the first input to the gate, connecting to rotary joint 306. Anchor 303 and linear slide 304 serves as the second input to the gate, connecting to rotary joint 307. Anchored rotary joints 305 and 309, plus unanchored rotary joints 306, 307, 308, 310 and 311 are connected via the appropriate links. AND output 310 and NAND output 311 provide for the use of the gate as an AND or NAND gate. The functioning of this gate is as follows. If linear slide 302 pushes on rotary joint 306 (an input of "1", whereas no movement of the linear slide would be an input of 0) and linear slide 304 pushes on rotary joint 307, the effect will be to drive AND output 310 forward, producing an output of "1." If either of the inputs (or both) are 0, AND output 310 ends up in the same position it started, producing an output of "0." This reproduces the truth table expected of an AND gate.

Since a NAND gate is an AND gate with inverted output, the same mechanism can be used as a NAND gate by reading NAND output 311 instead of AND output 310, assuming that, since NAND output 311 moves in the opposite direction of AND output 310, no movement at NAND output 311 represents an output of "1" and movement to the left represents a "0". Of course, for use only as an AND gate, NAND output 311 need not be present. And, for use only as a NAND gate, the AND output 310 can be ignored. The two are combined for illustrative purposes; they would not necessarily be so combined in actual use. Since NAND is known to be a universal gate (meaning, all other gates can be created with the appropriate combination of NAND gates), this mechanism alone would suffice to create any combinatorial logic. However, it may be more efficient to construct other types of gates directly, rather than through the combination of NAND gates, and to demonstrate other types of gates, including an alternate embodiments of the NAND gate, additional logic gates are subsequently described.

Figure 4:
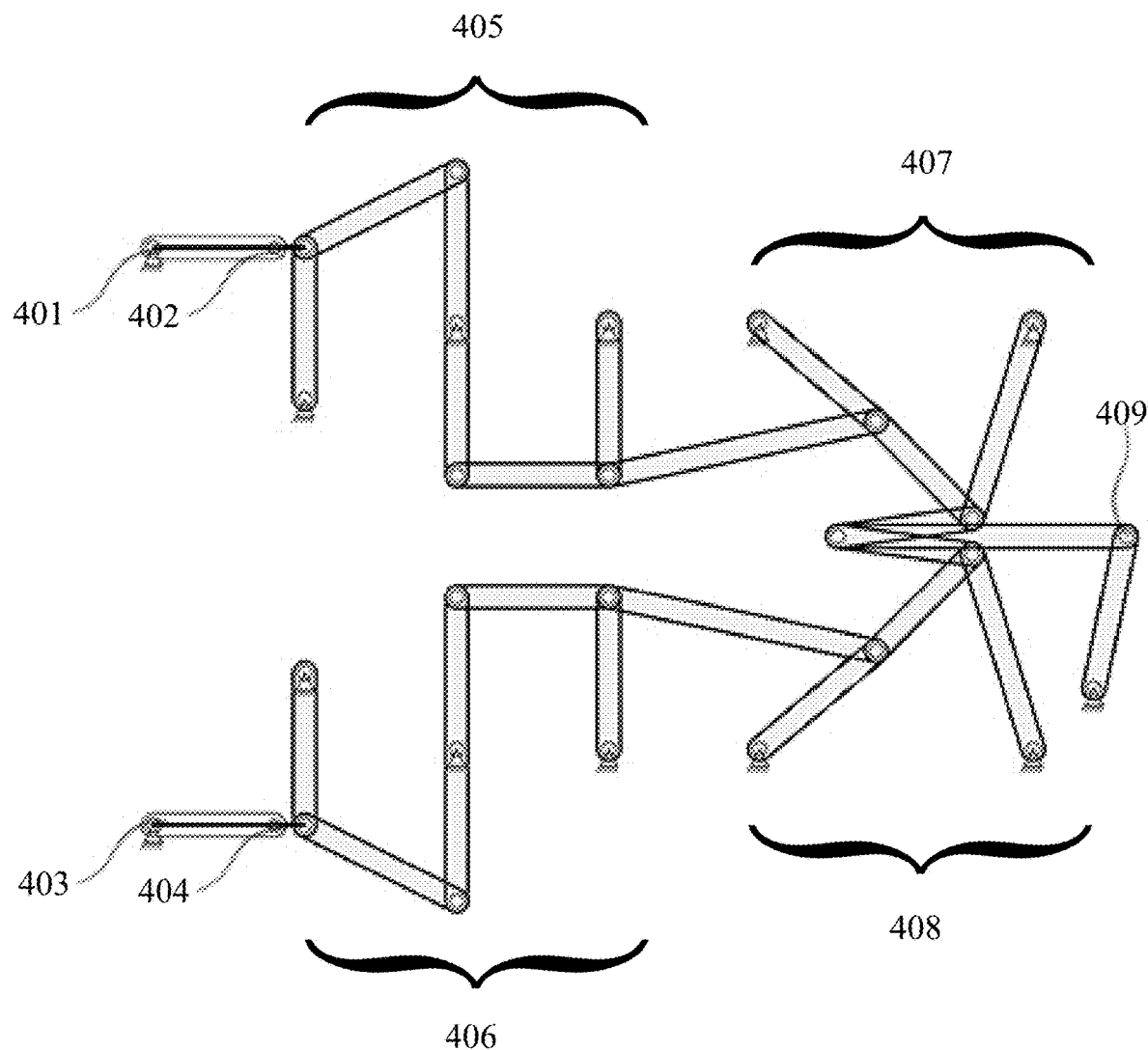
FIG. 4 depicts a top view of a mechanism which can serve as the basis for a NOR, NAND, AND, or OR gate.

FIG. 4 shows a NOR gate made with only links and rotary joints. Input 1 comprises linear slide anchor 401 and is connected via a rotary joint to inverter 405. Input 2 comprises linear slide anchor 403 and linear slide 404 and is connected via a rotary joint to inverter 406. As in all such figures, the linear slides are present as a diagrammatic or programmatic convenience and should be taken to represent some appropriate connection when these individual mechanisms are combined into a higher-level assembly. Inverters 405 and 406 invert a leftward signal to a rightward signal and vice-versa and connect via rotary joints to upper right portion of the mechanism 407, and lower right portion of the mechanism 408, respectively. Due to the inverters, when either of the inputs pushes to the right, the movement gets inverted into a leftward motion in the upper right portion of the mechanism 407 and the lower right portion of the mechanism 408. The position of output 409 replicates the expected truth table, with the illustrated position representing a "1" and the position where the output moves to the left representing a "0". While other implementations are possible, this gate was shows the modular nature of the mechanisms. A NOR gate is equivalent to an AND gate with both inputs inverted. The upper right portion of the mechanism 407 and the lower right portion of the mechanism 408 therefore show an alternate implementation of an AND gate, with an inverter attached to each input to instead create a NOR gate. Removing the inverters and connecting the inputs directly to the appropriate locations in the upper and lower right portion of the mechanism would result in an AND gate. Also, as was shown in FIG. 3, this mechanism could then also serve as a NAND gate by inverting the output of the AND gate. Finally, if the inverters are left in place, but the output inverted, the NOR gate becomes an OR gate.

Figure 5:
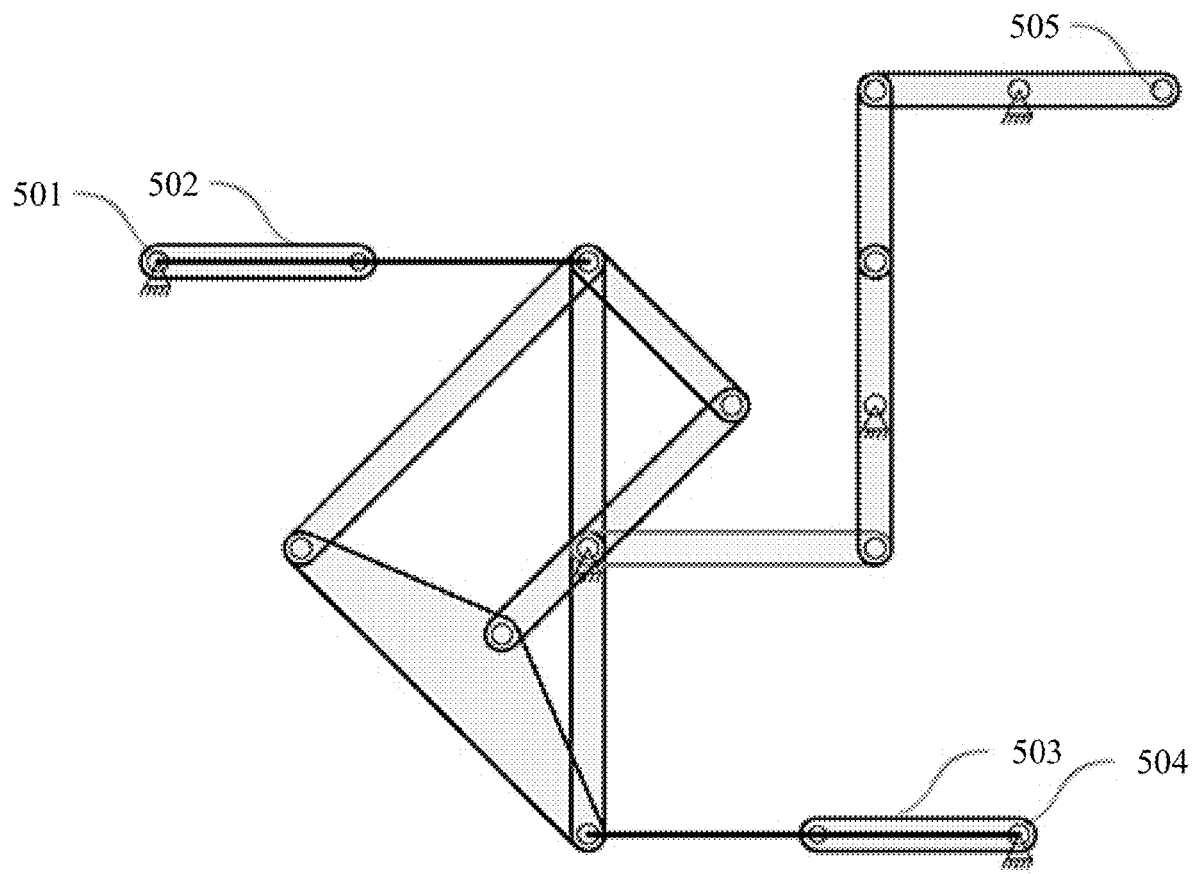
FIG. 5 depicts a top view of a XOR gate.

Finally, FIG. 5 shows an XOR gate implemented using only links and rotary joints. Input 1 comprises anchored rotary joint 501 and linear slide 502, while input 2 comprises anchored rotary joint 504 and linear slide 503. Input 1 and input 2 are coupled to output 505 via a series of links, anchored rotary joints, and unanchored rotary joints. The movement, or lack thereof, at output 505 replicates the expected truth table for XOR.

The foregoing demonstrates that any logic gate can be directly implemented using only links and rotary joints. Note that by carrying the input data forward along with the expected output of a logic gate so that no data is lost in the computation, logic gates which are traditionally considered irreversible can be made reversible. There are also well-known logic gates which are inherently reversible, such as the Toffoli gate and Fredkin gate, which can also be implemented in many ways using MLL.

Reversible Logic Gates

Figure 6:
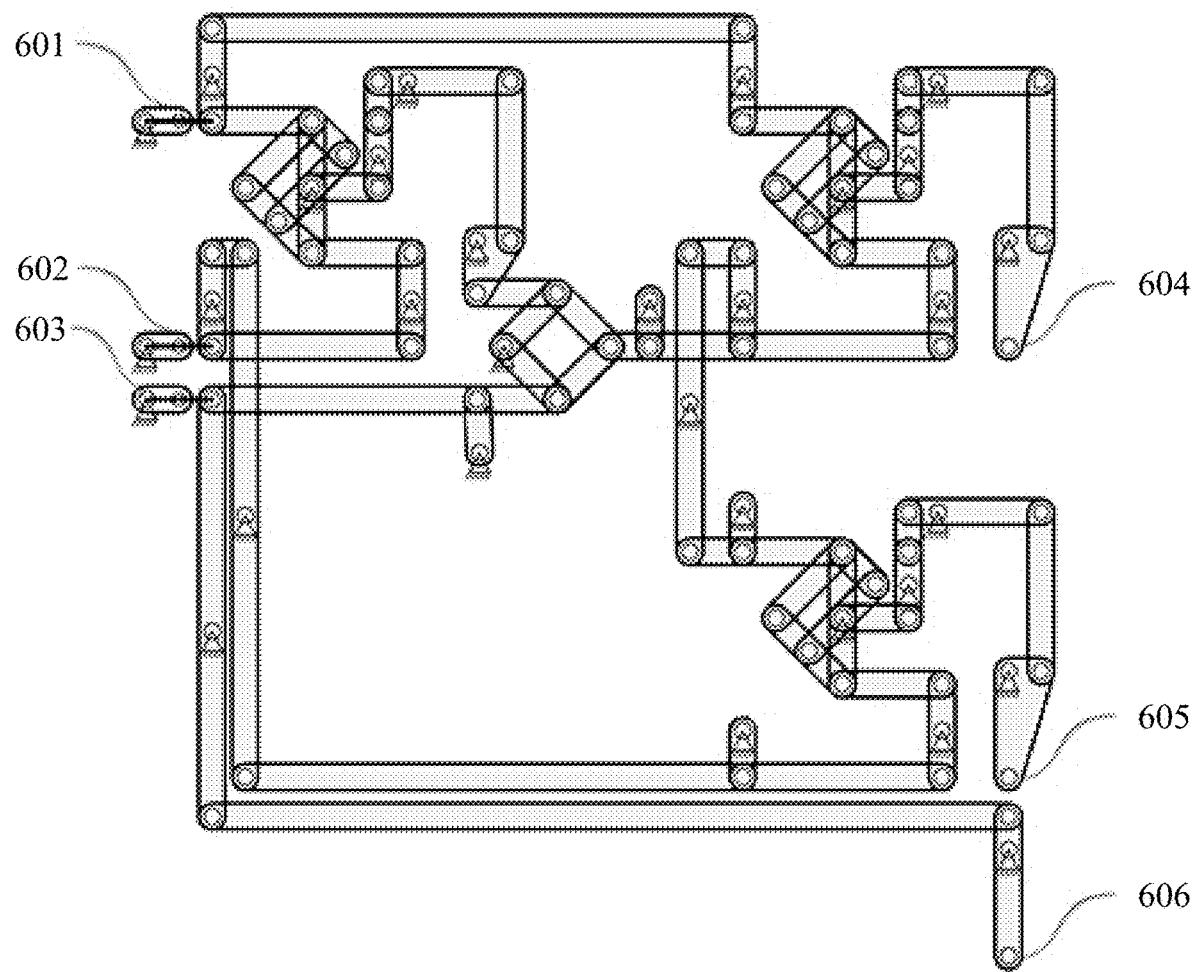
FIG. 6 depicts a top view of a Fredkin gate.

FIG. 6 shows a Fredkin gate (also called a CSWAP gate), a well-known universal reversible gate. The three inputs to the gate 601, 602 and 603 are connected, via a series of links, anchored rotary joints, and unanchored rotary joints, to outputs 604, 605 and 606. It may be of interest to note that this particular implementation of a Fredkin gate is composed of three XOR gates, and an AND gate, plus some forked data lines used to replicate data so that it can be used at more than one place within the gate. This demonstrates not only more sophisticated routing of data than the previous gates, but that reversible logic can be constructed from irreversible logic. A Fredkin gate does not erase any data and so need not be subject to the Landauer Limit.

Given the foregoing logic gate examples, it will be obvious that any type of logic gate necessary for implementing a complete general-purpose computing system, reversible or irreversible, can be implemented within the design paradigms of MLL, using only links and rotary joints. Note that each of the foregoing logic gate examples are co-planar mechanisms. This means that they operate in one or more parallel planes, with movement occurring parallel to the plane of the image. One of the advantages to co-planar designs is that they are easy to represent on paper, to provide the reader with an intuitive understanding of how such mechanisms work. This is not the only way to implement logic gates, or any MLL mechanism, and mechanisms that move in more than one plane are also discussed herein. Also note that in the co-planar mechanisms, hidden or dotted lines are generally not used to show which links are behind which other links. This is because it largely does not matter. In most cases, a given link could be on top of, or below, some other link, and the function of the mechanism would not be affected, subject to considerations such as not having links bump into each other during movement. One may also wish to consider issues such as arranging the links in a manner which minimizes the distance to a heat sink, or maximizes mechanism strength or stiffness, but these exemplary designs are meant to be didactic, not to provide an optimal implementation. Optimized implementations could differ with the requirements of a particular computational system, including the types of computations to be performed, the desired computational speed, the desired size or mass of the system, the materials from which the mechanisms are made, and the operating environment (e.g., operating temperatures).

Locks

Various ways in which multiple data links or lines can interact have already been described. For example, they can share data by tying their physical movements to each other around a common rotary joint. And data links or lines can provide input/output for a logic gate (not to mention being used inside a logic gate). However, additional methods of interaction can be useful in implementing a complete computing system.

Another way multiple links or lines can interact is via a mechanism which causes links to interfere with each other's movements. That is, the position of a first link can allow or prevent one or more other links from moving, and vice versa. For example, consider a two-input mechanism, where each input can be 0 or 1. The design can be such that when both inputs are 0, either input could become 1, but when either input is 1, the other is locked into place and must therefore remain 0. In this example, more than one input cannot become 1 at the same time, although other designs are possible. This mechanism is referred to as a lock. It is common for a lock to have inputs and outputs, just like a logic gate. E.g., a 2 input lock has 2 inputs, and can have 0, 1 or 2 outputs. Each input line to the lock can either continue as an output line, or it can terminate at the lock.

One of the uses of a lock is to create a conditional anchor point. As has already been explained, a rotary joint can be anchored or not anchored, often depending on whether the rotary joint is affixed to an anchor block. However, affixing a rotary joint to an anchor block is not the only way to render it immobile. Rather, a rotary joint can be connected to one or more links which, due to the configuration of the one or more links (whether this configuration is permanent or transient), does not permit movement of the rotary joint. For example, consider a triangle made of three links. Each link is affixed to the two other links by rotary joints at each end. If two of these rotary joints are also connected to an anchor block, even if the third rotary joint is not connected to an anchor block, it is effectively anchored, as the entire triangle is rigid. None of the triangle's links can move with respect to each other, or the anchor block. In this simple example, assuming there is no way to change the link configuration, the third rotary joint is effectively anchored. There are situations where it is useful to have a rotary joint sometimes anchored and sometimes not anchored. Locks allow this: The side of the lock that is locked cannot move, and so as long as it is locked, it can effectively act as an anchor point. The utility of conditional anchor points will be explained subsequently. Another useful aspect of some embodiments of locks is that, for example, a binary lock with two inputs can have three possible states: (0,0), also called "blank," (0,1), and (1,0). The blank state can be useful in saving state, and allowing reversible computation, as can be seen herein in the description of how an exemplary shift register can be implemented.

Figure 7:
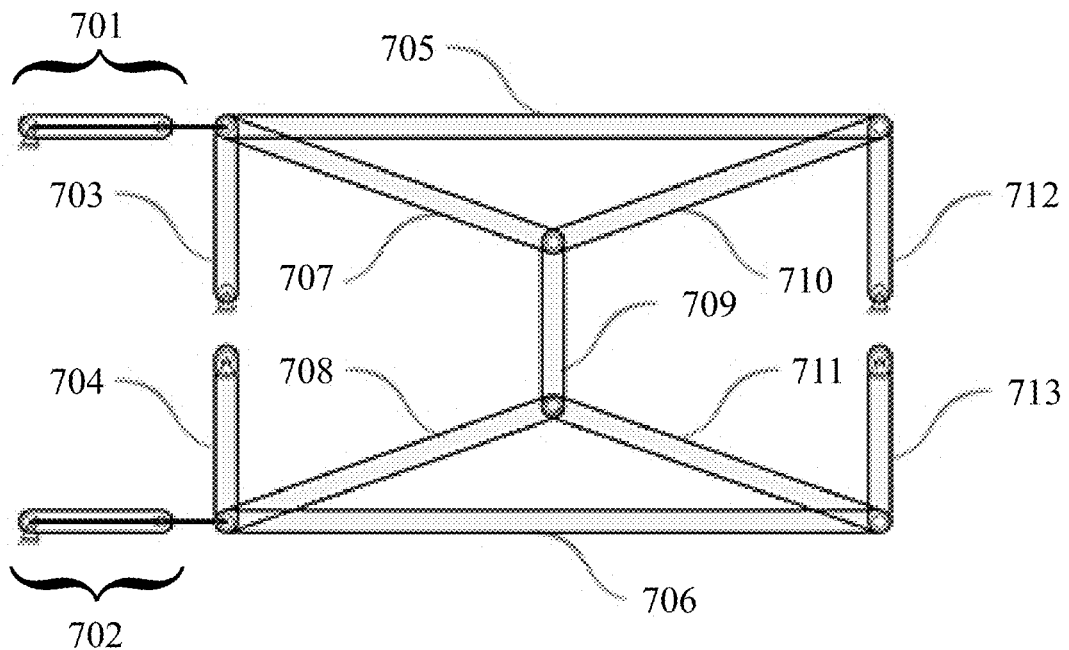
FIG. 7 depicts a top view of a co-planar lock in the (0,0) state.
Figure 8:
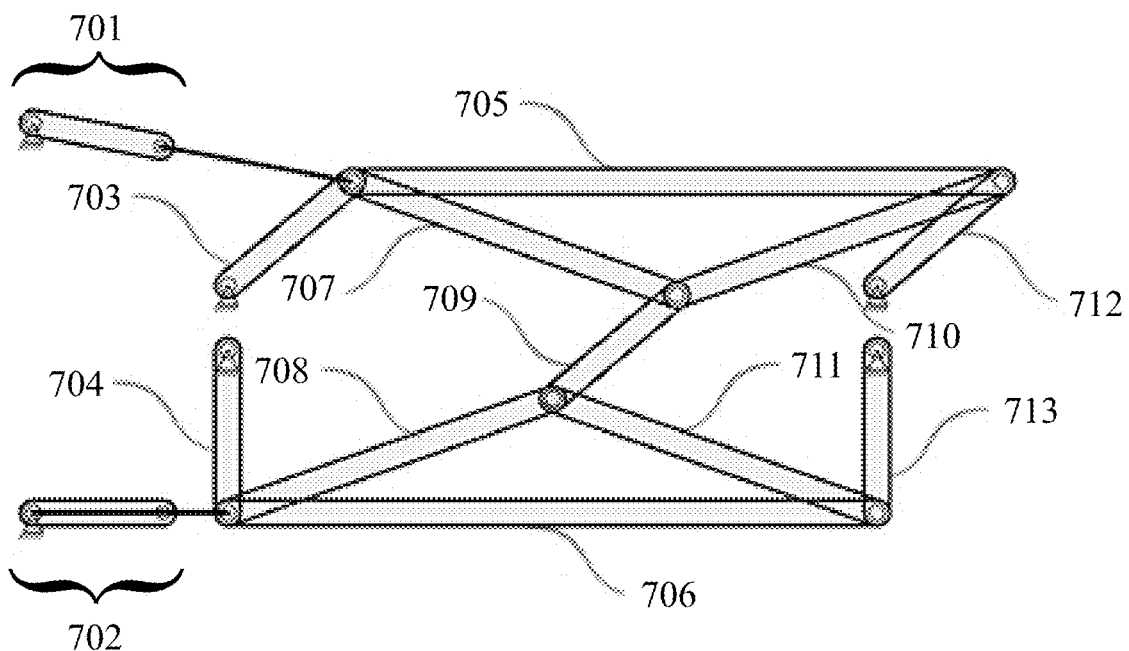
FIG. 8 depicts a top view of a co-planar lock in the (1,0) state.

As with all MLL embodiments, there are multiple ways of implementing locks using only links and rotary joints. FIG. 7 and FIG. 8 depict a two-input co-planar lock in two different states. FIG. 7 shows the position of the lock where both inputs are 0, while FIG. 8 shows the position of the lock when one of the inputs is 1. Top input 701 and bottom input 702 connect via rotary joints to the top and bottom halves of the lock, respectively. Each half of the lock comprises a 4-bar linkage, comprising links 703, 705 and 712 on the upper half, and links 704, 706, and 713 on the lower half. In addition, four diagonal links 707, 708, 710 and 711, hold an additional link 709, which connects to the two 4-bar linkages via unanchored rotary joints. The functioning of the mechanism is as follows: When one of the inputs 701 or 702, moves from 0 to 1, the respective 4-bar linkage is moved. The movement of the 4-bar linkage, via either links 707 and 710 for the top half, or links 708 and 711 for the bottom half, causes the rotation of link 709. Link 709, being the same length as links 703, 704, 712, and 713, as well as initially being at the same angle, allows either of the inputs to assume a value of 1 by pivoting through the same arc that the 4-bar linkage must follow when moved by an input.

However, once an input has moved either the top or bottom 4-bar linkage, along with link 709, the other 4-bar linkage (and so its associated input/output) is no longer free to move. The reason is that link 709 is now not parallel with, depending on which input was set to 1, links 703 and 712, or links 704 and 713. Because of this, the rotation of link 709 will not follow that of the second 4-bar linkage, should it try to move. In essence, one of the links (link 705 for the top, if not already moved, or link 706 for the bottom, if not already moved) will be trying to move through two different arcs at once, resulting in the mechanism locking. This is essentially a co-planar version of rotary joints being not-coaxial (described elsewhere herein), but instead of the rotary joint axes changing (which does happen, but these axes were never co-axial in the literal sense to begin with), the point here is that the arc through which the connected links would move changes. Once one of the inputs is set to 1, the only allowed movement is to set that input back to 0 so that either (but not both simultaneously) sides are again free to move to the "1" position.

The lock design of FIG. 7 has the property that it locks quickly and unlocks slowly. For example, virtually any movement of one of the inputs locks the other input. And, once an input has been set to 1, locking the mechanism, that input must be brought essentially all way back to 0 before the lock unlocks. It may be desirable to design locks which have more gradual locking properties, and this may have advantages including smoother changes in entropy (resulting in reduced energy dissipation), reduced maximal force on the mechanisms at a given switching speed, and a reduced time between lock/unlock cycles, since there is less concern that one input must be allowed to settle to almost exactly 0 before the other input can start to move. The inclusion of springs in connections to a lock can also aid in the operation of a lock, as the mechanism can then be driven as desired even when small positional errors are present which would otherwise lock a mechanism which almost instantly locks when not exactly in the unlocked position (i.e., at "0"). Another method of accomplishing this is to replace link 709 with a spring of the same length (or add a spring and shorten the link) which has a suitably chosen spring constant. If link 709 is, or incorporates, a very stiff spring, the lock will allow only small positional errors. If link 709 is, or incorporates, a softer spring, the lock will allow larger positional errors.

Figure 9:
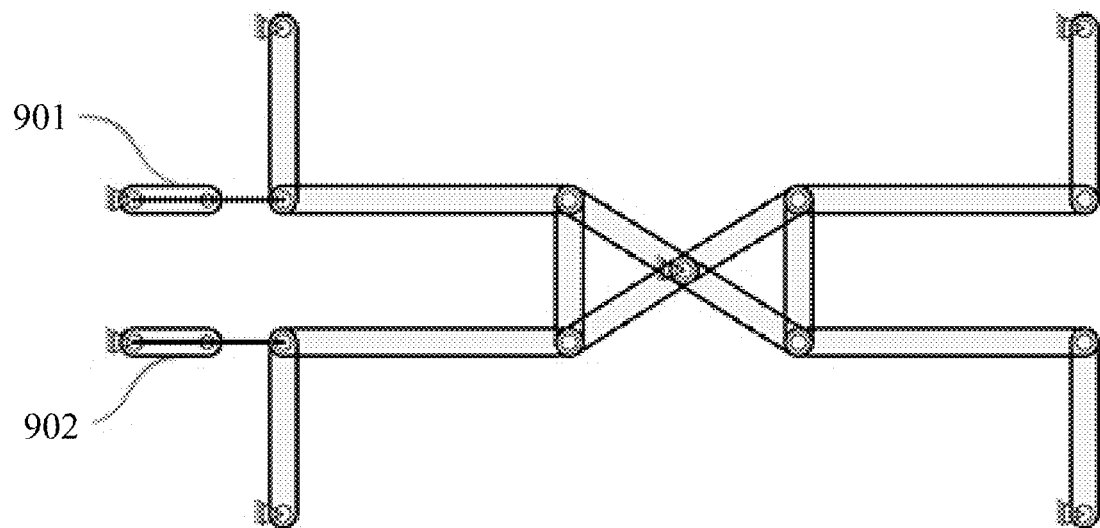
FIG. 9 depicts a top view of an alternate embodiment of a co-planar lock in the (0,0) state.
Figure 10:
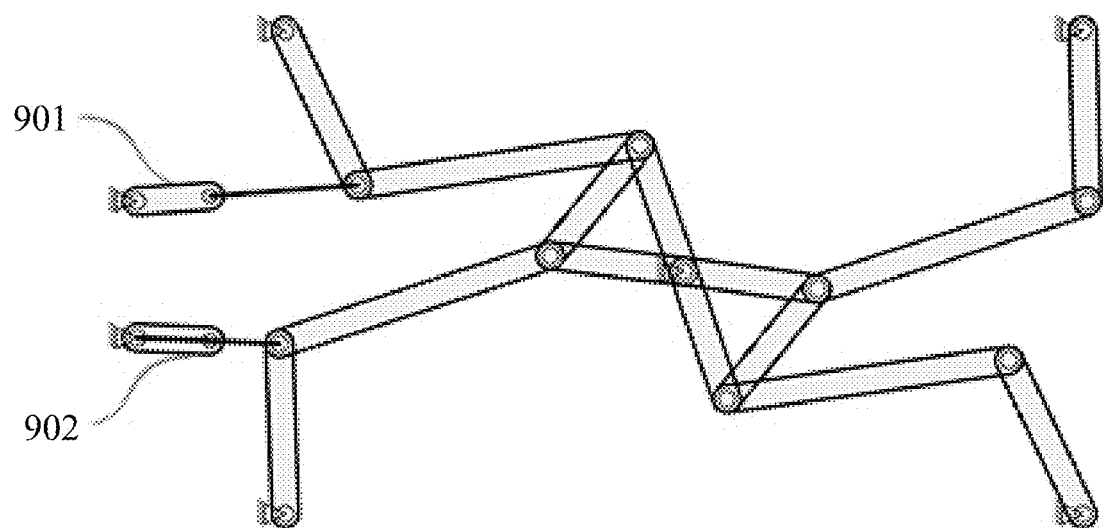
FIG. 10 depicts a top view of an alternate embodiment of a co-planar lock in the (1,0) state

FIG. 9 and FIG. 10 depict a lock where, due to gradually changing torque as the mechanism moves from unlocked to locked, the locking action is more gradual. FIG. 9 shows the lock when inputs 901 and 902, are 0, while FIG. 10 shows the state of the lock after input 901 has been set to 1 while input 902 is still 0. Inputs 901 and 902 are connected to the rest of the mechanism via unanchored rotary joints. Note that the setting of one input to 1 results in driving the other input backwards slightly in this design. The overall system can be designed to allow this, or the backwards motion could be kept internal to the mechanism, such as by using springs that absorb such motion rather than transmitting it directly to other links.

Being made of the same basic parts, all MLL mechanisms tend to share similar concerns. The concepts of sudden versus gradual changes in entropy, limiting maximum forces, and designing mechanisms to allow reduced latency between clock phases, can apply to any MLL mechanism, not just locks.

Non-Co-Planar Mechanisms

Figure 11:
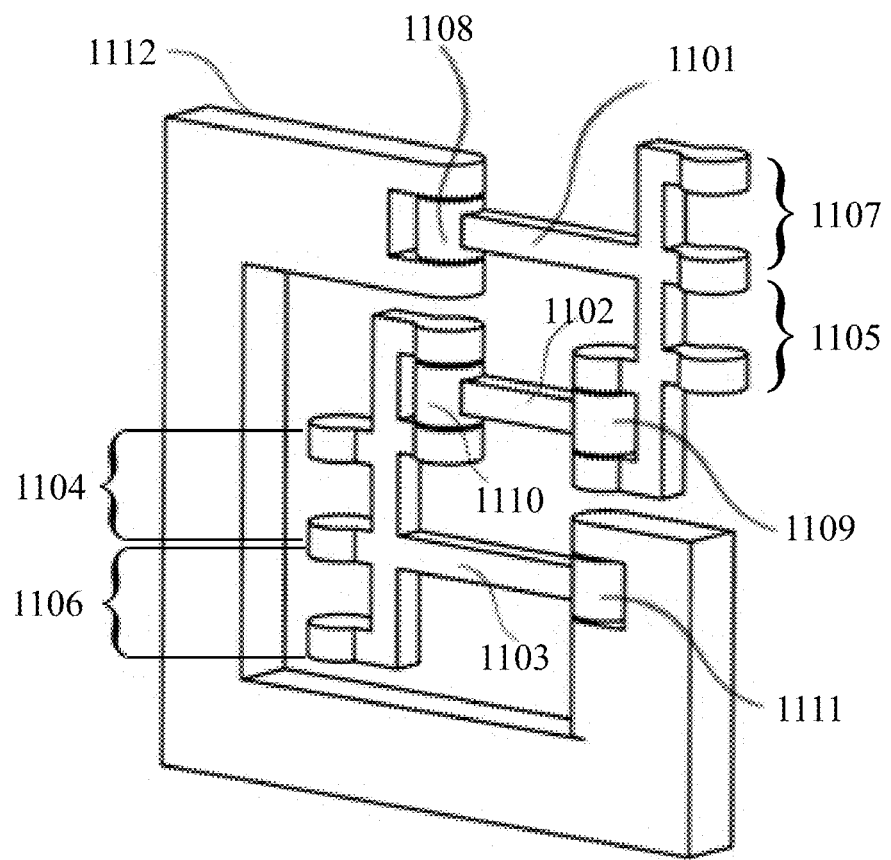
FIG. 11 depicts a ¾ view of a non-co-planar lock in the (0,0) state.

Many of the mechanisms herein are of co-planar design. While co-planar designs are emphasized for clarity of presentation, MLL mechanisms need not be co-planar. Any MLL mechanisms can be implemented in a manner which is non-co-planar. For example, FIG. 11 depicts a lock, constructed of links and rotary joints, which is not co-planar. Rather, as will be subsequently explained, the rotary joints allow the links to move perpendicular, rather than parallel, to the face of the Anchor Block.

In FIG. 1 1 and subsequent views of the same mechanism, link 1101 will be referred to as Link1, link 1102 as Link2, link 1103 as Link3, space 1104 as OpenJoint4, space 1105 as OpenJoint5, space 1106 as OpenJoint6, space 1107 as OpenJoint7, rotary joint 1108 as Joint1, rotary joint 1109 as Joint2, rotary joint 1110 as Joint3, rotary joint 1111 as Joint4, and anchor block 1112 as the Anchor Block. The Anchor Block provides anchor points for the rotary joints Joint1 and Joint4, which are connected to Link1 and Link2, respectively. Link1 is connected to Link2 by Joint2, and Link3 is connected to Link2 via Joint3. All Joints and Link1, Link2, and Link3 are shown in the unlocked position.

In the unlocked position, which may be referred to as "(0,0)", the axis of Joint3 is aligned with the axis of Joint1, and the axis of Joint2 is aligned with the axis of Joint4. Joint1 and Joint 3 may thus be referred to as coaxial, as can Joint2 and Joint4. If either Link1 or Link3 were to pivot, one of their rotary joints would move out of their current plane, and thus, depending on which link was pivoted, some of the joints would no longer be coaxial with each other (a condition referred to as "not-coaxial"). The concepts of coaxial and not-coaxial are important as, in this embodiment, these conditions are what define locked versus unlocked. The reason for this is that in the unlocked position, Link1 and Link3 each have an axis about which they might pivot. For Link1, this is the axis defined by Joint1 and Joint 3 when they are coaxial. For Link3, this is the axis defined by Joint2 and Joint4 when they are coaxial. When these sets of joints are not in the coaxial position, the lack of alignment between the two axes prevents pivoting, as a rigid object with one degree of freedom cannot simultaneously pivot around two different axes. As a result, when either Joint1 and Joint3 are not-coaxial, or Joint2 and Joint4 are not-coaxial, the lock is locked and the only allowed motion is to return to the unlocked position.

Note that technically, virtually any amount of pivoting of Link1 or Link3 would create a locked condition. However, for the purposes of explanation, subsequent figures show about 30 degrees of rotation. This is arbitrary, and any amount of pivoting which will allow the system to act reliably could be used (as could any other angle, as opposed to perfectly perpendicular to the face of the Anchor Block). Analogously with the co-planar lock, if Link 2 were replaced with a spring of similar length, the tolerance of the lock for positional errors in its inputs could be increased, to the extent thought desirable. It will be obvious given this explanation that if either Link1 or Link3 were to pivot a suitable amount, whichever link had not pivoted would then be prevented from doing so until the pivoted link was returned to the unlocked position.

To accomplish this pivoting, OpenJoint4 and OpenJoint6 are connection points where other links could connect to Link3, and OpenJoint5 and OpenJoint7 are connection points where other links could connect to Link1. These other links can serve as inputs to the lock. Link1 and Link3 each have a pair of connections (OpenJoint5 and OpenJoint7, and OpenJoint4 and OpenJoint6, respectively) not to allow four inputs (although that is possible, that is not the intent of this particular design), but rather to allow an input line to continue on past the lock if desired. For example, OpenJoint5 may be thought of as a continuation of OpenJoint7 (or vice versa) and OpenJoint4 may be thought of as a continuation of OpenJoint6 (or vice versa).

Figure 12:
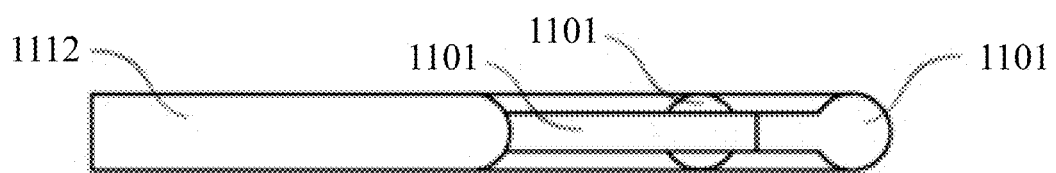
FIG. 12 depicts a top view of a non-co-planar lock in the (0,0) state.

FIG. 12 shows a top-view of the same mechanism as FIG. 11, with only link 1101 and anchor block 1112 being visible in this view.

Figure 13:
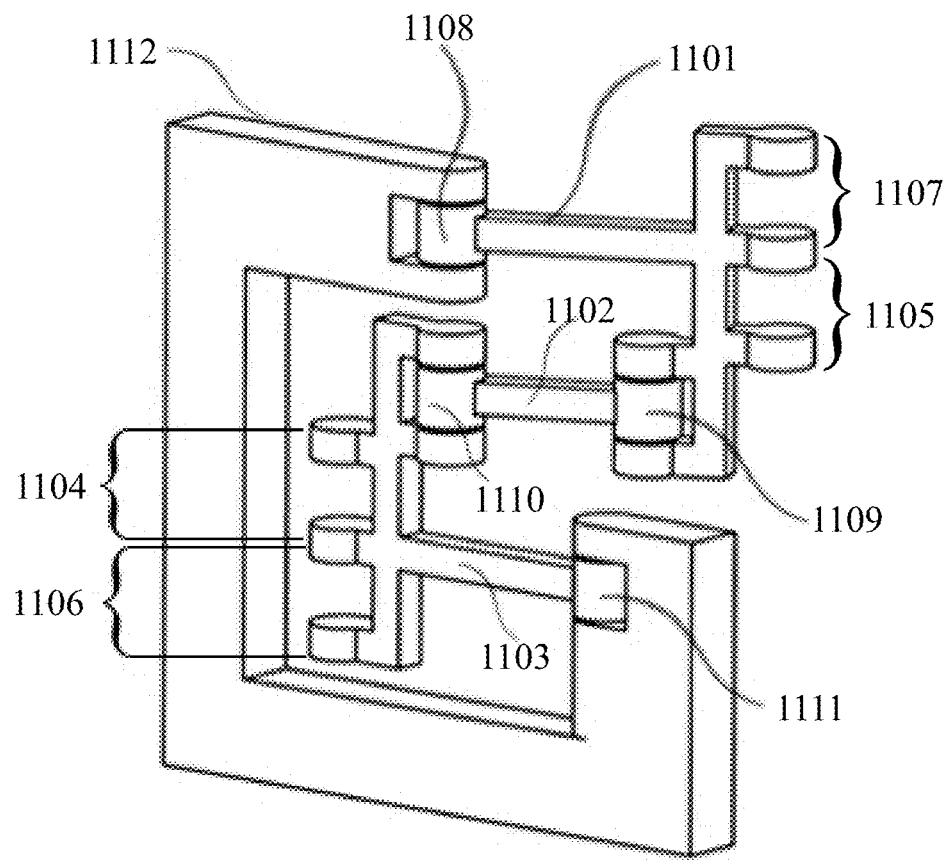
FIG. 13 depicts a ¾ view of a non-co-planar lock in the (1,0) state.

FIG. 13 shows the same mechanism as FIG. 11, but in a locked position that could be called "(1,0)". In this state, 1101 has rotated, via rotary joints 1108 and 1110, making rotary joints 1109 and 1111 not-coaxial. Because 1109 and 1111 are not-coaxial, 1103 is no longer free to rotate, hence the locked state. The rotation of 1101 would be accomplished by other links (not depicted) connected to 1105 and/or 1107.

Figure 14:
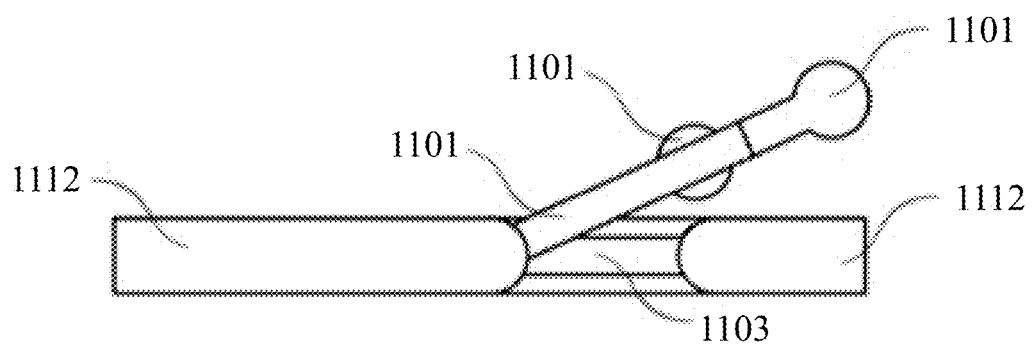
FIG. 14 depicts a top view of a non-co-planar lock in the (1,0) state.

FIG. 14 shows a top view of the state of the mechanism in FIG. 13. In this top view, it can be seen that 1101 has pivoted about 30 degrees counterclockwise. 1102 cannot be seen in this view, but would pivot with 1101 in this instance, revealing 1103 below it. Note that the direction of rotation is arbitrary. Both clockwise and counterclockwise rotations would have the same effect of locking the lock. This is true of 1103 as well.

Figure 15:
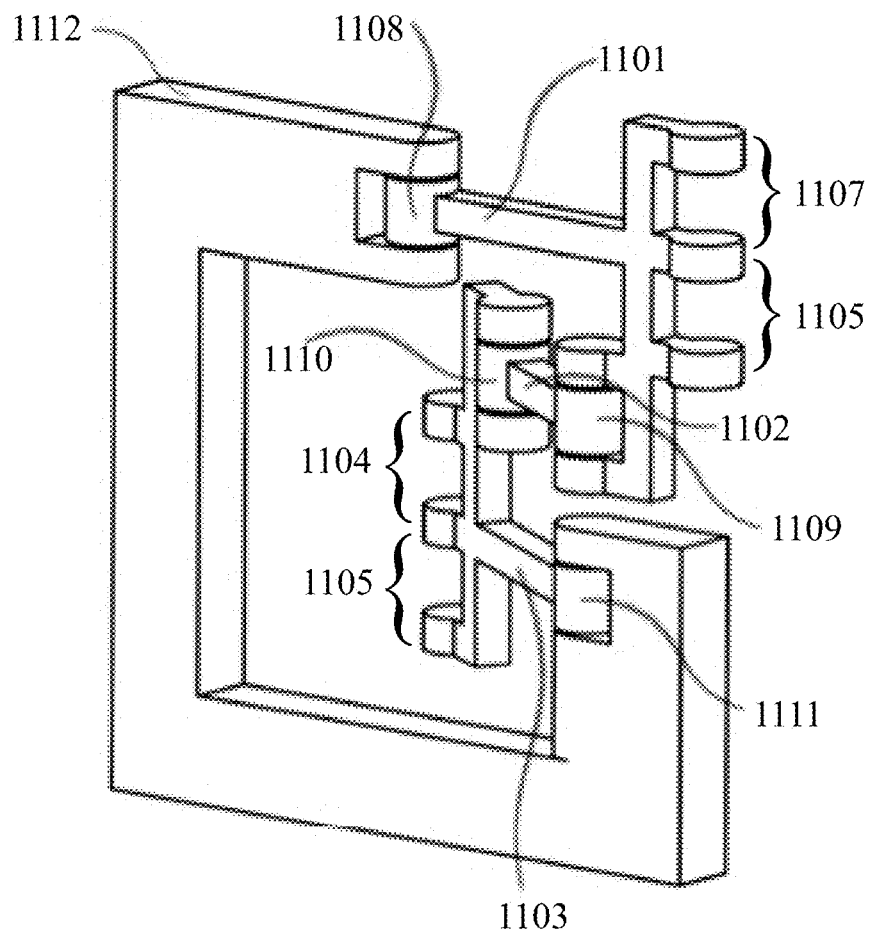
FIG. 15 depicts a ¾ view of a non-co-planar lock in the (0,1) state.

FIG. 15 shows the same mechanism as FIG. 13, but in a locked position due to the rotation of 1103 instead of 1102. This position could be called "(0,1)." In this state, 1103 has rotated, via rotary joints 1109 and 1111, making rotary joints 1108 and 1110 not-coaxial, thereby locking 1101. The rotation of 1103 would be caused by other links (not shown) connected to one or more of the Open Joints, 1104 and 1106, of 1103.

Figure 16:
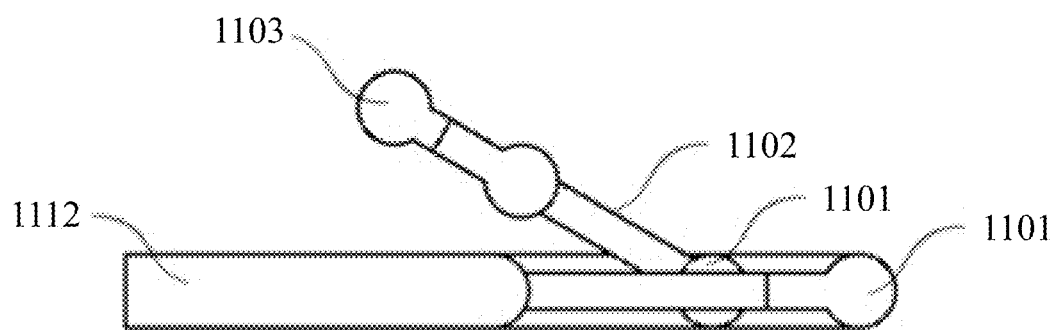
FIG. 16 depicts a top view of a non-co-planar lock in the (0,1) state.

FIG. 16 shows a top view of the state of the mechanism in FIG. 15. In this top view it can be seen that 1103 has rotated about 30 degrees clockwise, while 1101 is still in its original position. As with 1101, the direction of rotation is arbitrary. Either clockwise or counterclockwise would allow proper function of the lock, and either or both could be used.

Given these examples and the principles of MLL, many other designs (for locks and all other MLL mechanisms) will be obvious. The specific implementations which work most efficiently may be case-dependent, and the exemplary embodiments herein are not provided as examples of optimized mechanisms, but rather to demonstrate how all elements necessary for a generalizable computational system can be created using only links and rotary joints, and that even within the constraints of only using links and rotary joints, many different logical and mechanical options are available, including virtually any type of logic gates, reversible and irreversible, and mechanisms that largely function in two dimensions ("co-planar"), or three dimensions (non-co-planar), complete with robust routing of data, at whatever angles are desired.

Balances

Force and motion can be transmitted from one end of a link to the other end using a rotary joint about which the link pivots. Such a mechanism will be called a "balance," since frequently the input is in the center of a link, and one side moves "up" or "down," conceptually similar to a classic pan balance. Of course, the exact movement will depend on the forces applied, the exact mechanism design, and the state of the system.

Figure 17:
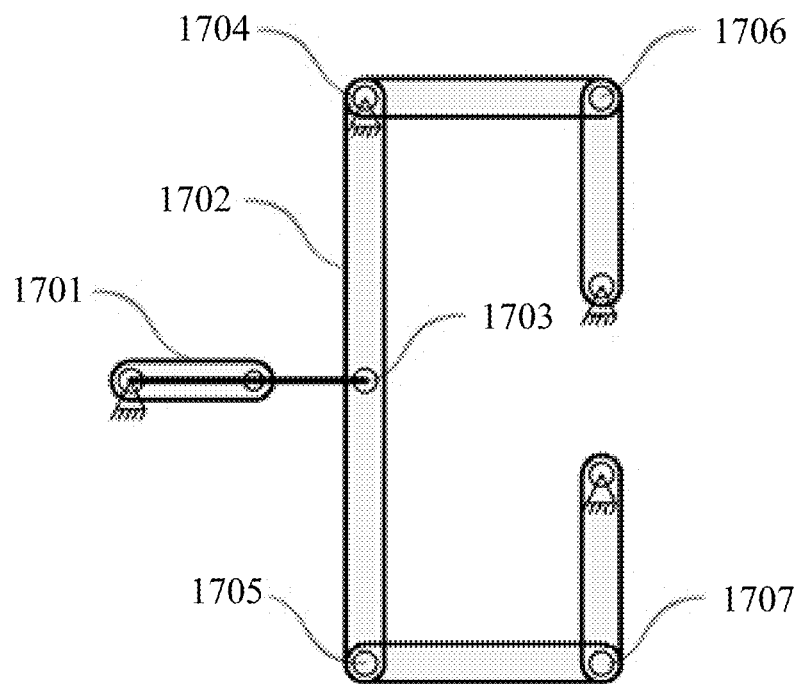
FIG. 17 depicts a top view of a balance with an input of 0.
Figure 18:
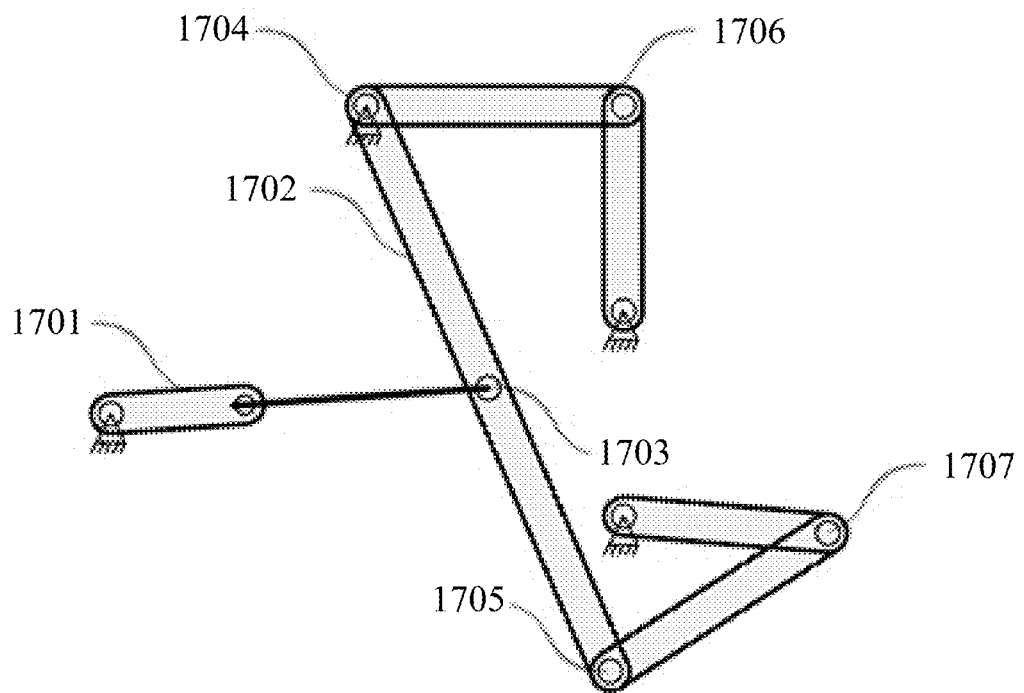
FIG. 18 depicts a top view of a balance with an input of 1 with an anchor at the top.

A simple balance is depicted in two different states in FIG. 17 (showing an input of 0, the linear slide of input 1701 being retracted) and FIG. 18 (showing the same mechanism with an input of 1, the linear slide of input 1701 being extended). In these figures, input 1701 is connected to the link 1702 by rotary joint 1703. Upper rotary joint 1704 and lower rotary joint 1705 connect via links to upper output 1706 and lower output 1707, respectively. Upper rotary joint 1704 is anchored in these depictions, preventing upper output 1706 from moving, while lower rotary joint 1705 is unanchored, allowing lower output 1707 to move if input 1701 moves.

Figure 19:
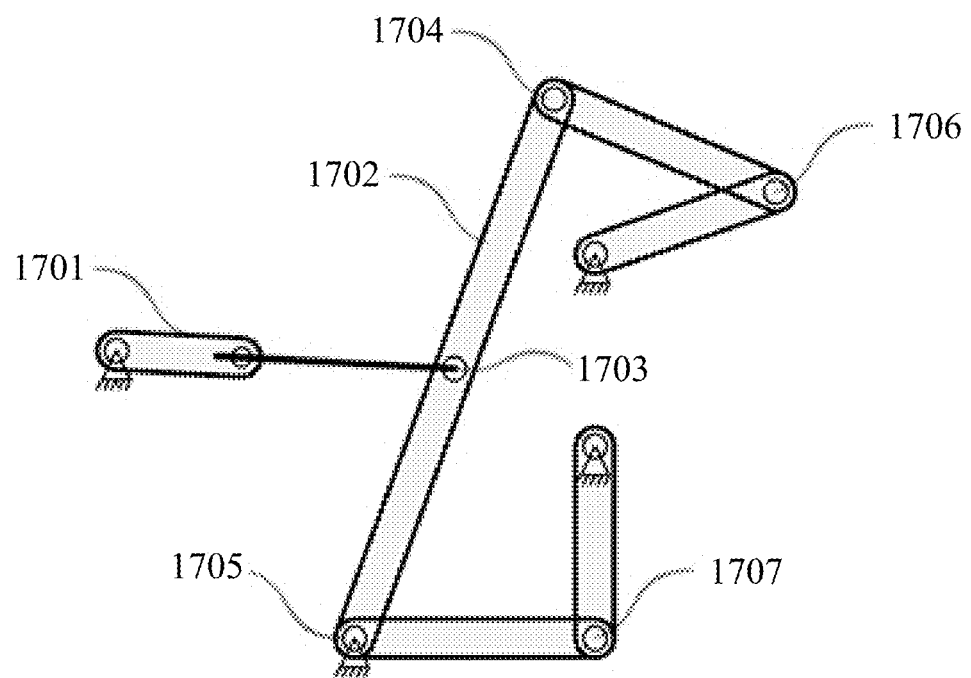
FIG. 19 depicts a top view of a balance with an input of 1 with an anchor at the bottom.

FIG. 19 depicts what would happen if upper rotary joint 1704 and lower rotary joint 1705 were reversed (meaning, if upper rotary joint 1704 were unanchored and lower rotary joint 1705 were anchored), given an input of 1. The output movement would occur at upper output 1706 instead of lower output 1707. One of the interesting properties of balances is that they can be designed to conserve the sum of their inputs. In the foregoing example, if the input is 0, the output is 0. If the input is 1, the output is 1. This would be true of a simple line as well, but complex balances with multiple inputs can be constructed that still sum their outputs.

Another advantage to balances is that they can route data differently depending on other input. Other input, for example, may control the state of locks connected to a balance. The locks act as conditional anchors, routing data down one line or another depending on the state of the locks and allowing a balance to function as a switch, or "switch gate." For example, a single balance with conditional anchors could be put into any of the configurations shown in FIG. 17, FIG. 18, and FIG. 19, since the anchor points can be changed (this concept is demonstrated in subsequent figures).

Figure 20:
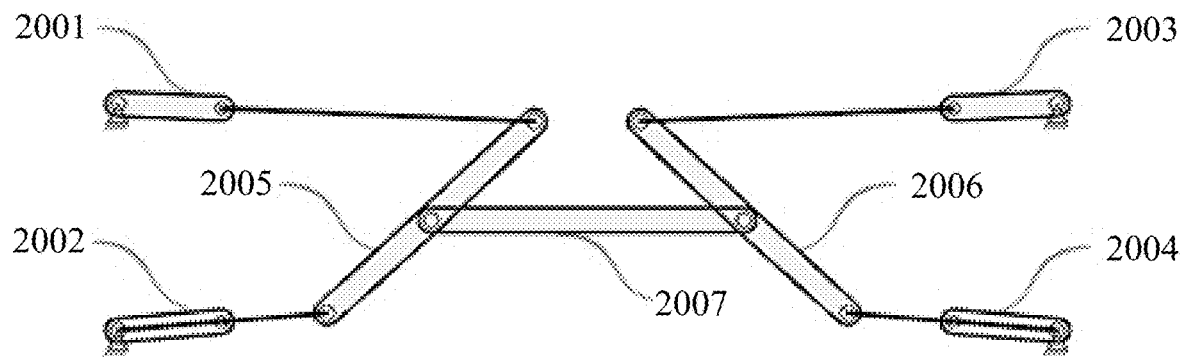
FIG. 20 depicts a top view of a binary double balance with inputs (1,0).
Figure 21:
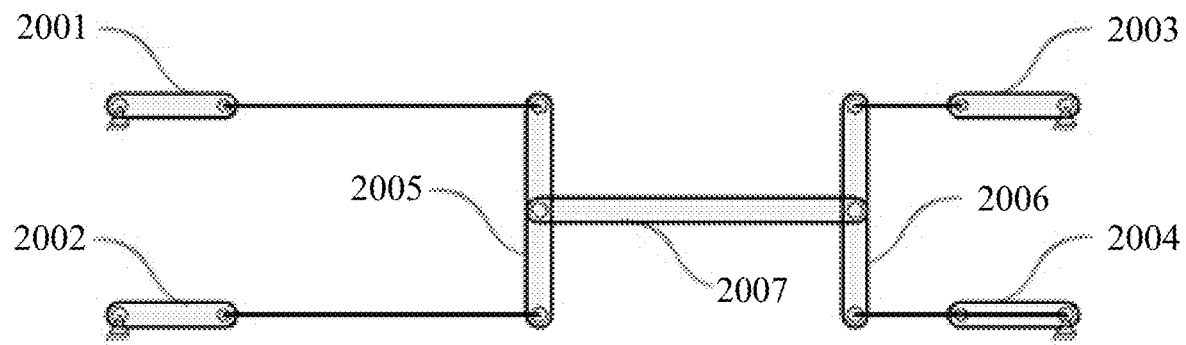
FIG. 21 depicts a top view of a binary double balance with inputs (1,1).

FIG. 20 and FIG. 21 illustrate one way in which balances with multiple inputs can be used to conserve the sum of the inputs, and to route data. Two states of the same mechanism are depicted, which is formed by connecting two 2-input balances together (a "binary double balance"). Inputs 2001 and 2002 are connected to link 2005 by rotary joints. Link 2005 is connected to link 2007 via a rotary joint. Link 2007 connects to link 2006 via a rotary joint. Link 2006 connects to outputs 2003 and 2004 via their respective rotary joints. The fixed length of link 2007 causes the sum of the inputs to be conserved. Since link 2007 cannot change in length, if either input 2001 or 2002 moves, a corresponding move must take place at output 2003 or 2004. FIG. 20 shows the state of the mechanism when input 2001 is 1, and input 2002 is 0. FIG. 21 shows the state of the mechanism when input 2001 and 2002 are both 1. Note that the mechanism in these figures (as is frequently the case due to the complexity of more complete systems and the need for clear illustrations of the basic underlying mechanisms of MLL) is not attached to other mechanisms as it would be in an actual MLL system. In this particular case, without additional constraints this mechanism will not be reliable. For example, when moving from an input of (0,0) to (1,0), the sum of the outputs must be 1, since the sum of the inputs is 1. However, there is no way to tell if the outputs will be (0,1) or (1,0), or even something like (0.5,0.5). In an actual system, one way of solving this problem is with locks. By conditionally locking one of the outputs, the other output is forced to move in a predictable manner.

Switch Gates

Figure 22:
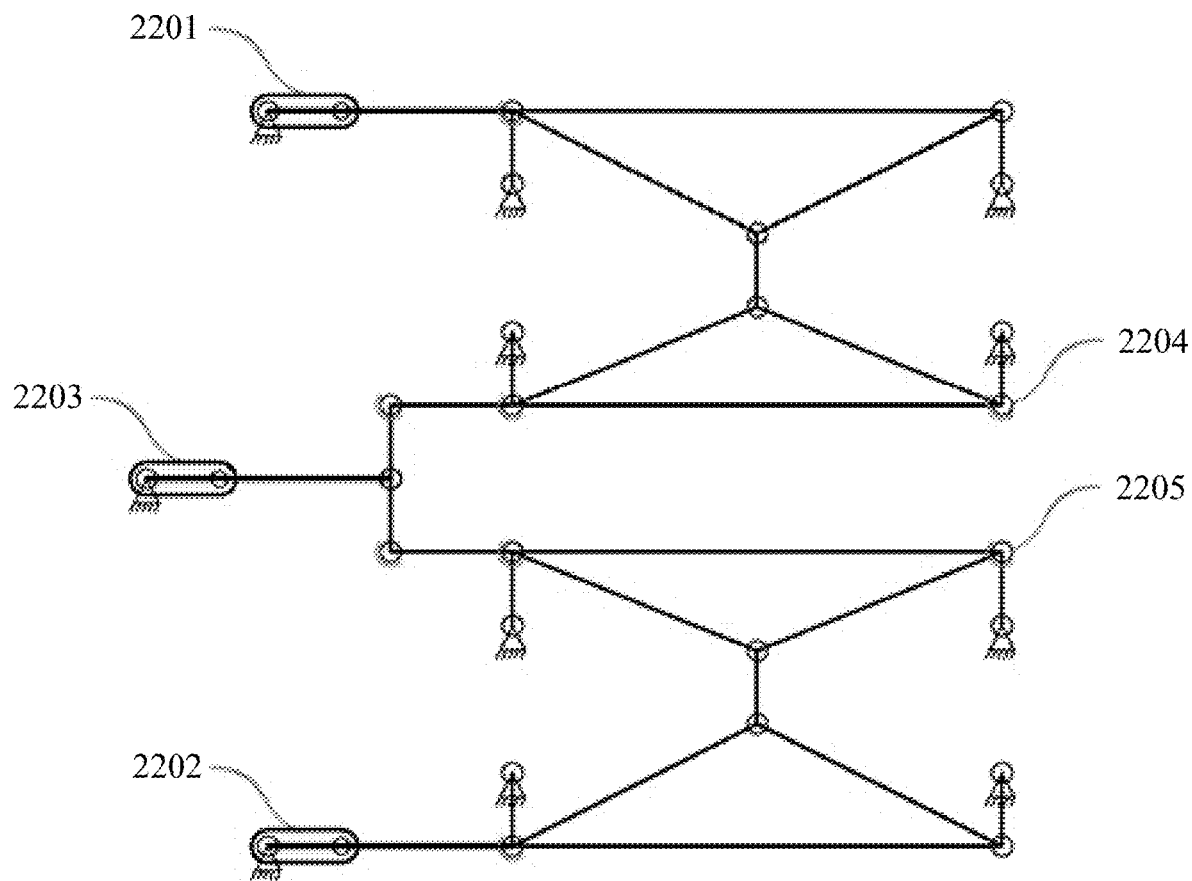
FIG. 22 depicts a top view of a switch gate.

As previously described, balances, in conjunction with locks, are one way in which a switch gate can be implemented. FIG. 22 shows a switch gate with a top input 2201, a bottom input 2202, and a center input 2203. The middle input is connected, via a balance, to top output 2204 and bottom output 2205. The top and bottom inputs control whether the middle input is routed to the top output or the bottom output. For example, if top input 2201 is set to 1, then the upper lock to which top input 2201 is connected, is locked. Since that means that the line going to top output 2204 cannot move, when an input of 1 is provided at middle input 2203, the balance to which middle input 2203 is connected must move the line which leads to bottom output 2205. The top and bottom input would generally never both be 1 at the same time, so these could actually be condensed into one input which controls both locks, e.g., and input of 0 locking the upper lock, and an input of 1 locking the lower lock, or vice-versa.

Binary double balances coupled with locks can also be used as switch gates. Given a binary double-balance, one input is locked permanently, while one input is unlocked permanently and connected to an input (typically a clock). A single line can then be used to switch two complementary locks that are connected to the two remaining inputs of the double-balance. In essence, the clock input is routed through the double balance to one or the other "input" by the single line which controls the two complementary locks. Note that switch gates (and other MLL mechanisms that have locked states) can be used even when dry switching is desired. In the case of a switch gate like that in FIG. 22, the clock force is applied via a balance connecting two locks. Since the system can be designed so that both locks are never locked simultaneously when the clock force is applied, one side is always free to move. Therefore, the clock force is not directed to an immobile mechanism, but rather to a mechanism that is always conditionally mobile in one direction or the other.

Logic Gates using Locks and Balances

An interesting property of locks and balances is that they can be used to create all the traditional logic gates (in addition to other mechanisms), reversible and irreversible. Before describing one way in which this can be done, it will facilitate understanding the exemplary lock-based logic gate to discuss an alternate method of providing input to a mechanism (in this case, a lock). It is typical to think of one binary input as being a single connection to a line. For example, in the previously-described logic gates such as AND, NAND, NOR, and XOR, these logic gates each took two inputs, often represented as two linear actuators, but what in an actual MLL system would be, e.g., two connections to data lines. The Fredkin gate takes three inputs, and so had three locations where data lines could be connected. Each of the inputs to these exemplary logic gates was binary, meaning, the mechanism was designed such that one position represented 0, while a second position represented 1. Although other implementations are possible, frequently an input of 0 has been represented as no movement occurring at that input, while an input of 1 was represented by some forward or rightward movement.

However, there are other ways to represent input. For example, instead of a binary input using one connection which provides one of two possible values (0 or 1), a binary input could consist of two connections, one representing 0, and the other representing 1. In this scenario, one of the connections to an input would always move: The 0 line would move if the input was 0, and the 1 line would move if the input was 1. This is in contrast to 0 being previously represented by no movement of an input. This strategy of using two lines per binary input is useful with locks because it allows either value, 0 or 1, to create a locked state. An input of 0 locks one side of the lock, while an input of 1 locks the other. One use to having both 0 and 1 resulting in a locked state on different sides is that this permits a lock to act as two different conditional anchor points. This can, for example, be used to control which side of a balance moves when input is fed into the balance. The following example shows a mechanism which illustrates how this property of locks can be combined with balances to create logic gates.

Figure 23:
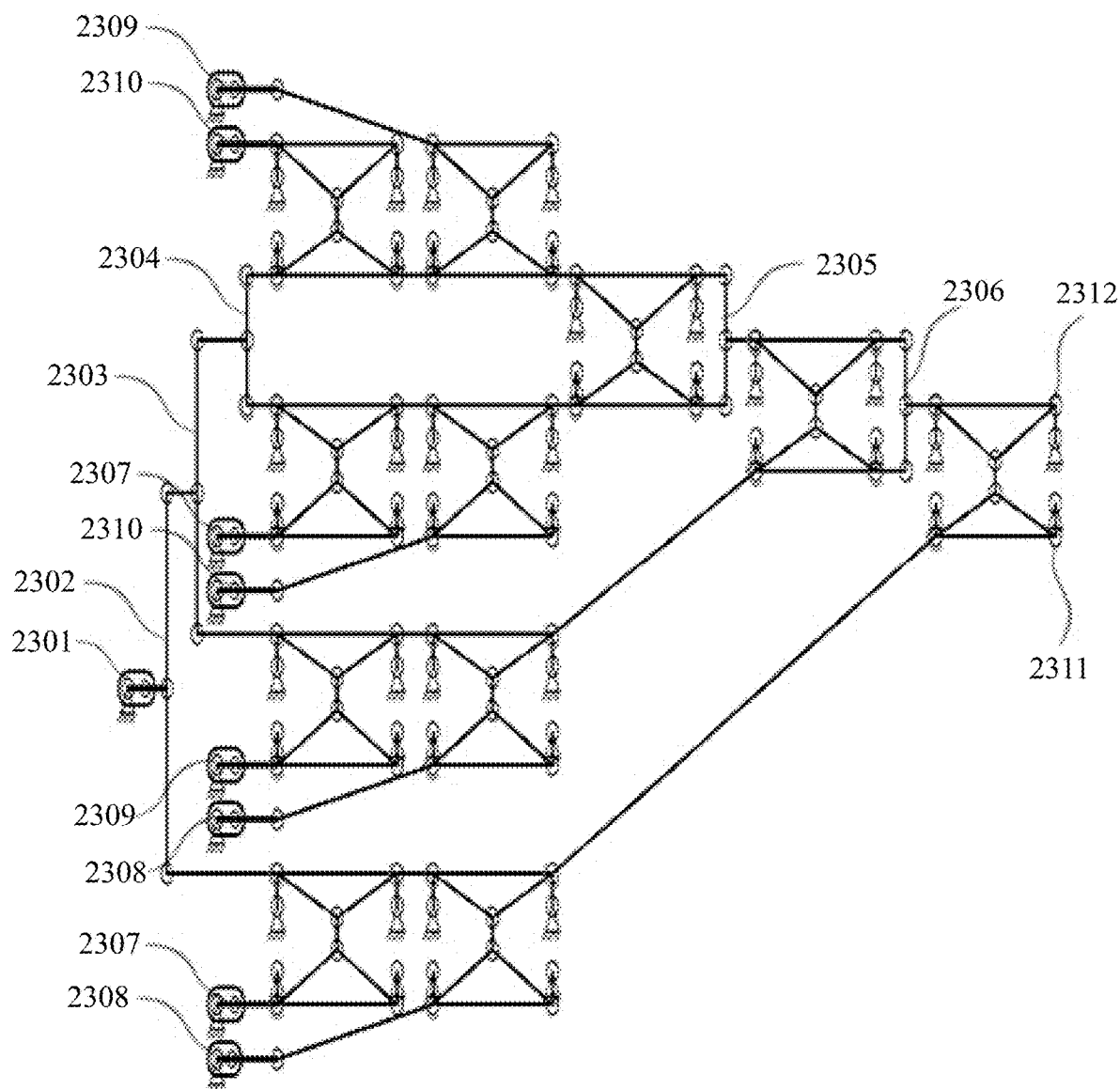
FIG. 23 depicts a top view of a lock and balance-based NAND gate.

FIG. 23 depicts one way in which a NAND gate can be constructed using locks and balances. Clock input 2301 is connected to balance 2302, which is in turn connected to balance 2303, which is in turn connected to balance 2304. Via a series of locks and lines, the clock input is then routed to balances 2305 and 2306, and finally results in the movement of upper output 2312 or lower output 2311. Inputs 2307 to 2310 provide inputs to the gate, with four input lines being used to represent two binary inputs, as previously described. Specifically, input 2307 will be referred to as "A0" (meaning that it is associated with input "A," and will move if the "A" input is 0), input 2308 as "B0," input 2309 as "A1," and input 2310 as "B1." Note that for inputs 2307 to 2310, there are two inputs each with the same label. This is because the same input data is used in two different places within the gate. In reality, this would not require two separate inputs for each, but rather one input for each could be forked using simple rod-like links, or connected to a single link which provides multiple connection points. The depiction in FIG. 23 was chosen for clarity, not because this need be exactly how the mechanism is actually implemented (which is generally true for all the mechanisms described herein). The mechanism works as follows: If actuated, inputs 2307 to 2310 move the side of the gate to which they are connected, and lock the gate. In other words, if the input (A,B) is (0,1), the A0 lines will move, and the B1 lines will move. Since A is not 1, the A1 lines will not move, and since B is not 0, the B0 lines will not move. Obviously, and input, (0,0), (0,1), (1,0) or (1,1) is allowed. The inputs establish a pattern of which gates are locked and which are not. This pattern in turn determines which side of each balance is free to move. The clock input then actuates the balances, with the end result being that either bottom output 2311, representing (A NAND B)0, will move, or top output 2312, representing (A NAND B)1, will move. The resulting output generates the NAND truth table:

| Inputs | | | | Outputs | |
| --- | --- | --- | --- | --- | --- |
| A1 | A0 | B1 | B0 | (A NAND B)1 | (A NAND B)0 |
| 0 | 1 | 0 | 1 | 1 | 0 |
| 0 | 1 | 1 | 0 | 1 | 0 |
| 1 | 0 | 0 | 1 | 1 | 0 |
| 1 | 0 | 1 | 0 | 0 | 1 |

As has already been mentioned, NAND is a universal gate. Therefore, it follows from this example that a system of locks and balances could be used to design any other desired logic gates, reversible or irreversible, using combinations of NAND gates. However, this may not be the most efficient way to implement any desired logic, and similar lock and balance-based mechanisms can be used to implement any other logic gate directly, including AND, OR, NOR, XOR, XNOR, NOT, CNOT, Toffoli and others.

One implementation of a Fredkin Gate was already described. Locks and balances can also be used to build a Fredkin gate. A Fredkin gate has three inputs and three outputs. The three inputs will be called A, B, and C, and the three outputs X, Y, and Z. Input A always connects to Output X. If Input A is 0, then Input B connects to Output Y and Input C connects to Output Z. If Input A is 1, then Input B connects to Output Z and Input C connects to Output Y. As previously noted, Fredkin gates are universal gates, meaning that any logical or arithmetic operation can be computed with only Fredkin gates. This is not to say that a practical MLL computing system need be composed solely of Fredkin gates, as this would not necessarily be the most efficient configuration for many computing tasks. As will be obvious from the teachings herein, many other types of gates can be implemented using MLL. Fredkin gates are used as one exemplary embodiment because they are both universal and reversible.

Figure 24:
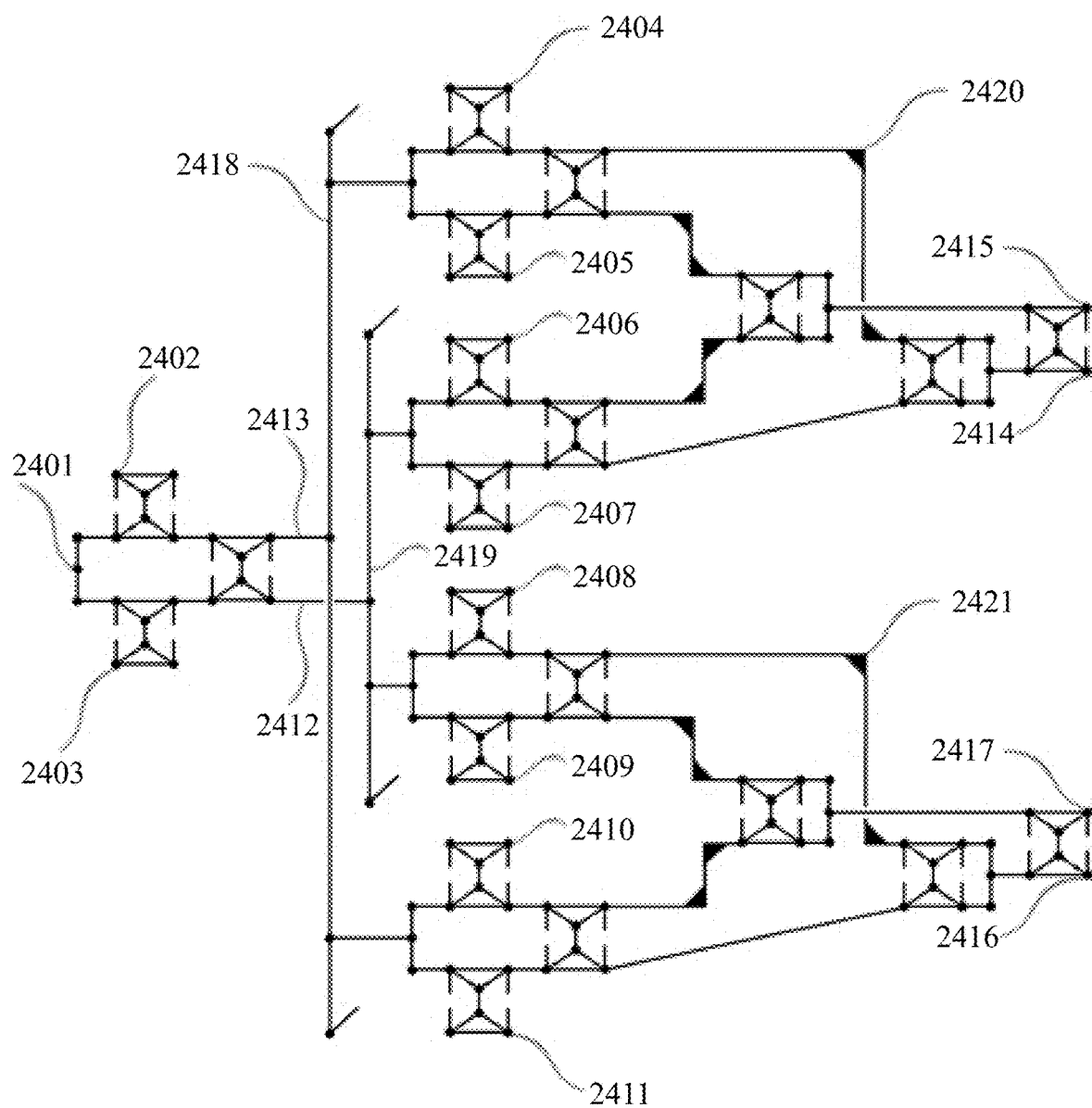
FIG. 24 depicts a top view of a lock and balance-based Fredkin gate.

FIG. 24 depicts a Fredkin gate made using locks and balances. Due to the complexity of the mechanism, a simplified notation is used where anchored rotary joints are not explicitly shown, but assumed to be on the unconnected ends of appropriate links. The clock input or signal (actuator not shown, as with all inputs to this mechanism) would be attached to rotary joint 2401. Input for A1, A0, B1, B0, C1 and C0 input would be attached to rotary joints 2402, 2403, 2404, 2405, 2406 and 2407, respectively. B1, B0, C1 and C0 inputs would also be connected to rotary joints 2408, 2409, 2410 and 2411, respectively. The clock signal and inputs are connected via a series of links and locks, and for some outputs, balances, to X1 output 2412, X0 output 2413, Y1 output 2414, Y0 output 2415, Z1 output 2416 and Z0 output 2417. Note that the X1 and X0 outputs are not shown on the right side next to the other outputs to reduce figure complexity. In reality, obviously they could be routed to any location desired. Note that links 2418 and 2419 are part of 4-bar linkages, not balances, constraining these links to stay vertical when moving. Black triangles 2420 and 2421 exemplify rigid linkages (a straight line is not used to avoid a representation with excessive lines which cross each other, and this representation is only diagrammatic; the actual mechanisms could be implemented in many ways).

The blank state is depicted in FIG. 24. Conceptually, from this state, the A, B, and C inputs are set during one clock phase. During a subsequent clock phase, the clock signal connected to rotary joint 2401 is set to "1," which causes the movement of the various balances within the mechanism, resulting in the X, Y and Z outputs being set as appropriate. While one straightforward approach to building a system would be to use Fredkin gates throughout, and to use three-phase Landauer Clocking, other approaches are feasible. As will be obvious from the various well-known clocking schemes, there may be additional clock phases, and using Bennet Clocking, the number of clock signals will depend on the number of steps one desires to allow in a retractile cascade.

Shift Registers

Shift registers can be used as a foundation for implementing sequential logic in a computational system. For example, two numbers to be added, subtracted, ANDed or ORed are stored in two shift registers and clocked out into an arithmetic and logic unit consisting of a handful of gates, with the result being sent to the input of a third shift register called the accumulator. In reversible digital circuits, a shift register can be defined as a series of "cells," each cell having three stable states: 0, 1 and blank (b), which can be used to store state information. The cells are clocked by successive clocks. The output of each cell is connected to the input of the next cell in the chain. The data stored in the chain is shifted by one position after each clock cycle; data (0, 1, or b) at the input is shifted in while data at the end of the array is shifted out. Binary clocked shift registers can be implemented using only the clocks and the rotary joints connected by links (creating locks and balances) previously described. Shift registers are simple, yet when combined with the appropriate combinatorial logic, contain all the fundamental elements required for a computational system.

A shift register can be built by combining locks and balances, and assuming the presence of a clock system, so that each cell (which might be viewed as a flip-flop, and which may also be thought of as a buffer and can be used to synchronize clock phases of different processes by introducing clock phase delays) of the shift register is related to its neighbor by virtue of relying upon a preceding or succeeding clock phase, as appropriate. This enables the copying and shifting of data through the shift register, rather than deterministically setting the contents of the entire shift register simultaneously.

Figure 25:
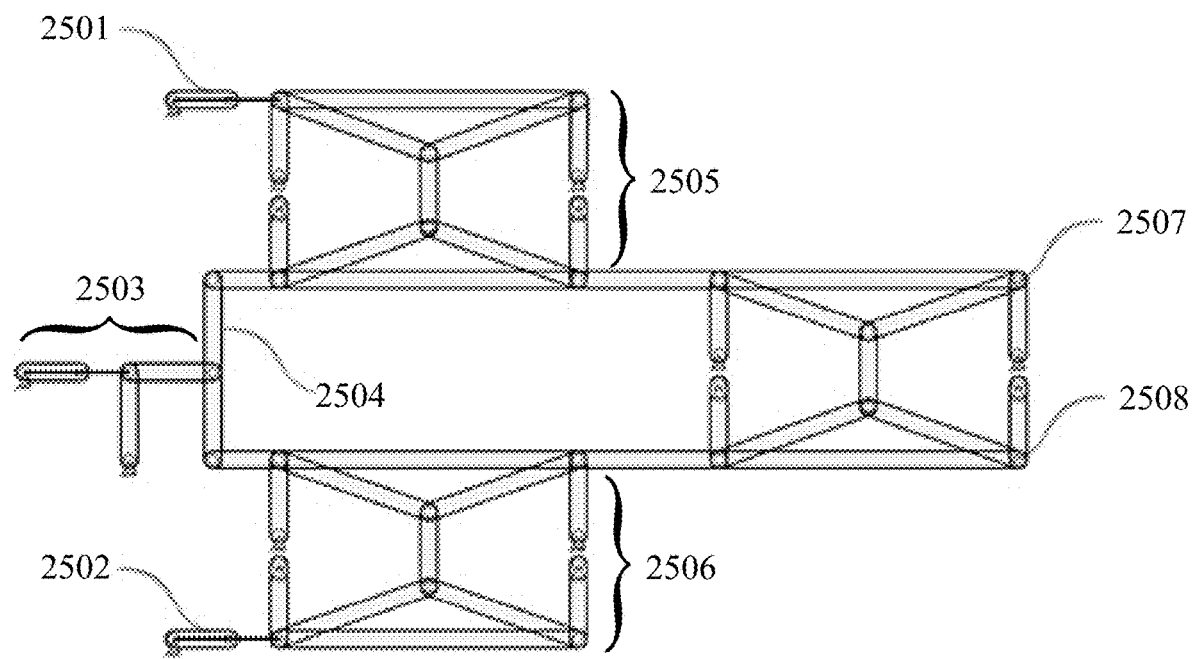
FIG. 25 depicts a top view of a shift register cell in its blank state.
Figure 26:
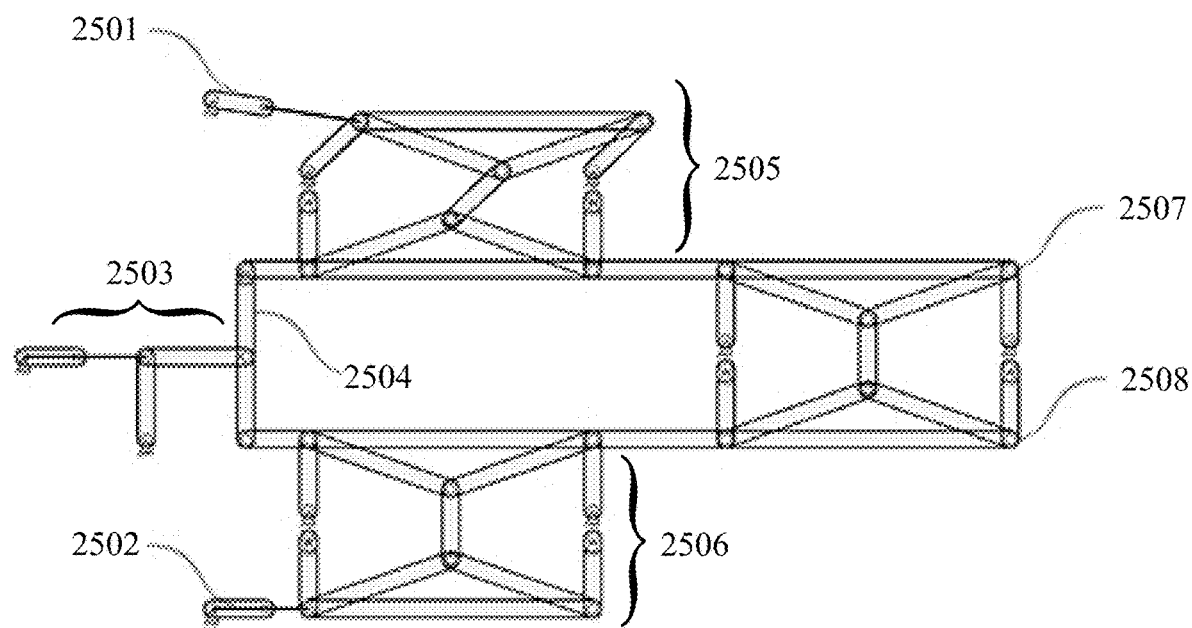
FIG. 26 depicts a top view of a shift register cell after input has been provided but before a clock signal is set to high.
Figure 27:
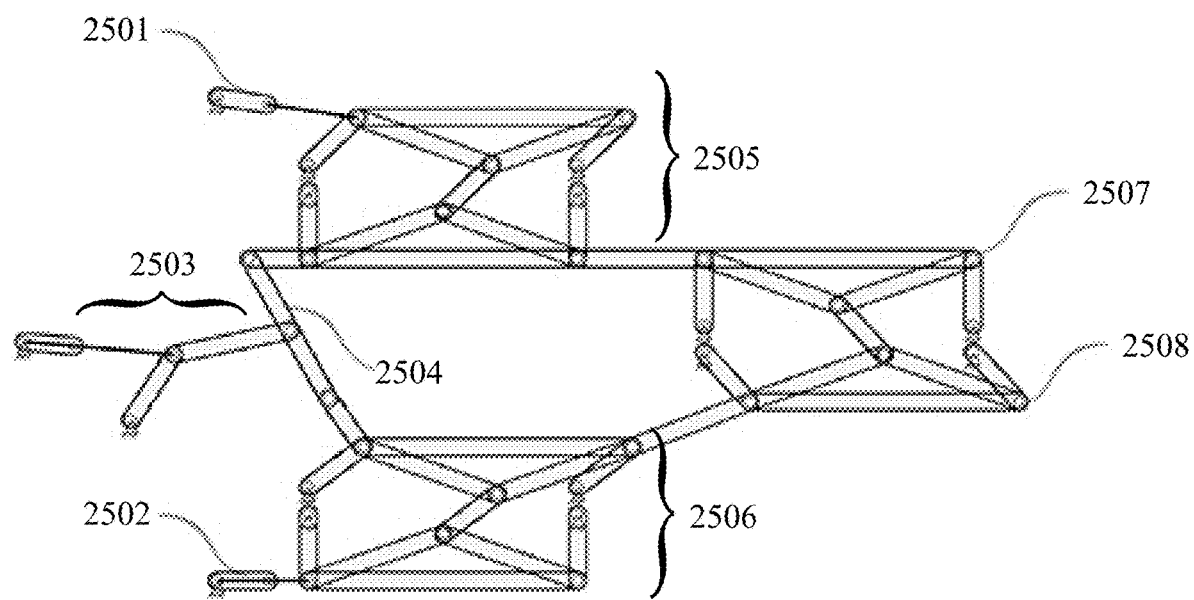
FIG. 27 depicts a top view of a shift register cell after input has been provided and a clock signal has been set to high.

FIG. 25, FIG. 26 and FIG. 27 depicts a single cell of a shift register, in three different states. In these figures, the 0 input 2501 is connected via a rotary joint to one side of lock 2505. The 1 input 2502 is connect via a rotary joint to one side of lock 2506. Clock signal 2503 (although diagrammed differently to provide a mechanism that is more complete when standing alone, this would, in an actual system, be a connection to the clock system), is attached to balance 2504. Locks 2505 and 2506 determine which of the outputs 2507 or 2508 move when the clock signal becomes 1. The lock which contains outputs 2507 and 2588 can be thought of as the output lock for the overall cell, while locks 2505 and 2506 are holding area locks. The importance of this concept will become clear when connecting multiple cells in series.

FIG. 25 depicts the cell in its blank state, before any input has been provided, and while the clock signal is low or 0. FIG. 26 depicts the cell after input 2501 has been set to 1, but before the clock signal has moved to high or 1. This results in the locking of lock 2505.

FIG. 27 depicts the mechanism from the previous state once the clock signal has moved to high. As clock signal 2503 pushes on balance 2504, because lock 2505 is locked, only one side of balance 2504 is free to move. Thus, the clock signal moving to high is transmitted through lock 2506 and to output 2508. Note that the movements between states such as those illustrated in FIG. 25, FIG. 26 and FIG. 27 do not take place simultaneously but rather are governed by clock signals and data inputs (which themselves may be tied to clock signals). This sequential behavior is what allows the proper functioning of this cell or buffer (also analogous to a latch in electronic computing). Such behavior is easy to realize and well-known in electrical implementations, but more involved in a mechanical implementation.

Figure 28A:
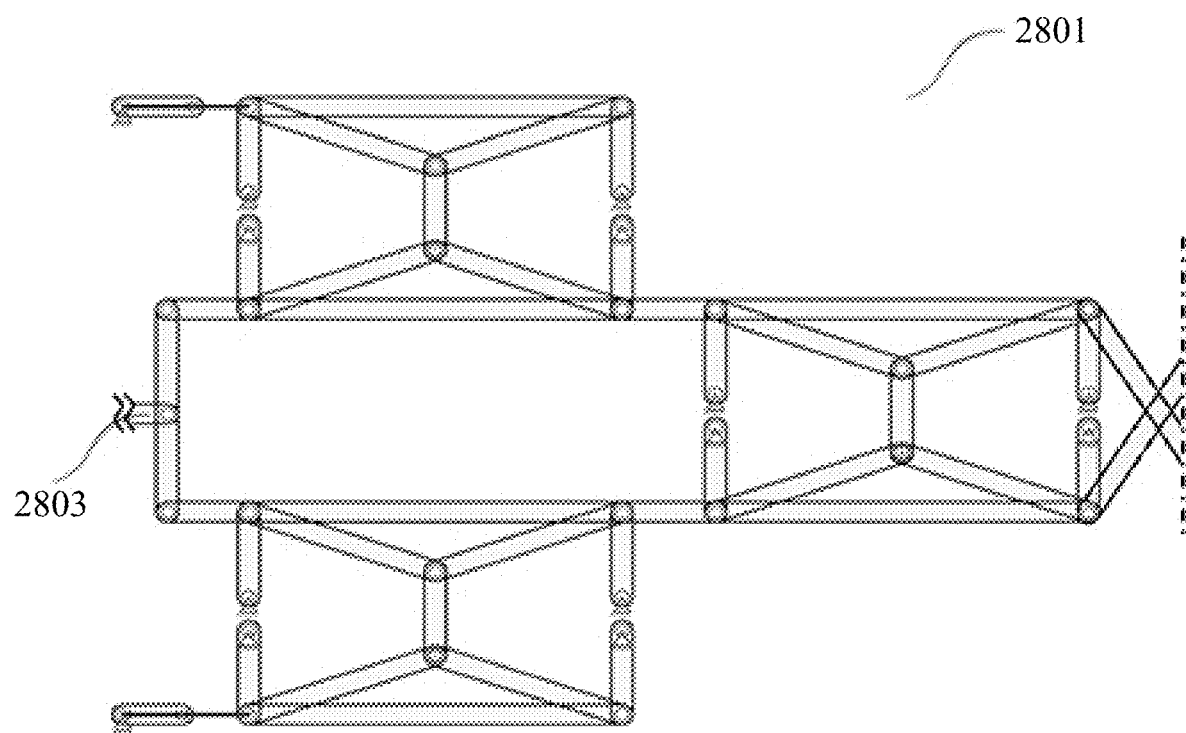
FIG. 28a depicts a top view of the left half of a two-cell shift-register.
Figure 28B:
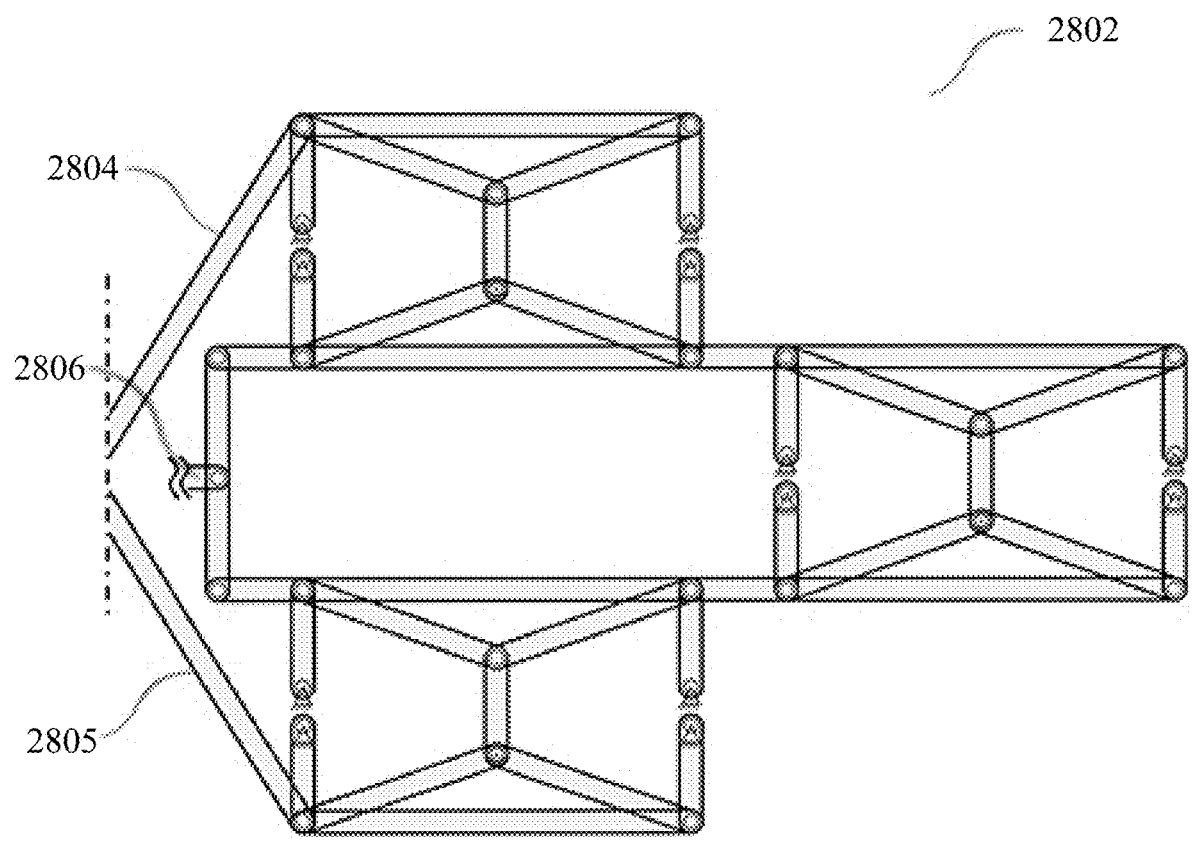
FIG. 28b depicts a top view of the right half of a two-cell shift-register.

FIG. 28a, comprising the left half, and FIG. 28b, comprising the right half, collectively depicts a two cell shift register to illustrate how two cells would be connected and to explain how data would move from one cell to the next. In FIG. 28a, cell 1 2801, and in FIG. 28b, cell 2 2802, are each equivalent to the mechanism depicted in FIG. 25. In FIG. 28a, cell 1 2801 has a connection to a clock signal via link 2803 (depicted as a partial link to indicate connection to a clock system that is not shown), and in FIG. 28b, cell 2

2802 has a connection to a clock signal via link 2806. Links 2804 and 2805 connect the cell 1 2801 and cell 2 2802.

Like in FIG. 25, FIG. 26 and FIG. 27, a multi-phase clock signal is assumed to be present, and links 2803 and 2806, and the data inputs associated with each cell would preferably all operate on different clock phases, requiring at least a three-phase clock for this particular design. The operation of a single cell has already been described, but demonstrating how cell 1 2801 passes data to cell 2 2802 may be instructive. The sequence of events is as follows: (1) on clock phase 1, the clock for cell 1 2801 was already at 0, and the data inputs are set for cell 1 2801. Either the upper or lower lock of cell 1 2801 locks, depending on which input was set to 1; (2) on clock phase 2, the clock signal for cell 1 2801 is set to 1. This results in the unlocked side of the balance present in cell 1 2801 moving, which in turn moves either link 2804 or link 2805. This locks one of cell 2's 2802 holding area locks, copying the data from cell 1 2801 into cell 2's 2802 holding area. Note that the output lock of cell 2 2802 still has not moved; (3) on clock phase 3, the clock signal for cell 2 2802 is set to 1. This copies the data from the holding area locks into cell 2's 2802 output lock. In detail, one of cell 2's 2802 holding area locks was already locked, so when the clock signal for cell 2 2802 changes from 0 to 1, only the unlocked line could move. When this unlocked line moved, it locked cell 2's 2802 output lock. It also locked the second of cell 2's 2802 two holding area locks; and (4) the clock signal for cell 1 is set to 0. This unwrites cell 1's 2801 data from cell 2 2802 by unlocking only the cell 2 2802 holding area lock that was originally locked when cell 1's 2801 clock was set to 1, as the other lock was just locked by the clock signal to cell 2 2802. This cycle then repeats itself as new data is input into cell 1. In step 2 above, it is noted that the output lock of cell 2 2802 still has not moved. This allows these exemplary shift register cells to store previous data, whereas mechanisms such as some of the logic gates described herein have their state completely determined by the current data inputs. This is because a cell can contain not only a previous input (which ends up being shifted to its output lock during clock phase 3), but also the current input, which is stored in the holding area locks.

It will be apparent from this description that if reversibility at the shift register cell (or other mechanism) level is desired, all that need be done is to run the clock phases in the opposite order. If a retractile cascade is desired, then a scheme like Bennett clocking can be used, coupled with the appropriate hardware design (e.g., the ability to store "junk" bits so that no information is lost, allowing the computation to be reversible to as many levels deep as desired). In the current example, the shift register being only 2 cells long, only 2 numbers can be stored. In an actual system, such a shift register can be arbitrarily long. Further, while this particular implementation is a serial-in/serial-out design, it will be obvious given this example that MLL can be used to make any other type of shift register desired, such as parallel-in/parallel-out, serial-in/parallel-out, and others.

Momentum Cancellation

It can be useful to perform computation without altering either the center of mass or the moment of inertia of a group of computing structures, so that the forces that these changes would cause are not coupled to the overall system, potentially contributing to energy dissipation. This can be accomplished by using sets of structures whose movements cancel out changes in the center of mass or the torque around any axis (a "canceling group"). Such techniques can apply to any structure, such as links, lines, locks, logic gates, balances, clocks, and larger aggregate structures. For example, consider a link or line which is used to transmit data from one place to another. Such a structure may be replaced with four parallel structures, conceptually grouped as two pairs. Each member of a pair moves in the opposite direction, canceling changes in the center of mass and linear momentum. However, each pair could still create torque. So, the direction of movement of each link is reversed from the first pair to the second pair, resulting in torque cancellation. Given this type of arrangement, no net force is coupled to the overall device and so such canceling groups can be used to transmit data while reducing energy coupled into the rest of the structure.

Figure 29:
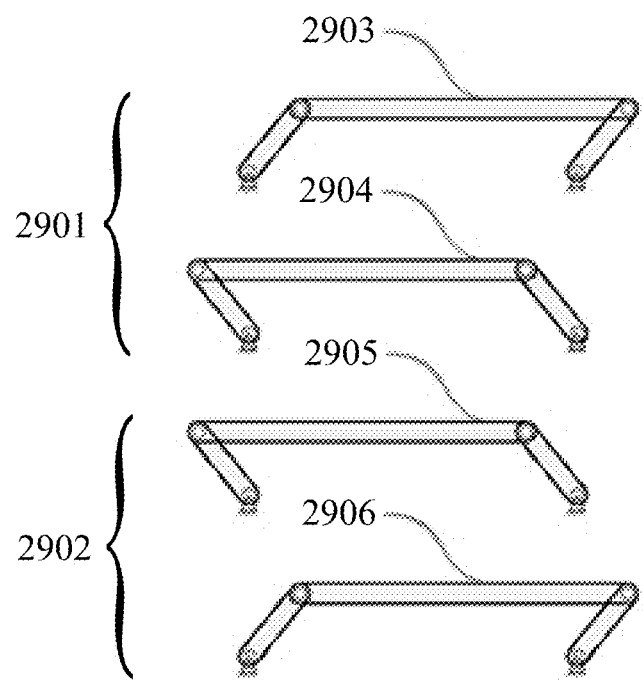
FIG. 29 depicts a top view of a canceling group.

FIG. 29 illustrates this concept using groups 2901 and 2902, each containing two members, 2903 and 2904, and 2905 and 2906, respectively. Within a group, each member moves in the opposite direction from the other member (while each member is not connected to the others in the diagram, in an actual system movements would be synchronized, e.g., by clock signals). For example, as depicted, member 2903 has moved to the right, while member 2904 has moved to the left. The accelerations that take place during these movements will generate forces on the underlying support structure (the anchor block, not shown). Since members 2903 and 2904 accelerate in opposite directions, the linear components of their momentum will cancel. However, in this arrangement they will still generate a net torque on the anchor block. Adding the second pair of members 2902 containing members 2905 and 2906, which also move in opposite directions within the pair, but generate a torque that is opposite the torque of group 2901, allows complete cancellation.

Obviously, many other designs could be used to either cancel momentum, or reduce the need to do so in the first place (e.g., by reducing mass, or reducing the radii to centers of rotations). Given this, momentum cancellation is not limited to any particular arrangement. Nor are cancelling groups limited to some specific number of members. Even odd numbers could be used, such as where the members of a canceling group do not have the same masses or momentum. For example, two members could be used to cancel one other member that generates twice the momentum. And, momentum cancellation need not be complete. Additionally, forces along any axis may be addressed similarly. For example, in actual designs, forces which cause torque along the Z axis, which is defined for this example as perpendicular to the figure plane, may also need to be cancelled. The complexity and increased mass of complete cancellation may outweigh the benefits, and the appropriate amount of cancellation (if any), and which force components to cancel, if any, will vary on a case by case basis.

Clocks

In an MLL system, a clock system synchronizes the mechanisms, and also provides force to drive the mechanisms. It is well-known in the field of computer science that computational systems with different numbers of clock signals (or phases) can be used. At least 2 phases are required, but 3 phases can be advantageous, and higher numbers can also be used. An MLL clock system could consist of one or more clocks which create a plurality of clock signals. These signals could take the form of reciprocating motion transmitted through the mechanisms, such as via lines, or the use of rigid frames (which are actually just links of specialized shape, for example, a rigid frame could connect to a clock at a single location, and then branch out, potentially in multiple directions or dimensions) to connect to many gates or other mechanisms), supported by support links as necessary. The optimal number of mechanisms connected to a single clock or clock signal will be implementation-specific, depending on factors like the mass which is being driven, the rigidity of the system, and the switching speed. Alternatively, clock signals could be generated by multiple local clocks, such as oscillators or rotating masses, with communication between the clocks as required to keep them synchronized.

Clock signals could be generated in a variety of ways. For example, rotating masses, harmonic oscillators, or cams and cam followers could all be used, creating periodic motion in links where, for example, one position may represent "0" and another position may represent "1". A rotating mass, which is essentially a flywheel, can serve as a simple oscillator. Flywheels, coupled to links by rotary joints, could be used to drive each clock signal back and forth and require no parts beyond links and rotary joints. A flywheel could be kept in constant motion by some sort of energy source or motor, which replenishes the energy lost to dissipative mechanisms in the system. A discussion of exactly how such an energy source or motor might be implemented is beyond the bounds of the invention. It is obvious from the literature, which contains substantial work on both macro-scale motors, and molecular-scale motors, including bio-motors (e.g., ATPases, flagella) and synthetic motors, that there are many ways to implement such motors, and many ways to power such motors, including chemical, light, direct current, and external electrical fields.

Other designs for clocks introduce parts beyond links and rotary joints, and so do not technically fall under the definition of MLL. However, as the use of alternate clocking systems connected to an MLL system may have utility, it is described how such alternate clock implementations can be designed for minimal energy dissipation. Further, since a single clock can drive many logic elements, even if the clock itself were to be somewhat dissipative, overall, computation could still be quite efficient.

One alternate clocking system would be to use simple harmonic oscillators, preferably with a high Q factor. The use of simple harmonic oscillators has the advantage that a single clocking frequency would be used, and that the clocking frequency would be provided by a very simple mechanism. Using such an oscillator, components would preferably be designed to use sine-like clock signals (including signals with sine-like transitions between 0 and 1 with flat areas in between for timing purposes), and designed in such a way that they did not generate significantly higher frequency overtones during operation (as, for example, if one moving part collided with another moving part). Alternatively, a sum of simple oscillators could be used, the sum approximating the desired clock signal. The use of a sufficient number of oscillators could, in principle, approximate the desired clock signal as accurately as desired, at the expense of additional parts. One way to implement a harmonic oscillator is with a spring (in which is included a flexure or other structures of similar purpose), which could be made of any material with the appropriate properties and spring constant, including the same materials as the links.

Figure 45:
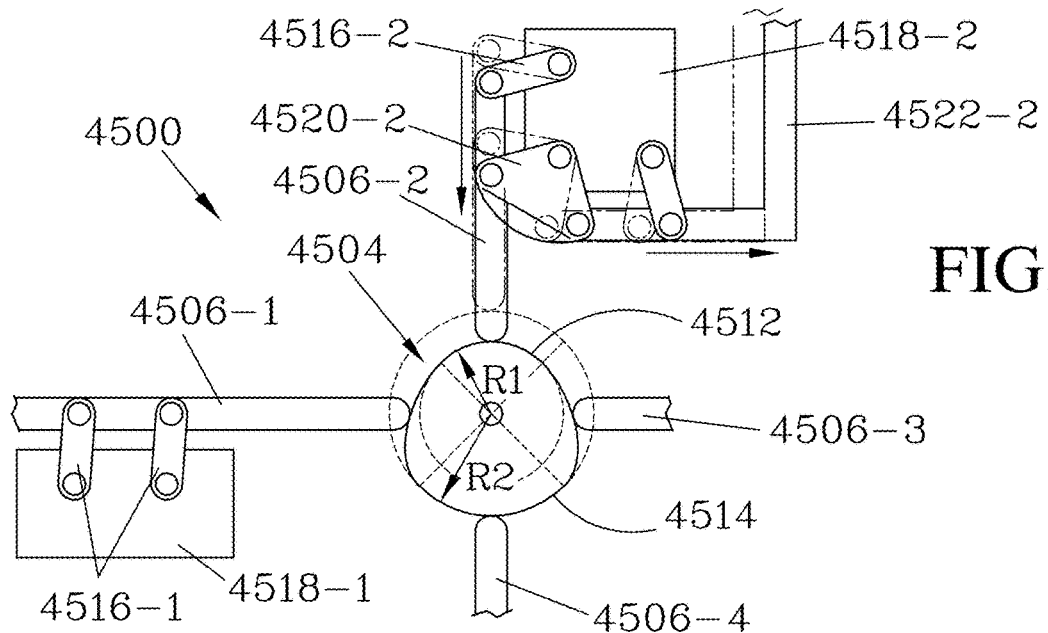
FIG. 45 depicts a top view of one example of a 4-phase clock that can provide a mechanical clock signal for mechanisms such as the multi-bit adder shown in FIG. 44.
Figure 46:
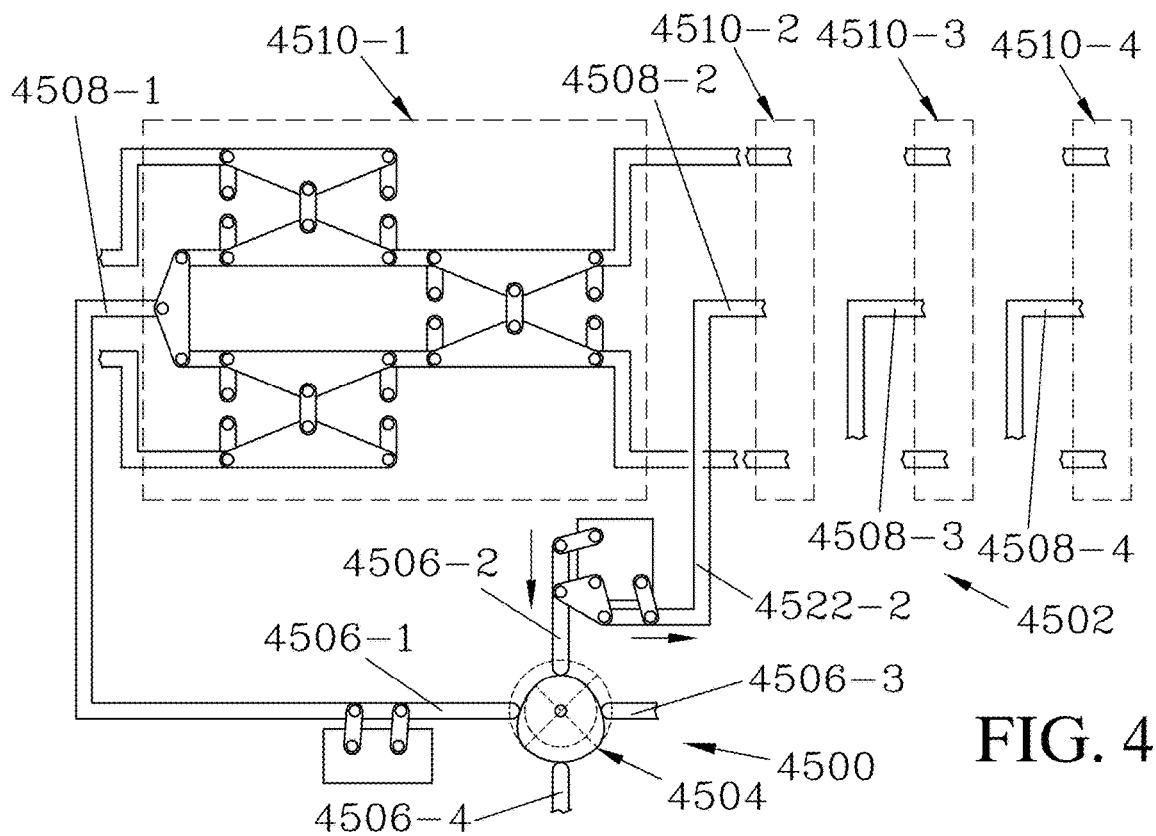
FIG. 46 depicts a top view of an example of the clock shown in FIG. 45 employed to drive a 4-cell shift register formed by locks and balances.

Cams and cam followers are another way to generate a clock signal (one example is shown in FIGS. 45 & 46). A cam and cam follower can be used to generate a very smooth clock signal, as is subsequently described. A cam can also be used to generate a clock signal with an essentially arbitrary waveform. A cam could be made, for example, from a rotating link supported by rotary joints at either end. The link thus forms an axle which can be used as a camshaft. The cam would be affixed to the camshaft (or the camshaft could actually be the cam, assuming it has the appropriate cross-sectional shape). A cam follower could be constructed, for example, using a wheel connected to two rotary joints, connected to a lever arm. Rotating the camshaft would rotate the cam. The cam follower wheel would ride up and down on the cam, causing the lever arm to go up and down along with it. The lever arm would be a link in a suitable linkage. Many other geometries and relative positions for the cam and cam follower could be used, including designs where the cam follower surrounds the cam, or vice versa, such as with an eccentric rotor and stator, as well as variations in the types of motion the cam makes, such as designs where the cam simply rocks back and forth, or moves in a manner that is itself under programmatic control, as well as combinations of the foregoing and obvious variations.

While it may not be obvious how smooth curves can be made at the molecular level, since angles and distances are quantized by the nature of chemical bonds, this issue can be overcome. For example, in diamond, buried Lomer dislocations could be used to create smooth curves on the surface of a Lonsdaleite (hexagonal diamond) cam. Similarly-gradual changes could be accomplished with diamond and other materials, by using changes in bonding patterns, the incorporation of elements of varying atomic radii, using strain to slightly displace an atom or atoms, or using naturally curved structures such a nanotubes. Using these strategies, a molecular implementation of cam and cam followers (and indeed, any pieces of such a system) could be made to almost arbitrarily precise tolerances, even to distances below a single atomic diameter.

Using a rotating mass to generate clock signals requires only rotary joints and links, the basic parts of MLL systems. If a cam and cam follower were used, the rotary joints connecting the cam follower's lever arm to the wheel, and those which allow the cam to rotate, have again, already been discussed. However, in a cam-based system, there is rotating contact between the cam and cam follower wheel surfaces, a situation not present when considering the basic parts of MLL. While this may seem like a mechanism that creates undesirable sliding friction, it need not be. The two surfaces do not have to slide over each other, but rather rotate synchronously. Analysis indicates that, especially given a molecular-scale, atomically-precise (or nearly so) implementation, the energy dissipation from such a mechanism would be very low.

In such a molecular-scale mechanism, the very slight distortion in the shape of the wheel and the very slight variation in attractive force (van der Waals, or "VDW") between the surface and the wheel could cause very slight phonon generation. Viewed in the frame of reference of the cam follower, the wheel and surface would be static other than the very high frequency shifting of the crystal structures within them. As a consequence, there should be no generation of low frequency phonons. And, inertia and positional uncertainties caused by thermal noise will prevent the mechanism from being able to reproduce the highest frequency components in the signal on the cam, even in the absence of a low pass filter on the output (which could be used if desired, and could be implemented, e.g., as a simple spring and mass device).

Also, various cancelation methods could be used to minimize the high frequency signal component that is encoded on the cam's surface. This might be done, for example, by using a plurality of cam follower wheels that read a plurality of tracks on the cam surface, each track being staggered by some distance. Attaching each cam follower wheel to the cam follower would then effectively sum or average their outputs, canceling at least some of the high frequency noise signal. Any number of tracks and cam follower wheels could be used, with any desired shape for each track (e.g., different canceling signals could be encoded in each track), resulting in arbitrary accuracy of the aggregate signal. Another method to reduce high frequency noise would be to rotate the crystal axis of the material from which the cam is made, and perform a corresponding rotation of the crystal structure of the wheel which is meshing with them. By choosing the crystal rotation and width of the cam and cam follower appropriately, other high frequency signals may be eliminated due to the change in timing and atomic spacing as the cam contacts the cam follower wheel. Yet another method of reducing the transmission of high frequency signals is to reduce the stiffness of the coupling of the cam and cam follower to the rest of the system. For example, reducing the spring constant of the cam follower arm, or reducing the stiffness of the bonds on which the cam follower is mounted, would help filter high frequency signals.

Given these examples, it will be obvious that these are not the only ways to reduce high frequency components. There are many ways to ensure that parts in rotating contact do not create or transmit high frequency signals, and the use of atomically-precise parts in particular allows the minimization of such signals. As the cam follower rises and falls on the curved cam surface, following the clock signal encoded in that surface, it will subject the cam surface to inertial forces. Each acceleration or deceleration of the cam follower will create a corresponding force on the surface of the cam. These periodic forces will create phonons at the clock frequency. This source of energy dissipation can be canceled if two cam followers follow two cams, the two cams encoding equal but opposite signals. And, since the clock frequency is arbitrary, this frequency can be reduced until energy dissipation caused by coupling of the high frequency components of the clock signal to mechanical vibrational modes is under desired levels. Note that the cam follower mechanism described can exert a relatively strong force when the cam is pushing on the cam follower. However, during movement in the opposite direction, the force is limited by the van der Waals force between the cam and the wheel. This can be rectified, if need be, for example, by using two cam followers and two cams (with the encoded signals appropriately rotated with respect to each other), where the cam followers are on opposite sides of their respective cams. The first cam follower can exert a strong force in one direction, while the second cam follower can exert a strong force in the opposite direction.

Exemplary Switching Time Analysis

The basic constitutive equations of simple Newtonian motion and assumptions about the size and physical strength of links can be applied to an analysis of the switching time, mass, force, and resonant frequency for a molecular scale implementation of MLL mechanisms. To provide a concrete example, several assumptions must be made, all of which could vary greatly depending on the exact implementation, but the exact performance of a given system is not the point, rather, the goal is to calculate an estimate of one possible operating speed of an exemplary molecular-sized system. Links are assumed to be ~20 nm in length and about 0.5 nm to 0.7 nm in diameter. Links are assumed to be made of diamond or similar material, and to be braced to increase their stiffness (e.g., a beam with triangular bracing, rather than just a straight beam). The positional difference between "0" and "1" is assumed to be ~2 nm. Rotary joints are assumed to be like those shown in FIG. 1, and the system is assumed to be operating a room temperature. These assumptions allow the calculation of link and rotary joint stiffness. To determine the resonant frequency, mass must be determined.

The mass of a typical mechanism can vary widely. Even using a given type of link, the mass will be quite different depending on whether the mechanism is a single 4 bar link, a lock, a balance, a logic gate, etc., and on the exact implementations of such structures. To use round figures, the moving mass of a link might be about $8 \times 10^{-23}$ kg, while the moving mass of a mechanism made of several links might be on the order of $10^{-21}$ kg. Using these assumptions, the resonant frequency for an exemplary molecular-scale mechanism may be around 13 GHz. A square wave clock signal would lead to substantially higher than necessary energy dissipation. Therefore, it is assumed that the clock waveform is generated as a sinusoidal wave, convolved with a Gaussian to reduce undesirable high frequency components, or optimized using standard linear systems theory to minimize the generation of undesired resonances. In addition, to be conservative, the clock can be operated at a frequency well below the 13 GHz resonant frequency calculated. Depending on various assumptions, such as just how much energy dissipation is acceptable, and with how much margin for error, this results in switching times in the 1 ns to 10 ns range. Obviously, this is only exemplary. Larger structures would likely operate at slower speeds, while smaller structures, stiffer structures, designs which move shorter distances between "0" and "1", lower operating temperatures, or relaxation of some of the conservative design parameters assumed, would result in faster switching times.

MLL Summary

MLL has been shown to be able to create mechanisms including lines, logic gates, locks, balances, switch gates and shift registers, using only rotary joints and links. MLL provides for any combinatorial logic by using various combinations of logic gates which, either alone (e.g., NAND or Fredkin gates) or in aggregate, are universal. Sequential logic, and therefore memory, can be provided by flip-flops or cells, which can be combined into shift registers.

Given the availability of both combinatorial logic and sequential logic, it will be obvious that a complete computational system can be built using MLL. For example, the Von Neumann architecture, a well-known Turing-complete architecture, requires three main components: A control unit, an arithmetic logic unit, and memory. Using combinatorial logic and flip-flops, a finite state machine can be created which can be used as a control unit. Combinatorial logic can be used to create an arithmetic logic unit. And, flip-flops can be used to create memory. This is all that is needed for a complete computational system. Of course, such a system does not need to be based on the Von Neumann architecture; this is simply an example to illustrate the fact that all the necessary components of a Turing-complete system can be provided using MLL. Depending on the exact mechanisms used, and the clocking scheme employed, an MLL-based computational system can be irreversible, reversible, or some combination thereof. The ability to create mechanical computing mechanisms, and complete computational systems, using only links and rotary joints can provide advantages which include reduced friction (and therefore power consumption and waste heat generation), device design and manufacture simplification, and device robustness (e.g., operation at more extreme temperatures than permitted by many other known computational systems, given that mechanical logic could function up to near the melting point of its constituent parts, whereas, electronic computing suffers from bandgap issues at extreme temperatures).

Mechanical Flexure Logic

Figure 30:
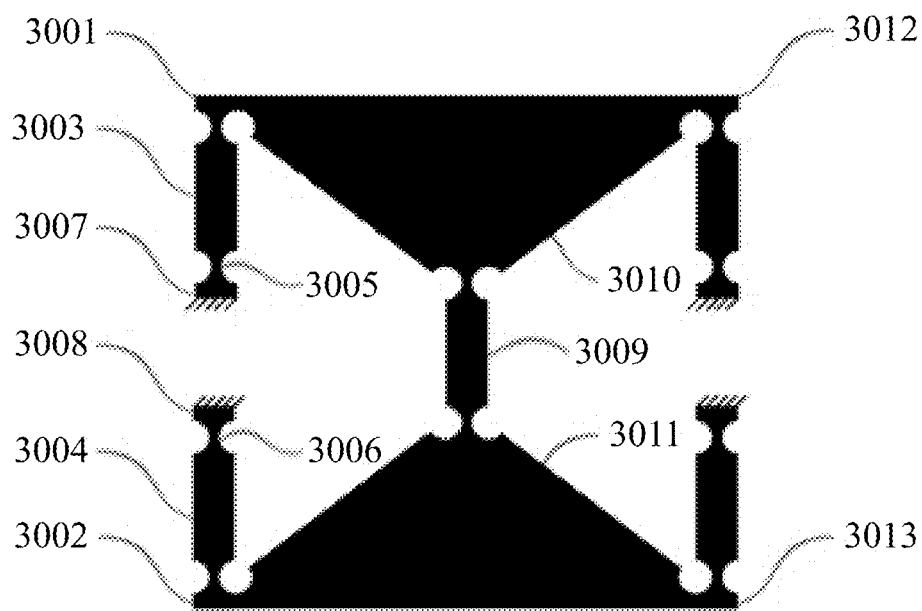
FIG. 30 depicts a top view of a flexure-based lock.

Flexures can take the place of the rotary joints used in MLL, resulting in Mechanical Flexure Logic ("MFL"). With the substitution of flexures for rotary joints, all MLL mechanisms have analogous MFL mechanisms. For example, FIG. 30 shows the MFL version of the MLL lock depicted in FIG. 7. Link ends 3001 and 3002 of links 3003 and 3004, respectively, are one place where input mechanisms could be connected. Anchored link ends 3007 and 3008 of links 3003 and 3004, act in a manner analogous to anchored rotary joints. Note that there are no actual rotary joints present in the MFL version of a lock. Rather, flexures, exemplified by the semi-circular cutouts 3005 and 3006, provide bendable points between various parts of the structure. These flexures allow force, which may be input at link ends 3001 or 3002, to be transmitted through triangular links 3010 or 3011, respectively, and on to link ends 3012 or 3013 (which may be thought of as outputs), respectively. Link 3009 serves the same purpose as link 709 in the co-planar MLL lock of FIG. 7. The entire mechanism of FIG. 30 can be made (although it need not be) from a single piece of material, where the different links are monolithic, but logically separable because they are bounded by flexures.

Overall, the movement and function of the MFL and MLL locks is completely analogous, but changes in the relative angle between links in MFL are facilitated by flexures instead of rotary joints. While locks are used to demonstrate the analogy between MFL and MLL, it will be apparent that the same analogies can be made between any mechanisms, and therefore by replacing rotary joints with flexures, a Turing-complete system can be made using MFL. Of course, flexures require suitable materials, which may differ from that of links, and the geometry of flexures need not be only that depicted in FIG. 30. Flexures are well-known in the mechanical arts, and suitable designs and materials could be adapted for almost any degree of motion, size, operating temperature, or other parameters.

Mechanical Cable Logic

Another method of implementing computing mechanisms and systems which are analogous to MLL (and hence also to MFL) is to replace links and rotary joints with cables, pulleys, and knobs. This design paradigm will be referred to as Mechanical Cable Logic ("MCL"). With respect to the basic parts, or primitives, MCL cables are analogous to MLL links, and MCL pulleys are analogous to MLL rotary joints. Knobs are an additional primitive that do not have a direct counterpart in MLL or MFL. Knobs are used to aid in the interaction of cables, for example, to create locks, and in that respect, aid in the building of mechanisms with analogous logical functions, even if the part itself does not have a direct analog. It will be obvious given the teachings herein, that by applying force to a cable, movement can be transmitted down the cable and to other mechanisms as desired (hence their analogy to links). Similarly, it will be apparent that pulleys can be used to, among other purposes, allow bends in cables so that movement can be routed in any direction desired (hence their analogy to rotary joints).

The MCL primitives can be used to create, among other structures, balances and locks. While MCL implementations of balances and locks may look different than their MLL counterparts, viewed from a "black box" perspective, MCL balances and locks can be implemented so as to be logically equivalent to the respective mechanisms in MLL. Given this, MCL also provides for Turing-complete systems.

Tracks and Channels

Like MLL rotary joints, MCL pulleys can be anchored or unanchored. However, in MLL links are rigid and this aids in constraining the movement of unanchored rotary joints. In MCL, cables are not rigid, so the proper geometric constraints need to be provided in a different manner. One way to do this would be to keep tension on the appropriate cables (e.g., clock cables) so that pulleys connected to such lines cannot move unless, in this example, the clock lines move, in which case pulley movement is constrained to the path the clock cables define. Another way of addressing this issue would be to mount pulleys on links where such constraint was necessary (although another primitive is then required, and since this blurs the distinction between MLL and MCL, such an embodiment is not addressed further). Yet another way is the use of channels, tracks, or other guiding means on the anchor block. By virtue of being affixed in a sliding manner to the guiding means, the motion of unanchored pulleys are appropriately constrained.

Figure 31:
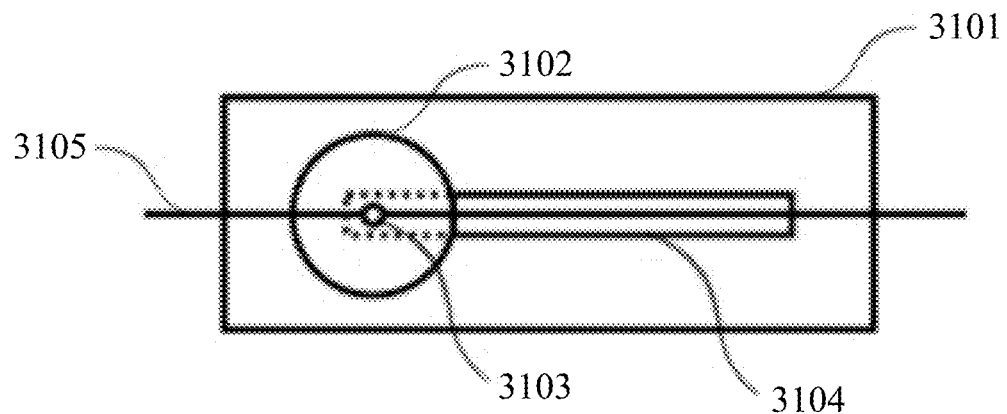
FIG. 31 depicts a top view of an MCL pulley and associated mechanisms.
Figure 32:
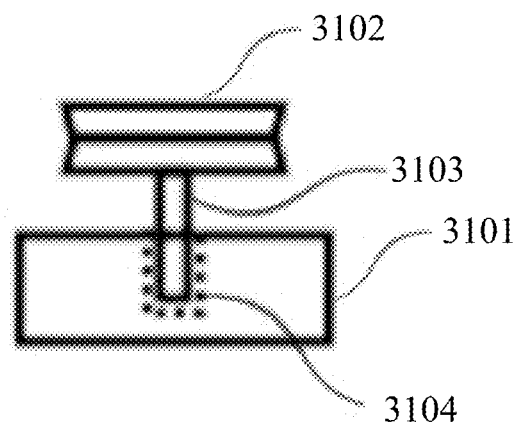
FIG. 32 depicts a side view of an MCL pulley and associated mechanisms.

FIG. 31 and FIG. 32 show a top view and side view, respectively, of a pulley which can slide in a channel. Anchor block 3101 contains channel 3104. Pulley 3102 is monolithic with, or connected to (in a fixed or rotary manner) axle 3103. Axle 3103 connects itself and pulley 3102 to channel 3104 in a slidable manner. Actuating cable 3105 is affixed to axle 3103 and enables the movement of the pulley in the channel (e.g., actuate using a clock line). Note that this is but one way of actuating and guiding pulley movement, and of affixing a pulley to a track, channel, or other guiding means. Many other designs would be obvious, such a pulley with an axle extending through the anchor block with an expanded lower part protruding so that it cannot come out of the channel, a beveled channel and axle (e.g., similar to a dovetail joint in profile) which could accomplish the same goal, or the addition of another axle structure on top of the pulley, along with an another anchor block, pinning the pulley between the two.

Another way of providing guiding means would be rails mounted on the anchor block, the pulley being affixed to the rails in any one of many known means, The point is not the exact mechanical implementation, but rather to provide some guiding means, preferably with low friction, in light of the flexibility of cables; any of many well-known guiding means could be used.

Understanding now how pulley motion can be constrained without the need for links, the analogies between MLL, MFL, and MCL become easier to describe. Since it has already been shown that, in MLL, locks and balances suffice (although they are not the only way) to create Turing-complete systems, it follows that if analogous mechanisms exist in MCL, MCL is also capable of being used to create Turing-complete systems. It has already been stated that, with respect to the basic primitives, MLL links can be likened to MCL cables, and MLL rotary joints can be likened to MCL pulleys. To prove this, and show exactly how cables and pulleys can be used to create the underlying mechanisms of Turing-complete computing, the design of a lock and a balance is described.

MCL Locks

Locks can be created in MCL using knobs that are integral with, or affixed to, cables or other structures. With the appropriate design, these knobs allow the reproduction of the features of an MLL lock. Specifically, with respect to a binary embodiment with two inputs, from the (0,0) unlocked state, there are two allowable movements, those being from the (0,0) unlocked state to one of the locked states, (0,1) or (1,0). From either of the locked states, the only allowable movement is back to the unlocked state. Note that there is no reason that knobs cannot be attached to virtually any structure, as convenient, and the construction of locks are not the only use of knobs.

Figure 33A:
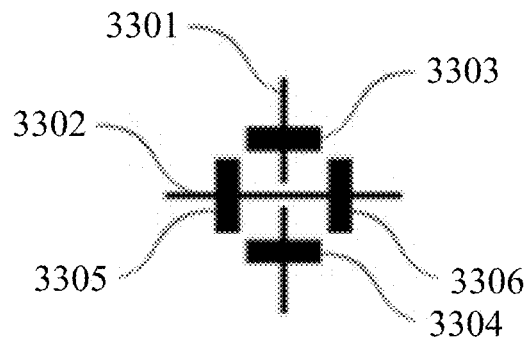
FIG. 33a-FIG. 33c depict top views of various states of one embodiment of an MCL lock.
Figure 33B:
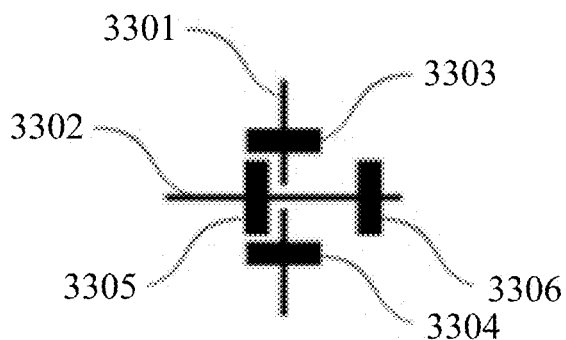
Figure 33C:
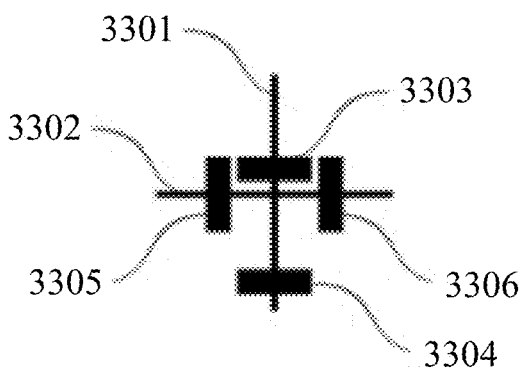

One way to implement the desired logic is depicted in FIG. 33a-c. In FIG. 33a, a first cable 3301 is crossed by a second cable 3302. Two knobs 3303 and 3304, and 3305 and 3306, respectively, are affixed to each cable. FIG. 33a shows the lock in the (0,0) position, where either cable is free to move. FIG. 33b shows the lock in the (0,1) position, the second cable having moved, thus locking the first cable by virtue of the fact that one of the second cable's knobs 3305 is between the first cable's knobs 3303 and 3304, preventing their movement in either direction. FIG. 33c shows the lock in the (1,0) position, the first cable having moved, thus locking second cable.

Many other designs are possible which allow knobs to act as locks. FIG. 34, FIG. 35, FIG. 36, and FIG. 37 depict an exemplary knob design which can also enforce the constraint that the only allowed movement in a lock from the (0,1) or (1,0) state is to (0,0). This knob design is more complex, but requires only two knobs (one on each cable) instead of four, to create the desired lock logic.

Figure 34:
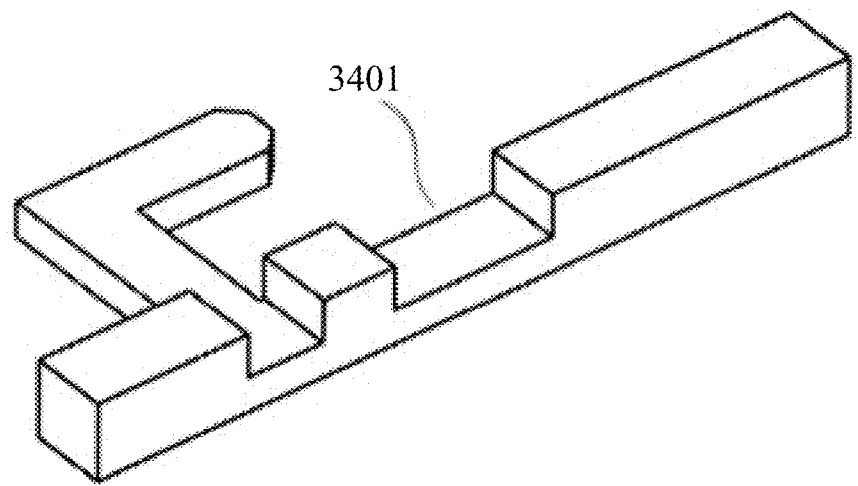
FIG. 34 depicts a ¾ view of a knob which can be used to create a lock.

FIG. 34 shows a single knob 3401. Generally a cable would be attached to either end (not shown), but such knobs could be used in other scenarios as well, such as connected to MLL links.

Figure 35:
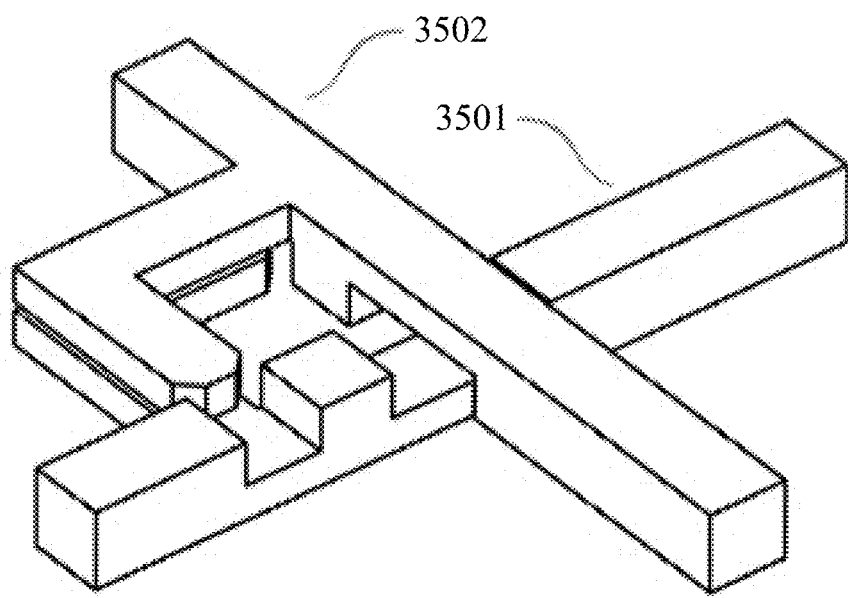
FIG. 35 depicts a ¾ view of two knobs forming a lock in the (0,0) state.

FIG. 35 shows how two such knobs 3501 and 3502, mesh with each other to form a lock. In this figure, the lock is shown in the blank state (meaning, neither knob is positioned to block the movement of the other).

Figure 36:
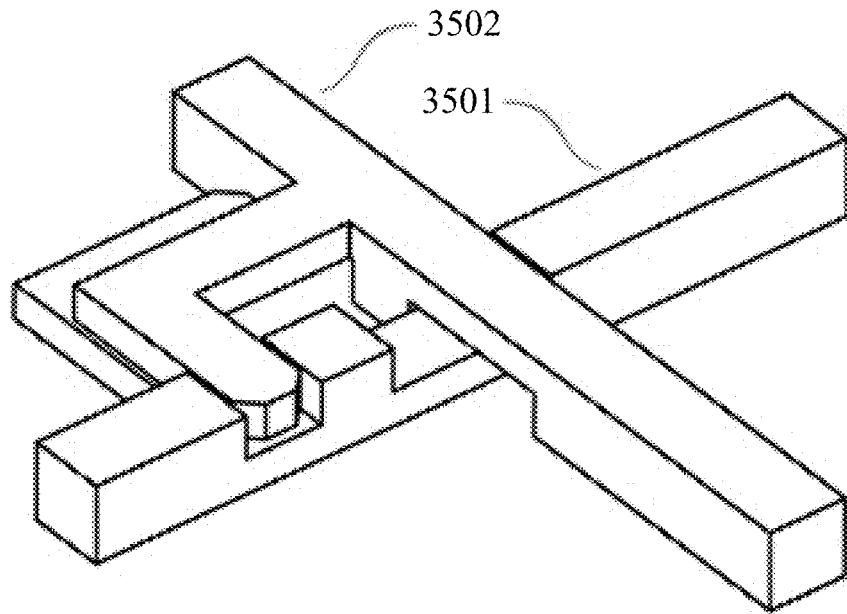
FIG. 36 depicts a ¾ view of a lock in the (0,1) state.
Figure 37:
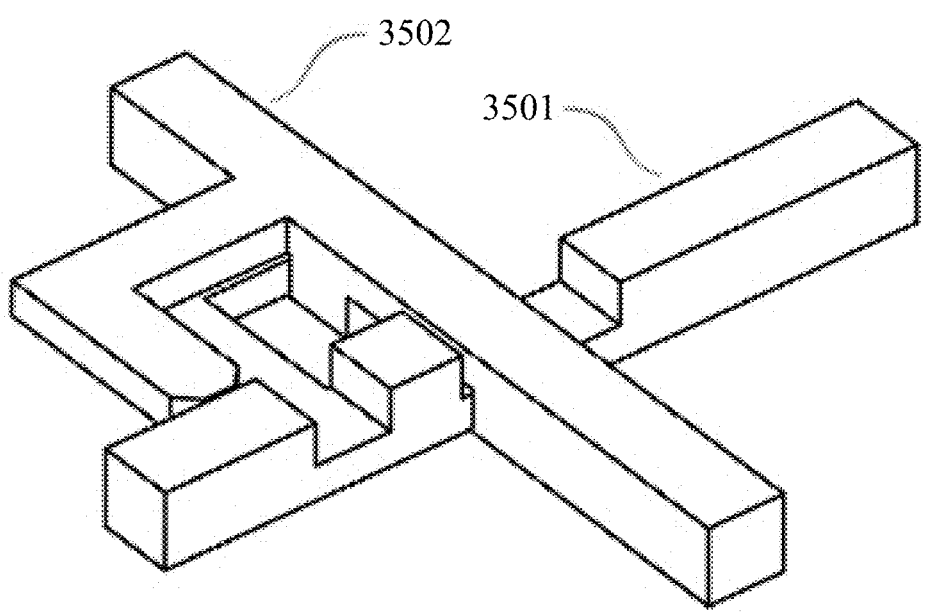
FIG. 37 depicts a ¾ view of a lock in the (1,0) state.
Figure 38:
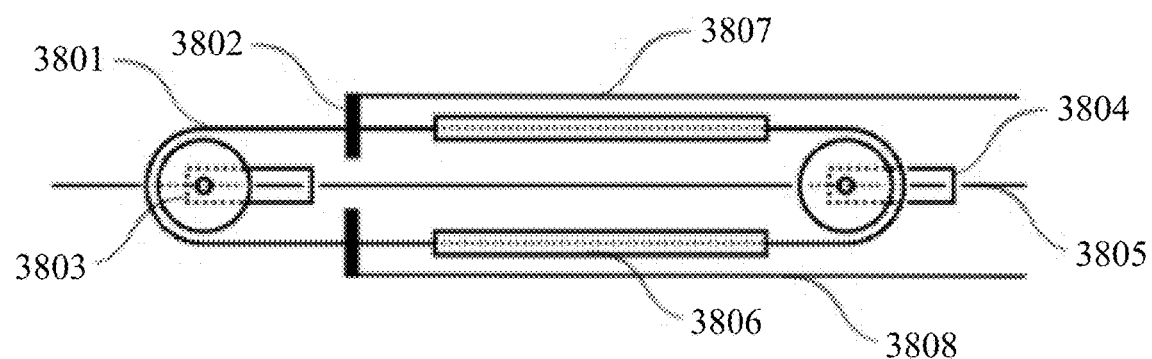
FIG. 38 depicts a top view of an MCL oval.

FIG. 36 and FIG. 37 depict the same knobs 3501 and 3502 in the (0,1) and (1,0) state (or vice versa; since the mechanism is symmetric, the knob that is defined as the 0 knob and that which is defined as the 1 knob is arbitrary).

It can be seen by inspecting the shape of these knobs and their relative positions in the blank, (0,1), and (1,0) states that if two cables or other structures interact via the appropriate movement of such knobs, that constraint that the only movement allowed from the (0,1) or (1,0) state is to the (0,0) state, is enforced.

MCL Ovals

Conceptually, it can be useful to define a structure in MCL called an "oval" since this arrangement of basic parts is one way to create more complex mechanisms such as balances and shift registers.

Figure 39:
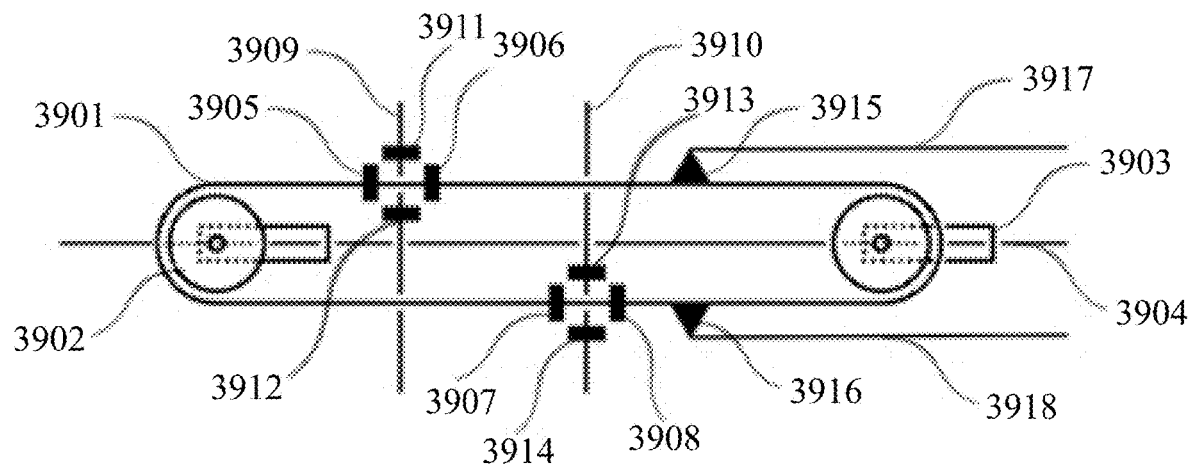
FIG. 39 depicts a top view of an MCL balance in the (0,0) state.

As depicted in FIG. 39, one way to implement an oval uses a closed loop of cable 3801 (referred to as the "logic cable" to distinguish it from cables serving as inputs/outputs, including those providing clock signals, although this distinction is for clarity of description only, since logic cables can also provide input/output, as in the case of crossed ovals which can be used to form cells and shift registers), which may include one or more structures such as knob 3802, and which goes around one or more pulleys such as pulley 3803 (two pulleys are depicted but other numbers could be used to change the shape, length, vibrational and entropic characteristics, or other characteristics of the oval, which despite the name, need not be oval in shape). If one or more of the pulleys can be unanchored, guiding means such as track 3804 may be included. Unanchored pulleys may be actuated (moved along their guiding means) by cable 3805, which may be, e.g., tied to a clock signal.

One or more cable housings such as that exemplified by housing 3806 may be included to reduce energy loss, as described elsewhere herein. Knobs facilitate interaction with other structures and may be connected to one or more input/output cables 3807 and 3808. By itself and in its simplest form, an oval merely takes an input and may (but does not have to), pass it on as an output. For example, if cable 3807 moves and the pulleys are anchored, the opposite side of the logic cable must also move, causing the movement of cable 3808. Thus, the oval may relay data, but no substantial computation is taking place. However, ovals can be designed to carry out computations by interacting with other structures (including, e.g., other ovals, or cables). When coupled with locks, this is one way to construct a balance via MCL.

MCL Balances

FIG. 39 depicts a balance as part of an oval. Balances and ovals can also serve as part of a shift register. The balance includes pulley 3902 and the left part of logic cable 3901. FIG. 39 depicts an oval with unanchored pulleys and two crossed cables which provide data input, the two crossed cables coming from, e.g., data cables, or another oval. Optional structures such as cable housings are omitted for clarity, and as usual, an anchor block is assumed to be present, but not depicted. Logic cable 3901 goes around pulley 3902 (and its mate, unlabeled). Both pulleys are mounted on tracks, exemplified by 3903. Clock line 3904 actuates the mechanism by pulling on the pulleys, which will cause them to slide in their tracks. The logic cable has two pairs of knobs 3905 and 3906, and 3907 and 3908. Cables 0 3909 and cable 1 3910 provide input to the oval. Each crossed cable has a pair of knobs 3911 and 3912, and 3913 and 3914, respectively. By crossing the oval (at right angles in this diagram, but other angles and designs can be used), cables 0 and 1 can position their knobs to interact with the knobs of the oval. Triangular knobs 3915 and 3916 (shown as triangular only to visually distinguish them from the other knobs; this shape is not significant) are connected to the 1 output line 3917, and the 0 output line 3918, respectively. This configuration is just exemplary. The output lines could just as easily be, e.g., positioned differently, or connected to the appropriate lock knobs rather than using separate knobs.

Figure 40:
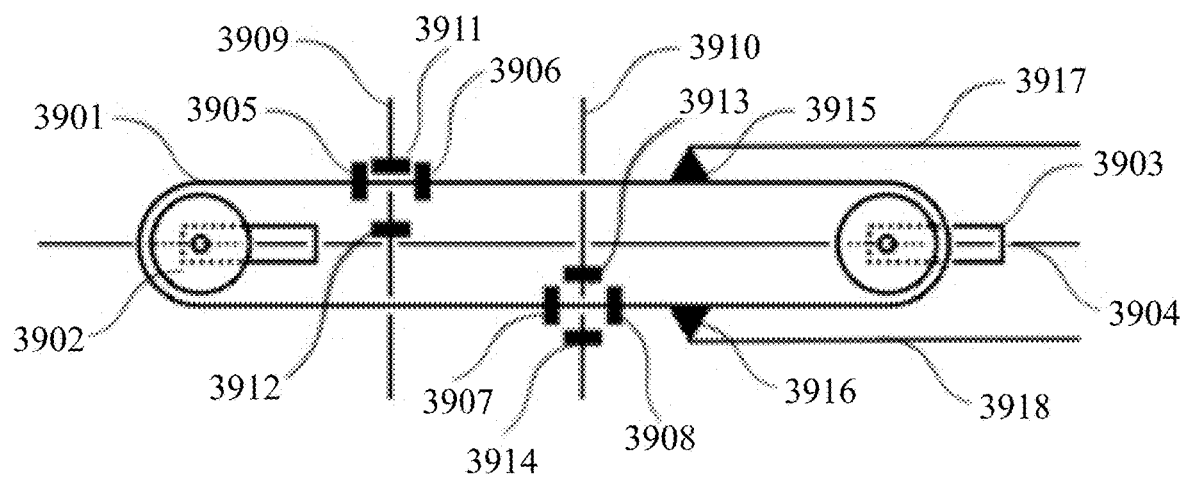
FIG. 40 depicts a top view of an MCL balance in the (0,1) state.
Figure 41:
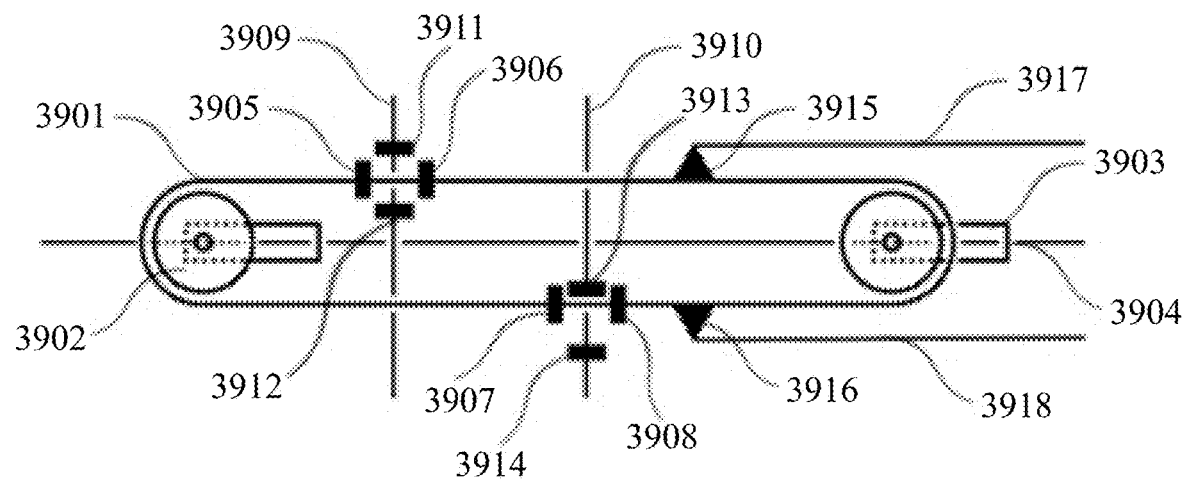
FIG. 41 depicts a top view of an MCL balance in the (1,0) state.

FIG. 39, FIG. 40, and FIG. 41 differ only in the position of the input cable knobs. In FIG. 39, both locks are in the blank position; meaning that the input cable knobs and the logic cable knobs would not interact if the mechanism were actuated. In FIG. 40, cable 3909 has moved knobs 3911 and 3912 so that knob 3911 is now between two of the knobs on the logic cable, 3905 and 3906. This can be considered an input of 0, since the zero input line has moved. If the mechanism were actuated in this state, the upper side of the oval would be prohibited from moving, as knobs 3905, 3906, 3911 and 3912 form a lock which is then locked.

In FIG. 41, cable 3909 has not moved, but instead cable 3910 has moved. This can be considered an input of 1, since the 1 cable has moved. The effect is to lock the opposite side of the oval by placing knob 3913 between knobs 3907 and 3908. This locking of one side or the other of an oval is analogous to locking one side or the other of the appropriate link in an MLL balance. The functioning of the oval-based balance is as follows: Assume that the starting position of the pulleys is at the left side of their respective tracks. When the inputs are set, the input cables lock either the upper or lower side of the oval. The clock line then moves the pulleys from the left to the right. The lateral movement of the pulleys is the same regardless of the inputs. However, the side of the logic cable that moves is determined by the inputs. Whichever side of the logic cable is locked is forced to remain stationary. Therefore, when the pulleys move, only the unlocked side of the logic cable moves. This results in the movement of the 0 output line if an input of 0 was provided, and movement of the 1 output line if an input of 1 was provided.

Figure 42:
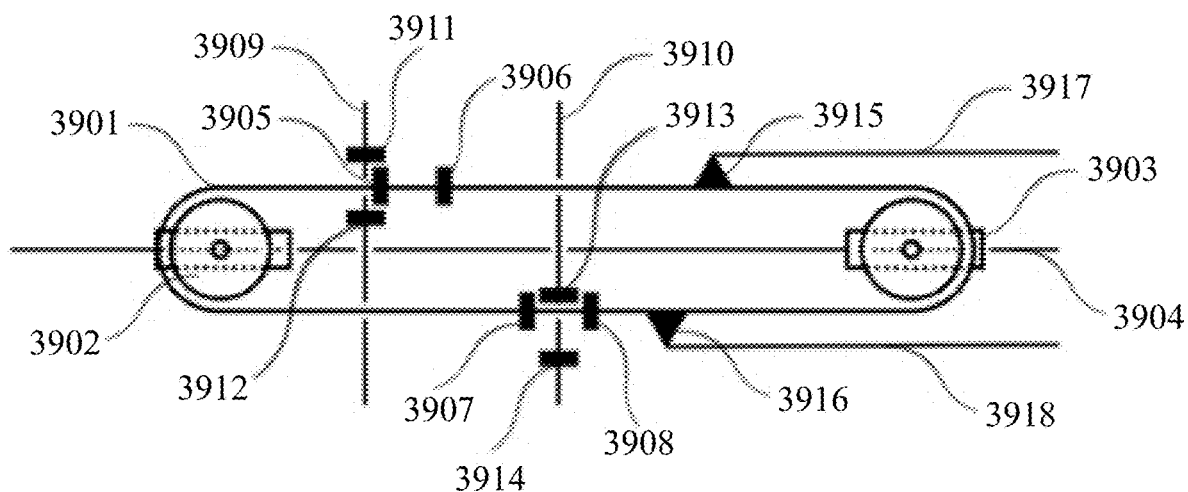
FIG. 42 depicts a top view of an MCL balance in the (1,0) state after actuation.

FIG. 42 shows the position of the mechanism assuming that an input of 1 was provided and then the clock line moved the pulleys to the right. Since knob 3913 had moved between knobs 3907 and 3908, the lower side of the oval was locked. Therefore, when the pulleys move to the right, the logic cable must follow in the only manner possible: by rolling the logic cable so that knob 3915, and thus the 1 output line 3917, moves to the right. Note that data cables such as 3909 and 3910 are not the only manner of providing input to an oval, and output cables such as 3917 and 3918 are not the only way of obtaining output from an oval. For example, crossed ovals can interact directly, the logic cable of one oval serving as an input to a neighboring oval. Given that, when coupled with locks, input can be used to control which side of an oval moves, this is analogous to the functioning of an MLL or MFL balance. And, since Turing-complete systems were shown to be possible using only locks and balances in MLL, it follows that MCL can also implement Turing-complete systems.

Moving Mass

One advantage to some MCL embodiments is reduced moving mass as compared to some embodiments of MLL or MFL. Because cables are not required to be rigid, they can have a smaller cross section and correspondingly lower mass than MLL links of equivalent length. A conventional example of this principle is to compare the mass of a cable with the mass of a beam-like structure. In general, a structure which only has to withstand tensile forces can be made less massive than a structure which must also withstand, e.g., compressive or bending forces. At the molecular scale, examples of strong but flexible structures which might be used as cable include carbyne (linear acetylenic carbon), polyacenes, polyethylene, and polyiceanes, although many other structures could be used.

A potential disadvantage to the use of cables is that the flexibility can allow vibrational modes that would not exist in a stiffer structure. Further, these vibrational modes may change as the length of a given section of cable changes. For example, if the distance between two pulleys changes, changing the length of the cable segment between them, the allowed vibrational modes may change, just like fretting a guitar string at different positions. This also results in entropic changes to the system. Either of these effects can lead to energy dissipation.

However, these vibrational and entropic issues can be addressed while still keeping the moving mass of the mechanisms low. This can be accomplished by constraining cables in such as manner as to prevent them from being free to vibrate. One embodiment of this concept would be to have cables lie in trenches in the anchor block. Such trenches, if thought of as having a rectangular cross section (though this need not be the case) would constrain the cable on three sides, with the fourth side being open to facilitate routing the cable out of the trench to interact with pulleys. It is also possible to constrain a cable on all sides, such as the way a Bowden wraps its inner cable in a sheath or housing. If this sheath is relatively rigid, and the internal space of the sheath appropriately sized as compared to the cable, essentially no vibration will be permitted within the sheath. A molecular example of this would be a polyyne cable in a (9,0) SWNT (single-walled nanotube), but obviously many structures could be used, preferably those which are rigid, closely fit the cable and the sheath, and which allow the cable to slide freely in the sheath (but not to vibrate substantially).

While short segments of cable may be exposed between trenches, sheaths, or other types of housings, and where the cable contacts a pulley, these segments will be relatively short compared to overall cable length, marginalizing the energy loss from cable vibrations and entropic changes. Since the cable housings need not move with the cable, moving mass is kept low, potentially allowing systems with higher switching frequencies as compared to systems that require more massive rigid links instead of flexible cables.

Also, a cable system could be implemented with fluids inside housings. A solid plug at one end of the housing would push on the fluid, which in turn pushes on another plug at the opposite end of the housing. Like a closed loop of cable, by actuating at either end, this can effectively provide a "cable" (though made of a fluid, which includes a gas) which can be pushed or pulled on by actuating the appropriate end. Such designs could also be used to implement balances and locks, moving the parts hydraulically rather than via a solid link or cable. While a hydraulic system would not traditionally be called a cable, it is considered to be a cable system herein as the logical and mechanical functioning is almost identical to that of a solid cable.

Larger Mechanisms and Systems

It should be apparent to one skilled in the art that mechanical components such as logic gates and shift register cells can be combined to form larger scale computing structures in a manner analogous to the well-known procedures for forming computers from electronic logic gates and shift register cells. For purposes of illustration, some examples of larger scale structures are shown. The examples depicted employ MLL locks and balances for clarity of illustration; one skilled in the art should appreciate that MFL or MCL locks and balances could be substituted, or MLL, MFL, and/or MCL schemes could be employed with different connection schemes to obtain the desired logic functions.

Figure 43A:
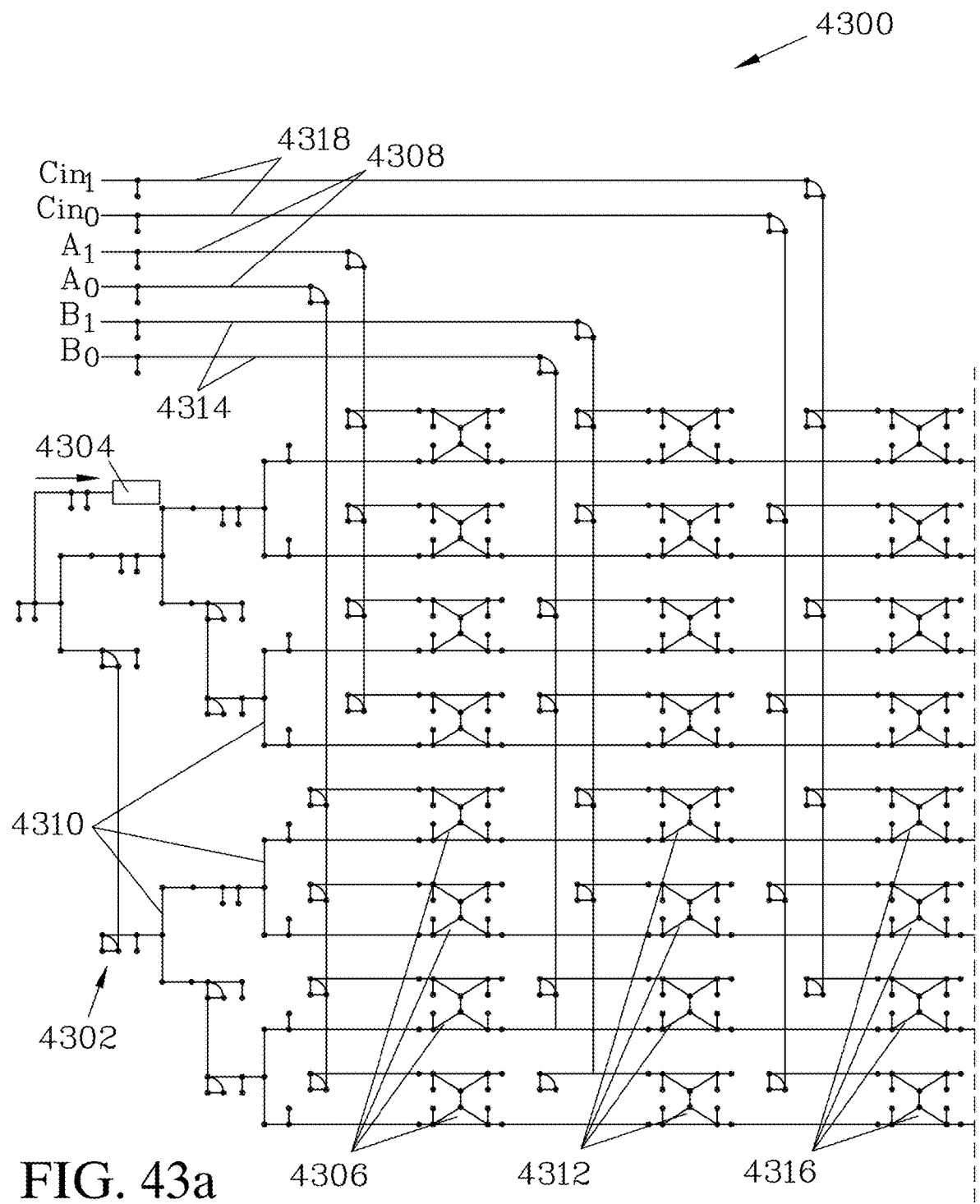
FIG. 43a depicts a top view of the left half of a 1-bit full adder formed using locks and balances.
Figure 43B:
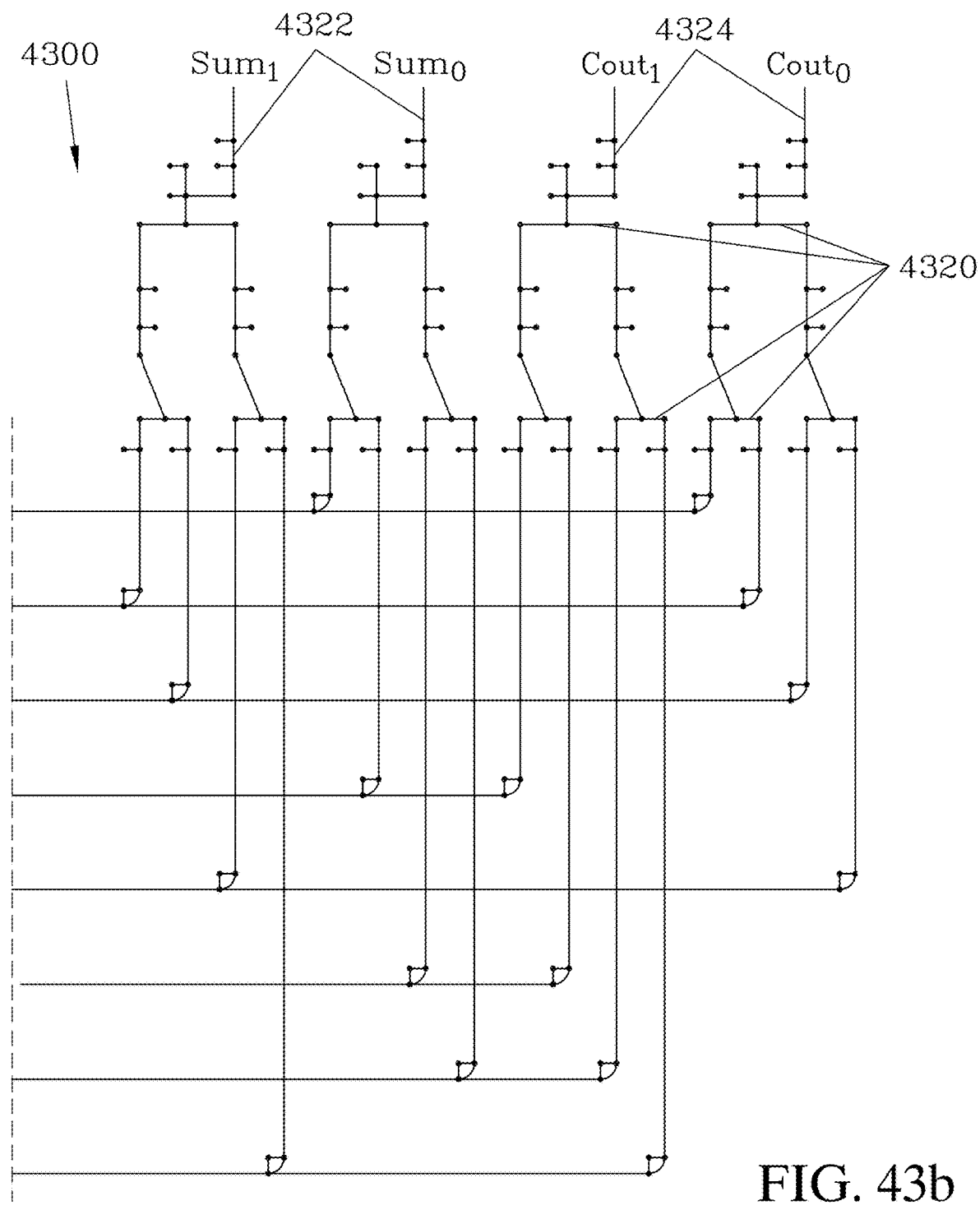
FIG. 43b depict a top view of the right half of the 1-bt full adder shown in FIG. 43a FIG. 44 is a block diagram depicting a multi-bit adder formed by cascading eight 1-bit adders such as shown in FIGS. 43a & 43b.

FIGS. 43a and 43b illustrates one example of a 1-bit full adder 4300 employing a lock-and-balance MLL scheme, and including clock distribution structure 4302 for distributing signals from a clock 4304 to a first series 4306 of locks, which are set responsive to A inputs 4308. The clock distribution structure 4302 is formed by an arrangement of links and bellcranks that serve to distribute and, as necessary, redirect the clock signal; the distribution structure 4302 includes an array of balances 4310 that allow the clock signal to be directed along a path of unlocked links. Those outputs of the first series 4306 that are not locked are moved by the clock signal, and in turn serve to drive a second series 4312 of locks, which are set responsive to B inputs 4314. The outputs from the second series 4310 in turn drive a third series 4316 of locks, which are set responsive to $C_{IN}$ (carried value) inputs 4318. Depending on the value of the inputs (4308, 4314, 4318), the clock force is selectively transferred through an array of output balances 4320 (shown in FIG. 43b) to sum outputs 4322 and carry value outputs 4324 to provide the desired output values based on the values of the inputs (4308, 4314, 4318). For the full adder shown, the outputs (4322, 4324) are defined by the inputs (4308, 4314, 4318) according to the following truth table:

| INPUTS | | | | | | OUTPUTS | | | |
|---|---|---|---|---|---|---|---|---|---|
| 4308 | | 4314 | | 4318 | | 4322 | | 4324 | |
| $A_0$ | $A_1$ | $B_0$ | $B_1$ | $Cin_0$ | $Cin_1$ | $Sum_0$ | $Sum_1$ | $Cout_0$ | $Cout_1$ |
| 1 | 0 | 1 | 0 | 1 | 0 | 1 | 0 | 1 | 0 |
| 1 | 0 | 1 | 0 | 0 | 1 | 0 | 1 | 1 | 0 |
| 1 | 0 | 0 | 1 | 1 | 0 | 0 | 1 | 1 | 0 |
| 1 | 0 | 0 | 1 | 0 | 1 | 1 | 0 | 0 | 1 |

| INPUTS | | | | | | OUTPUTS | | | |
|---|---|---|---|---|---|---|---|---|---|
| 4308 | | 4314 | | 4318 | | 4322 | | 4324 | |
| $A_0$ | $A_1$ | $B_0$ | $B_1$ | $Cin_0$ | $Cin_1$ | $Sum_0$ | $Sum_1$ | $Cout_0$ | $Cout_1$ |
| 0 | 1 | 1 | 0 | 1 | 0 | 0 | 1 | 1 | 0 |
| 0 | 1 | 1 | 0 | 0 | 1 | 1 | 0 | 0 | 1 |
| 0 | 1 | 0 | 1 | 1 | 0 | 1 | 0 | 0 | 1 |
| 0 | 1 | 0 | 1 | 0 | 1 | 0 | 1 | 0 | 1 |

Figure 44:
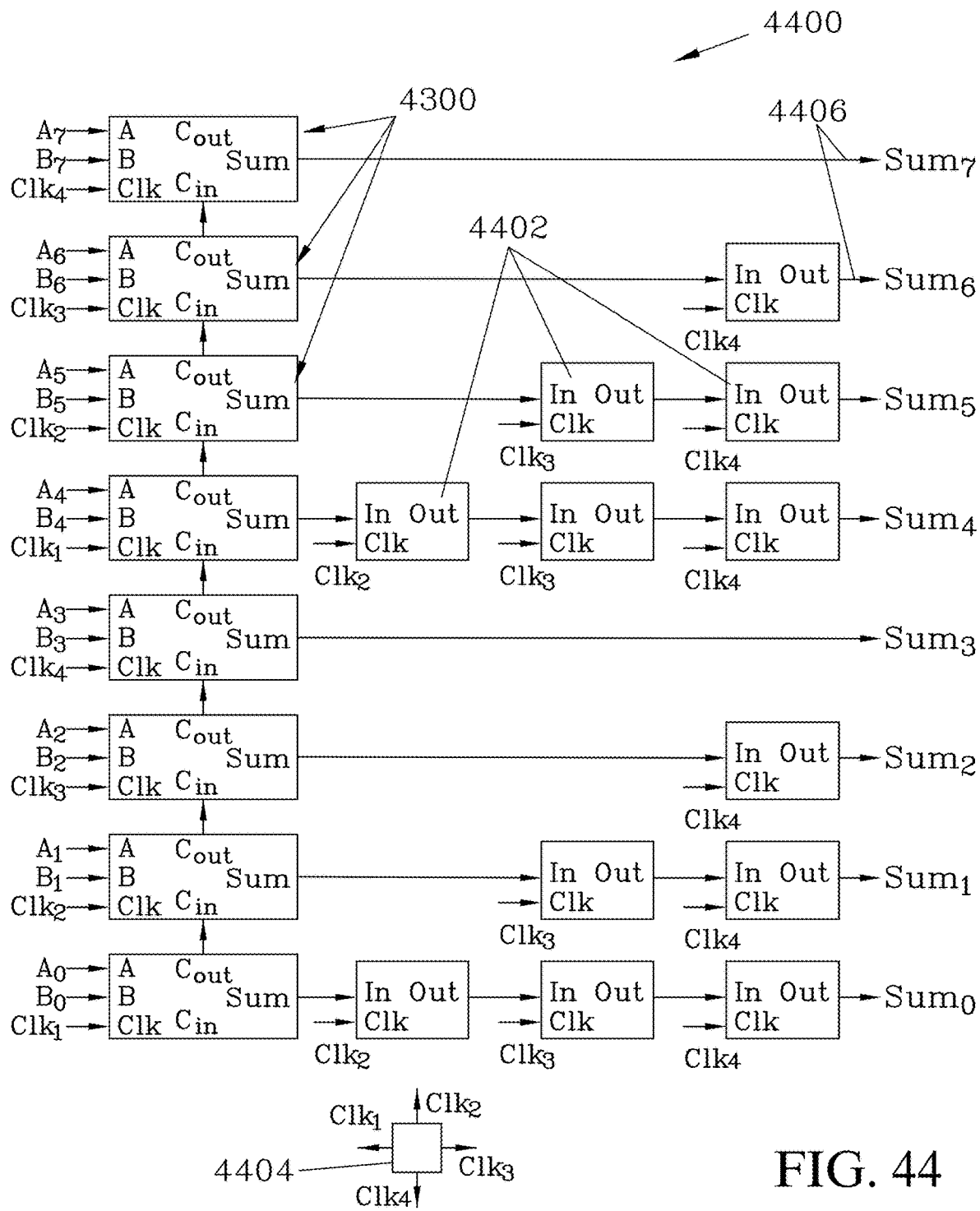

Several adders 4300 can be combined together into a cascade 4400, as shown in FIG. 44, and combined with shift register cells 4402 (such as described with respect to FIGS. 28a & 28b) and a four-phase clock 4404 to add multiple bits. The adders 4300 are cascaded together using ripple carry, while the shift register cells 4402 form a delay line that stores portions of the results during the computation. The final result is provided by cascade outputs 4406 after two full clock cycles.

FIG. 45 shows one simple example of a four-phase mechanical clock 4500, which could be used to provide a four-phase clock signal for the cascade 4400 shown in FIG. 44, for a 4-cell shift register 4502 as shown in FIG. 46, or for other mechanical logic structures. The clock 4500 has a rotating cam 4504 that moves four followers (4506-1, 4506-2, 4506-3, & 4506-4). Each of the followers (4506-1, 4506-2, 4506-3, & 4506-4) is connected to an associated clock input on the logic structure being driven, and may be directed through bellcranks, balances, and similar distribution structures as needed (one example of such a distribution structure is shown in FIG. 48b). In the example illustrated, the followers (4506-1, 4506-2, 4506-3, & 4506-4) are each respectively connected to a clock input (4508-1, 4508-2, 4508-3, & 4508-4) of a shift register cell (4510-1, 4510-2, 4510-3, & 4510-4), as shown in FIG. 46. The shift register cells (4510-1, 4510-2, 4510-3, & 4510-4) can each function in a manner similar to the shift register cells illustrated in FIGS. 25-28a, with the output of one cell setting the lock inputs of the following cell. Each follower (4506-1, 4506-2, 4506-3, 4506-4) is displaced to follow the surface contour of the cam 4504.

The cam 4504 shown in this example has surface arc segments (4512, 4514) having two different radii (R1, R2). Thus, the cam 4504 moves the followers (4506-1, 4506-2, 4506-3, 4506-4) between two positions, with a dwell time at each position. The followers (4506-1, 4506-2, 4506-3, 4506-4) are positioned at four radial positions about the cam 4504, and thus are moved to advance the associated clock input (4508-1, 4508-2, 4508-3, 4508-4) at four different phases as the cam 4504 rotates, each phase separated by 90°.

Because the followers (4506-1, 4506-2, 4506-3, 4506-4) are positioned to move in different directions as they move towards and away from the axis of rotation of the cam 4504, the direction of the movement may need to be redirected to move the associated clock input (4508-1, 4508-2, 4508-3, 4508-4) in the appropriate direction. For example, when the follower 4506-1 engages the surface arc segment 4512 having smaller radius R1, it moves inwards (to the right as shown in FIGS. 45 & 46), and since it is directly connected to the clock input 4508-1, the clock input 4508-1 also moves to the right, pushing and moving whichever elements of the cell 4510-1 are not currently locked. In this example, the follower 4506-1 is stabilized in its movement by parallel pivot links 4516-1 that are mounted to an anchor block 4518-1. In comparison, the follower 4506-2 is positioned vertically, and when it engages the arc segment 4512 it moves downward, but the clock input 4508-2 is positioned to be pushed to the right (the same direction as clock input 4508-1); thus, in this case the direction of motion must be changed. To redirect the motion in this example, the follower 4506-2 is mounted to an anchor block 4518-2 by a stabilizing pivot link 4516-2, but also by a bellcrank 4520-2, which is also pivotably connected to a clock input extension 4522-2, and arranged such that pivoting of the bellcrank 4520-2 caused by downward motion of the follower 4506-2 acts to move the clock input extension 4522-2 to the right. The clock input extension 4522-2 is in turn directly connected to the clock input 4508-2, and moves it to the right to push and move whichever elements of the cell 4510-2 are not locked. While not shown, similar motion-redirecting structures can be employed to connect the followers 4506-3 and 4506-4 to their respective clock inputs 4508-3 and 4508-4, so that in each case, radial inward movement of the follower (4506-1, 4506-2, 4506-3, 4506-4) as it comes into engagement with the smaller-radius surface arc segment 4512 causes the associated clock input (4508-1, 4508-2, 4508-3, 4508-4) to move to the right. Similarly, radial outward movement of the follower (4506-1, 4506-2, 4506-3, 4506-4) when it comes into engagement with the larger-radius surface arc segment 4514 causes the associated clock input (4508-1, 4508-2, 4508-3, 4508-4) to move to the left. Again, one example of such redirecting structure for all four inputs is shown in FIG. 48b.

Figure 47:
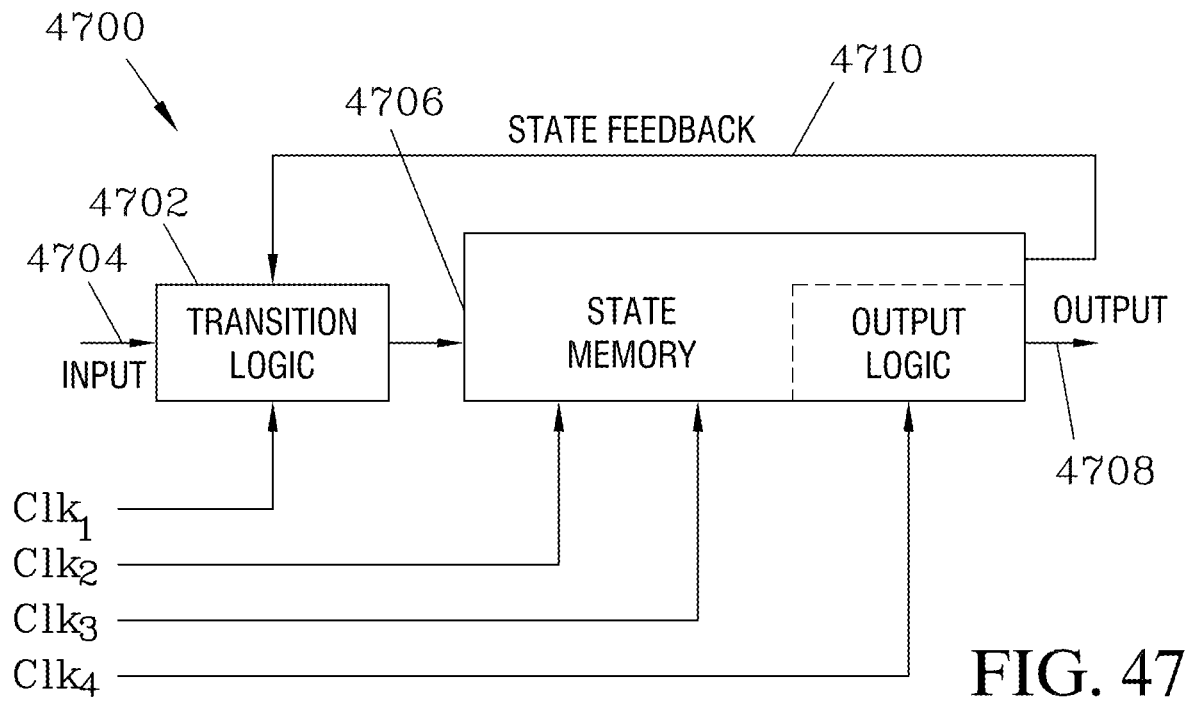
FIG. 47 depicts a block diagram of a generic Moore machine driven by a 4-phase clock, the machine combines combinatorial and sequential logic functions.

FIG. 47 is a block diagram that illustrates on example of a simple mechanical computing device that combines combinatorial and sequential logic functions, a Moore machine 4700. The machine 4700 has a transition logic block 4702 that receives inputs 4704 and, in this example, is driven by a first phase clock signal generated by a 4-phase clock (it should be apparent to one skilled in the art that other clocking schemes could be employed, depending on the details of the logic structures employed). The outputs of the transition logic unit 4702 are provided as inputs to a state memory and output logic block 4706, which is driven by the second, third, and fourth phase clock signals, and where the input values are operated on to provide outputs 4708. A state feedback linkage 4710 conveys information on the state stored in the state memory and output logic unit 4706 back to the transition logic unit 4704.

Figure 48A:
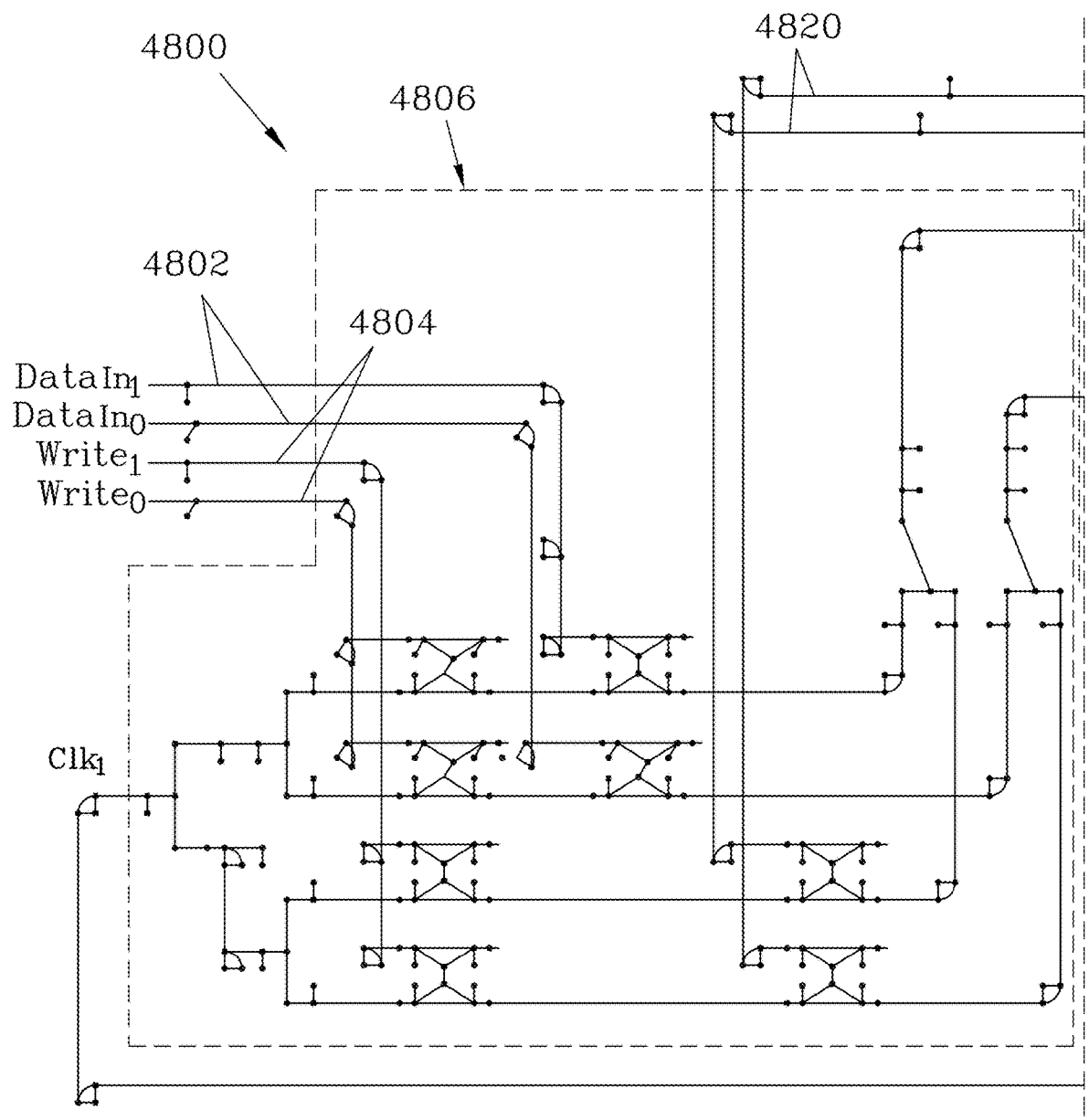
FIG. 48a depicts a top view of the left half of one example of a finite state machine, showing one example of how combinatorial and sequential logic functions can be provided by a structure formed by locks and balances.
Figure 48B:
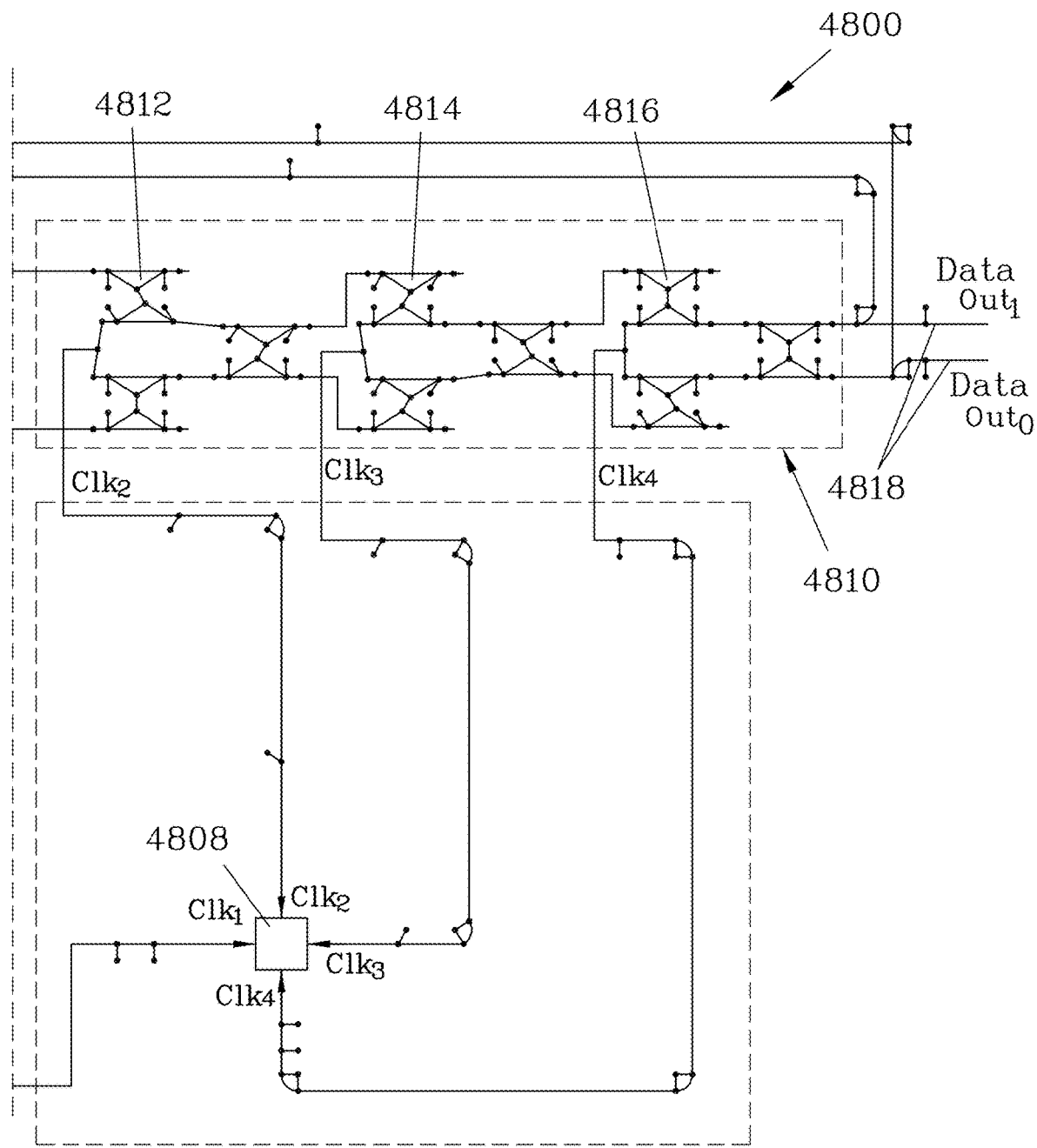

FIGS. 48a and 48b illustrate one specific example of a finite state machine 4800 which can provide combined combinatorial and sequential logic functions, and provides one example of a device such as shown in block diagram in FIG. 47. The machine 4800 employs locks and balances to perform state transitions. The machine 4800 has data inputs 4802 and write enable inputs 4804 that set the positions of locks in a transition logic block 4806, which is driven by the first phase of a 4-phase clock 4808 (shown in FIG. 48b). Outputs of the transition logic block 4806 serve as inputs to a state memory & output logic block 4810 (shown in FIG. 48b), which in this example is arranged as a 3-cell shift register driven by the second, third, and fourth phases of the clock 4808. The cells 4812, 4814, and 4816 provide state memory which, in combination with the inputs provided by the transition logic block 4806, set the value of data outputs 4818. The value of the data outputs 4818 are also conveyed back to the transition logic block 4806 by feedback linkages 4820.

Figure 49:
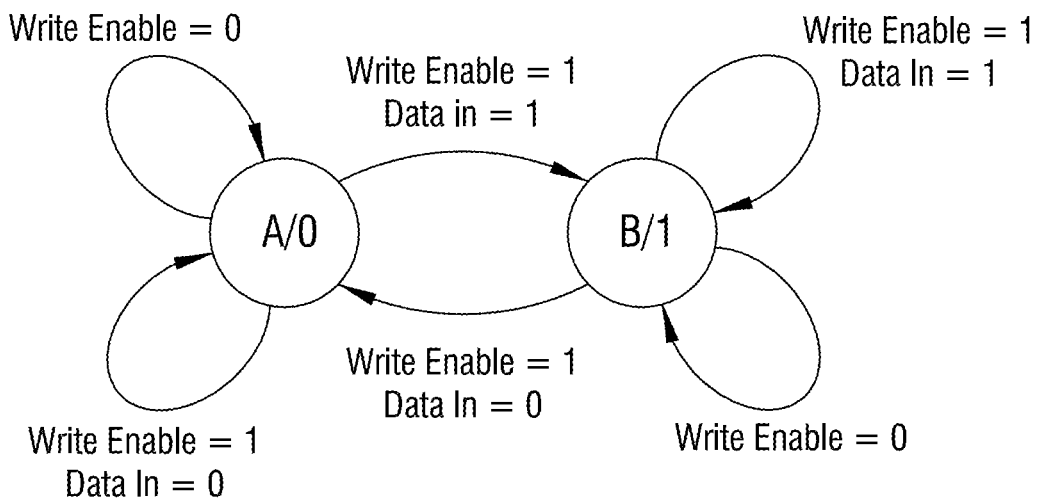
FIG. 49 depicts the state transitions for the finite state machine shown in FIGS. 48a & 48b.

FIG. 49 is a diagram illustrating the state transitions of the machine 4800, which result in the following truth table:

| Current State | Write Enable Inputs | Data Inputs | Next State | Data Outputs |
|---|---|---|---|---|
| A | 0 | 0 | A | 0 |
| A | 0 | 1 | A | 0 |
| A | 1 | 0 | A | 0 |
| A | 1 | 1 | B | 0 |
| B | 0 | 0 | B | 1 |
| B | 0 | 1 | B | 1 |
| B | 1 | 0 | A | 1 |
| B | 1 | 1 | B | 1 |

Figure 50:
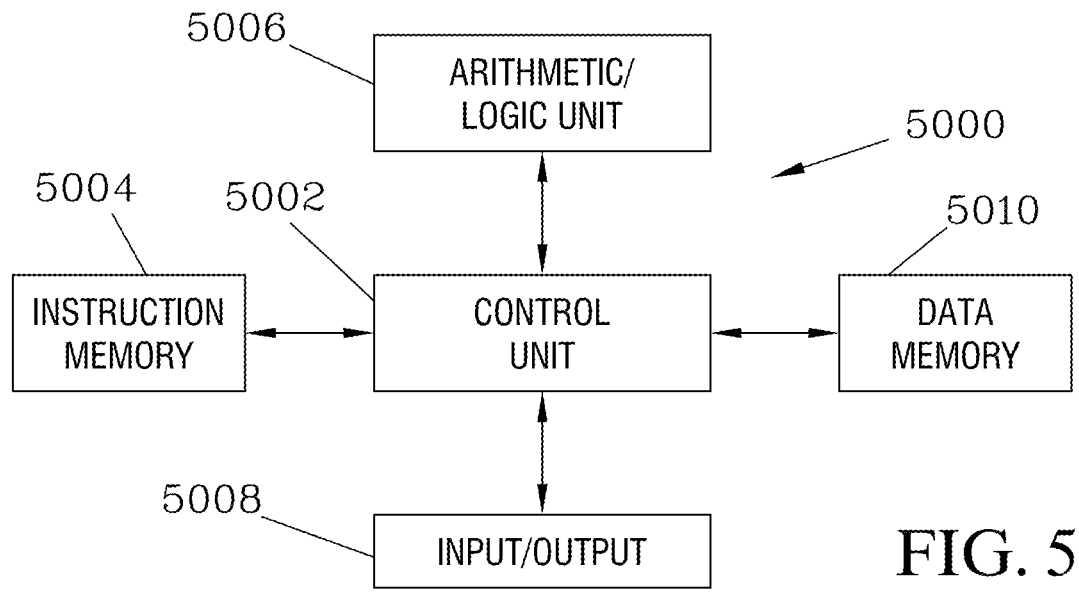
FIG. 50 depicts a computing system that employs the Harvard architecture.
Figure 51:
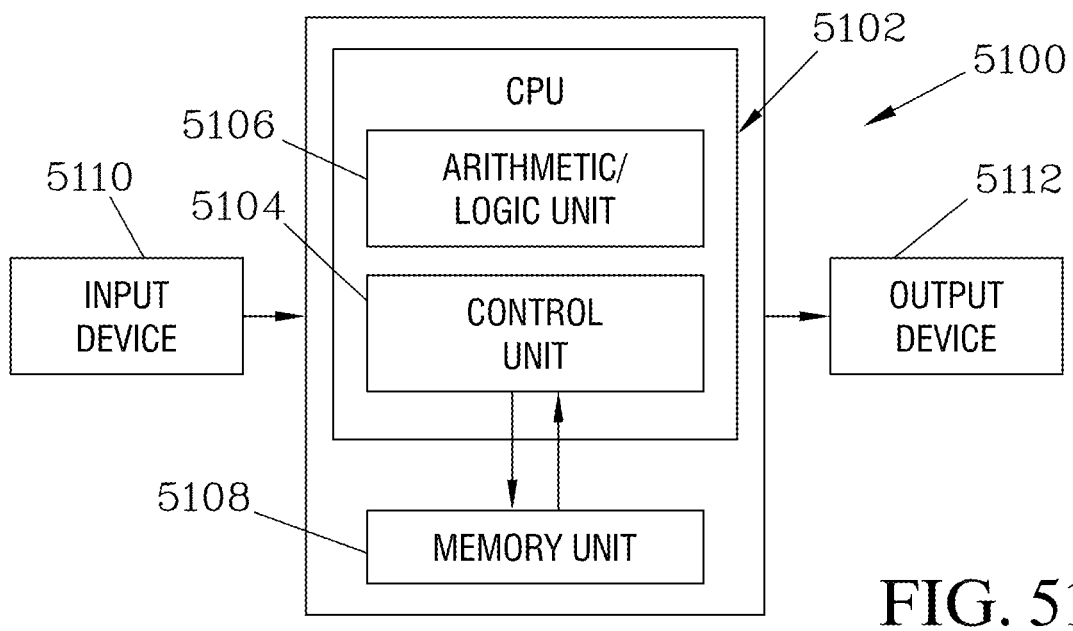
FIG. 51 depicts a computing system that employs the Von Neumann architecture.

By combining lower-level structures that provide combinatorial logic, sequential logic, or a combination of both, more complex computing systems can be constructed, using principals that parallel those well known in the analogous art of constructing electronic computers from lower-level devices. This includes, for example, all components required to form a complete computing system: memory (whether instruction or data), a control unit and an arithmetic logic unit (which taken together form a CPU), and input/output capability. FIGS. 50 and 51 illustrate two examples of computer architectures could be employed. FIG. 50 illustrates a computer 5000 employing the Harvard architecture, having a control unit 5002 that interacts directly with an instruction memory 5004, an arithmetic logic unit 5006, an input/output interface 5008, and a data memory 5010. FIG. 51 illustrates a computer 5100 employing the Von Neumann architecture, having a CPU 5102 that contains a control unit 5104 and an arithmetic logic unit 5106, and which interacts with a memory unit 5108. Separate input and output devices 5010 and 5012 are provided. Alternative architectures could be employed such as others known in the art for electronic computers and variations thereof; some architectures may offer particular benefits for use with mechanical computing that differ from the optimization considerations for electronic computing. It should also be appreciated that it is possible to have a hybrid electro-mechanical computer; examples of mechanical and hybrid mechanical/electrical computing systems are known in the art, such as Conrad Zeus's Z3 electro-mechanical computing system.

When scaling up lower-level devices to provide higher-level computing systems, the use of four-phase clocking can serve to isolate individual cells in a shift register or other "layers" (i.e., sequential logic structures where the output of one logic structure provides the inputs to a subsequent logic structure). In such cases, forces along signal lines cannot move beyond two cells before encountering a locked lock, preventing any attenuation of forces over long distances. At any point in time, a cell is either blocked from transmitting forces to adjacent cells, or can transmit forces only to one other cell (either the predecessor or the successor). In contrast, un-clocked mechanical logic systems (i.e., systems where an original clock signal is passed sequentially through a series or chain of logic structure "layers") allow forces to attenuate as they are transmitted over multiple logic levels, which can be a problem. It is sometimes advantageous to use logic systems that span as many logic levels as possible without an intervening clock to isolate the logic levels. Unclocked logic can have advantages over clocked logic, including speed and simplicity. However, one benefit of clocked logic is signal regeneration between sequential logic "layers" or series. Force attenuation in link logic systems can be mitigated because each lock acts as a mechanical amplifier, with a small force controlling a larger one (e.g., the clock force).

Eliminating Superfluous Parts

Figure 52:
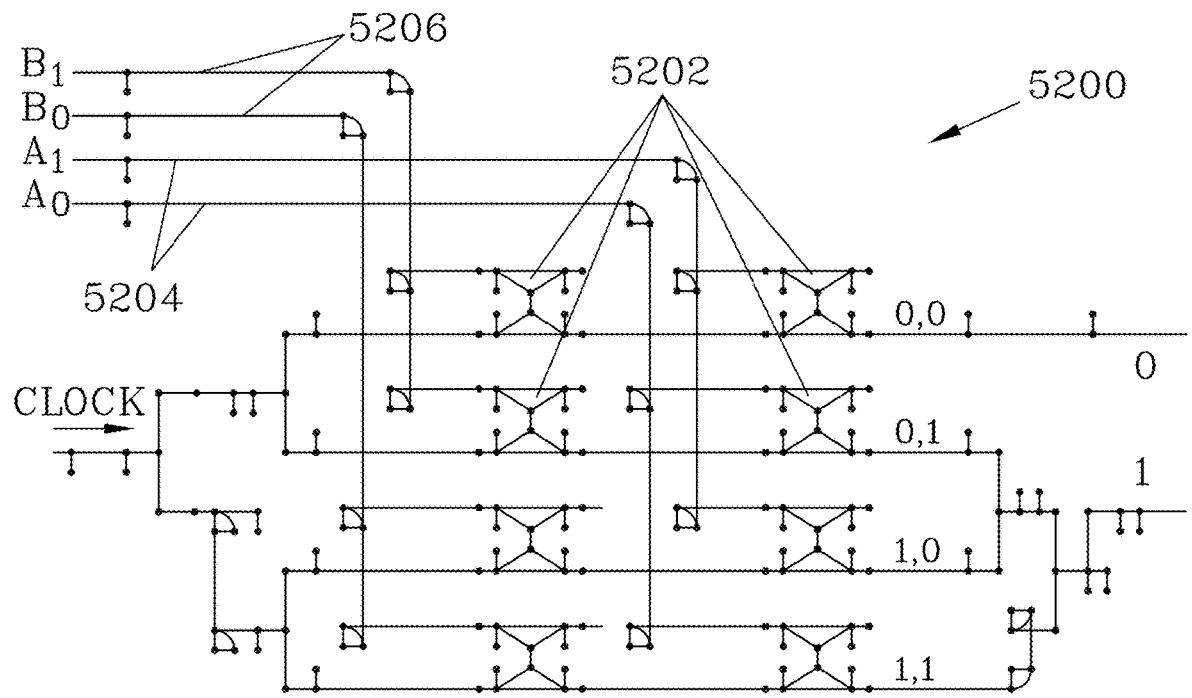
FIG. 52 depicts a top view of a NOR gate employing MLL locks and balances.
Figure 53:
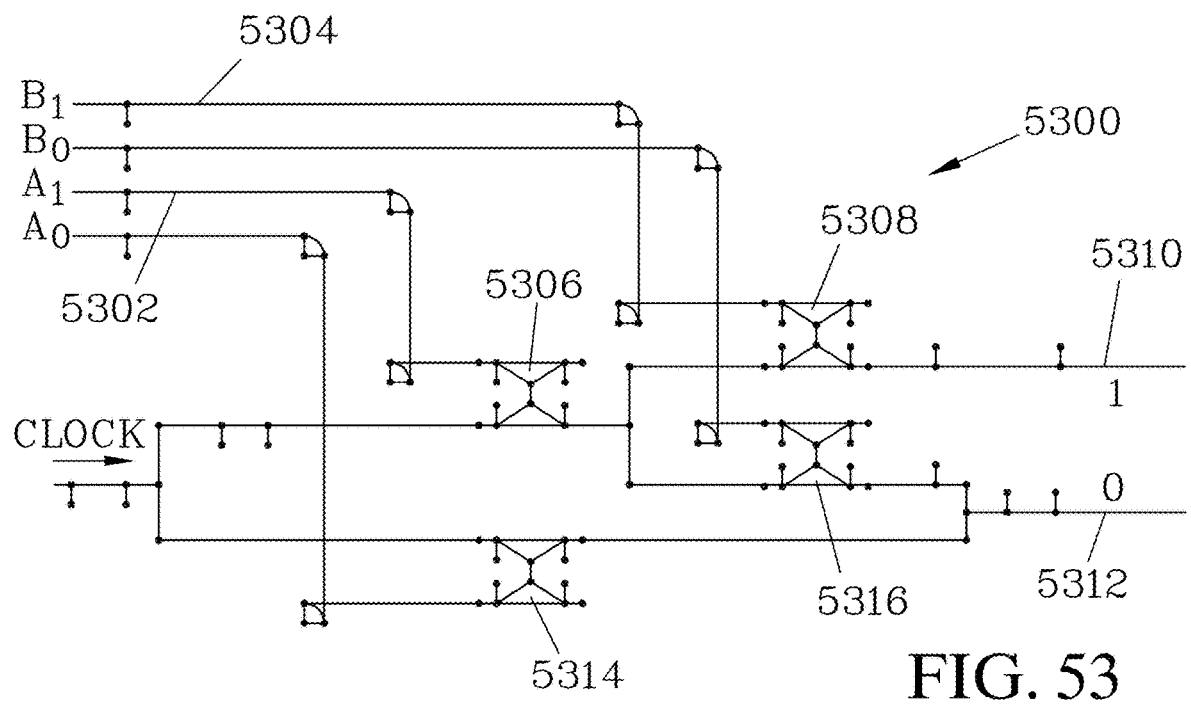
FIG. 53 depicts a top view of a simplified NOR gate employing MLL locks and balances.

There are multiple ways that logic gates can be designed using the paradigms discussed herein to obtain a desired function. In many cases, the inputs to a logic gate can be functionally combined, since not all inputs may need to be directed individually in order to provide the desired logic output, and thus structures to process some combinations of input values may be superfluous. As an example, FIGS. 52 and 53 compare two different structures for providing a NOR logic function. FIG. 52 shows a NOR gate 5200 employing an array of eight locks 5202, arranged in two stages, each responsive to either A inputs 5204 or to B inputs 5206. The state of each input (5204, 5206) is represented in the locks 5202. However, to obtain the desired NOR logic output, if either the A input 5204 or the B input 5206 is 1, the resulting output is 0 regardless of the value of the other input; thus, if one of the inputs (5204, 5206) is 1, the locks 5202 that serve to represent the value of the other input (5204, 5206) can be considered superfluous, because either value of that other input will result in the same output value of 0. FIG. 53 illustrates a NOR gate 5300 which avoids such redundancy, and thus requires fewer parts than the NOR gate 5200. In the NOR gate 5300, either of 1-value inputs 5302 and 5304 acts on an associated lock 5306 or 5308 to lock the path of force to a 1-value output 5310 so that it cannot move, and only a 0-value output 5312 is possible, regardless of the value of the other input. As a result, only two additional locks 5314 and 5316 are needed to address the case where neither of the A or B 1-value inputs (5302, 5304) has locked the 1-value output 5310. The resulting structure requires only 4 locks, as well as reducing the remaining elements required to provide the logic output. Other logic operations may be similarly subject to simplification by looking for input conditions where the value of a single input determines the output, regardless of the other input values, and then pruning the unnecessary pathways of the mechanism, avoiding the inclusion of superfluous structures. This concept can be applied beyond 2-input/1-output gates as well. For example, it could be applied to Toffoli or Fredkin gates, and could be done at higher levels of circuit design as well, such as never sending (or never computing in the first place), an input to a gate or higher-level structure which can be determined to be logically superfluous.

Interfacing with Electronic Components

Figure 54:
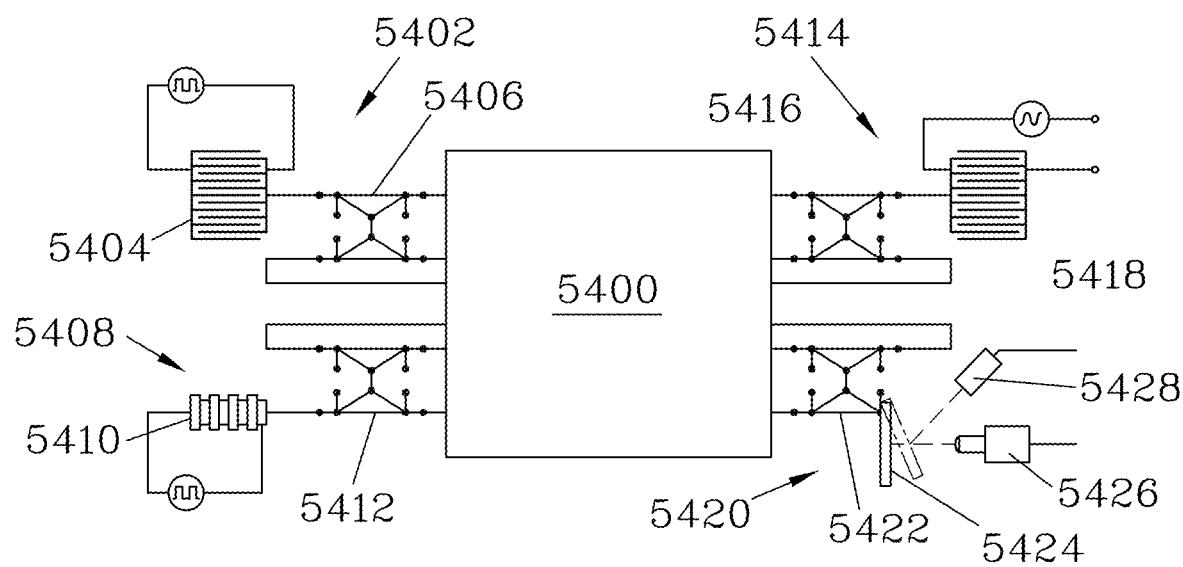
FIG. 54 depicts a top view of examples of input and output devices for interfacing a mechanical computing device with electronic signals.
Figure 55:
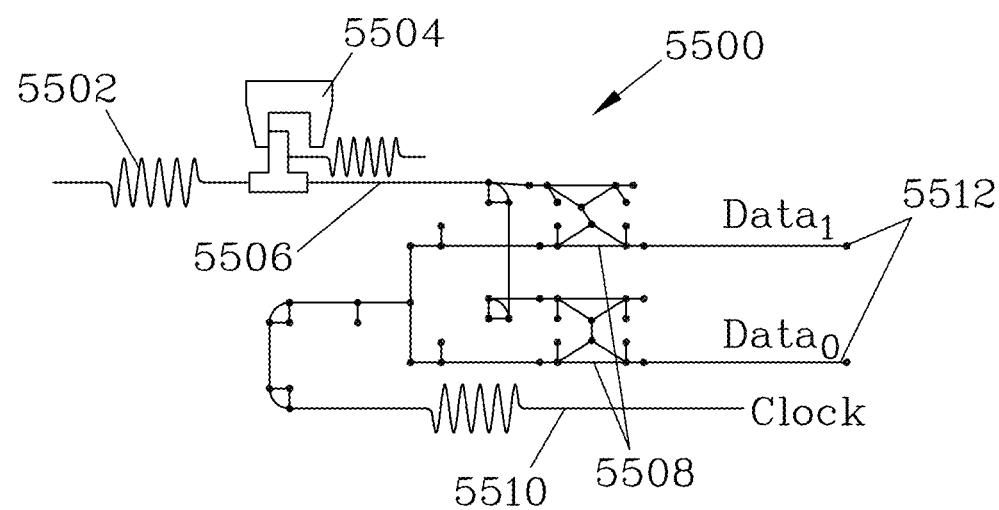
FIG. 55 depicts a signal conditioner for removing noise from an input and limiting the magnitude of the displacement.

In many potential applications where a mechanical computer, or mechanical computing mechanism, is used it may still be desirable to interface the mechanical elements to conventional electronic input and/or output devices. FIG. 54 illustrates some examples of devices that could be employed to transfer information into and out of a mechanical computing device 5400. In one example of an input interface 5402, a conventional electrostatic MEMS comb actuator 5404 is used to move a link on an input lock 5406 when the input lock 5406 is in an unlocked state. The link moved can then serve to position one or more input elements within the computing device 5400. Another example of an input interface 5408 employs a piezo-electric actuator 5410, which moves a link of an input lock 5412 when in an unlocked state. As an example of an output device, an output interface 5414 employs an output lock 5416 that, when unlocked, moves a link responsive to one or more output elements to move a MEMS variable capacitor 5418, the value of which is read by conventional electronics. In another example of an output interface 5420, an output lock 5422 has a movable link that, when in an unlocked state, can move a mirror 5424 that modulates an optical signal from a light source 5426 that provides a signal to a conventional optoelectronic detector 5428.

In some cases, input signals may be noisy and asynchronous, with amplitudes exceeding the allowed range of motion for the mechanical logic devices. In such cases, the signals can be conditioned using mechanisms such as the input conditioner 5500 shown in FIG. 54. The input conditioner 5500 employs a conditioning spring 5502 in combination with a mechanical motion stop 5504 to limit the movement of an initial input element 5506. FIG. 54 also shows a pair of input locks 5508 that are controlled by a clock input 5510 and act to synchronize the movement of the initial input element 5506 to provide synchronized motion of one of two conditioned input elements 5512.

Type 1-4 Systems

As mentioned previously, due to the use of ratchets and pawls, detents, springs, or other mechanisms which store and then release potential energy in a manner not directly tied to the systems' computational degrees of freedom, all pre-existing Turing-complete systems for mechanical computing can be categorized as Type 1. Due to possible energy savings, all other things being equal, Type 2-4 systems would be preferred over Type 1 systems, with Type 4 systems being most preferred. MLL, MFL, and MCL are all capable of creating Type 2-4 systems. In fact, most of the embodiments described herein would result in Type 4 systems, while adding, e.g., springs to some mechanisms (such as between the gradual lock depicted in FIG. 9 and other mechanisms, to permit backlash) could result in a Type 2 system, and some designs which, e.g., could leave locks in the (0,0) state with some non-trivial frequency could result in a Type 3 system (although this can be avoided with proper design; locks being in the (0,0) state need not mean that parts are free to move, as can be seen in the mechanism described herein).

It may not be immediately apparent that MFL can be used to create Type 3-4 systems, as flexures may seem to store potential energy by their very nature. Indeed, some flexure-based designs, if using the flexures to store potential energy and then release it to some effect on the system, would be categorized as Type 1 or Type 2. However, in MFL, flexures need not be used for potential energy storage. Rather, their function can be solely to provide kinematic restraint, just as the analogous structure in MLL, the rotary joint, does. As such, the force needed to bend a flexure can be arbitrarily small as long as the flexure still provides the necessary rigidity with respect to the relevant degrees of freedom. This leads to the conclusion that the potential energy storage of flexures can be trivial, just like the potential energy stored in the stretching of MCL cables, or the stretching, bending, or compression of MLL links.

Further, even if the force required to bend a flexure were substantial, since flexures are not being using to actuate movement in a Type 3-4 system, systems can be designed where the net potential energy of the flexures is essentially 0. For example, a pair of flexures connected to a link could be pre-stressed in opposite directions. The movement of the link in one direction would increase the potential energy of one of the flexures, while decreasing the potential energy of the other flexure, resulting in no net change (and therefore no net increase in the force required to move the link) over some allowed range of motion.

Ending Comments

The present application incorporates by reference material published by Merkle, R., Freitas, R., et al., (2016), "Molecular Mechanical Computing Systems," Institute for Molecular Manufacturing, by Hogg, T., Moses, M., and Allis, D., (2017), "Evaluating the friction of rotary joints in molecular machines", Molecular Systems Design and Engineering, v. 2, pp. 235-252, and by Merkle, R., Freitas, R., et al. (2018), "Mechanical computing systems using only links and rotary joints", ASME Journal on Mechanisms and Robotics v. 10 pp. 061006.

Three exemplary paradigms for mechanical computing, MLL, MFL, and MCL, have been described. Each of these paradigms are capable of providing both the combinatorial logic and the sequential logic required to create a Turing-complete computational system. Each design paradigm also allows for reversible computing, and simulations of molecular-scale mechanisms indicate that properly designed embodiments of MLL can compute with levels of energy dissipation under the Landauer Limit. There is no reason to think that MFL and MCL cannot provide similar efficiency.

Four classes of computing systems have been described, designated Types 1-4. Type 1 systems have the lowest ultimate potential for energy efficiency, and are the only type of computational system previously enabled. MLL, MFL, and MCL share physical and logical parallels, in some sense being three embodiments of the same concepts. Each is capable not only of Turing-complete computing, but also of providing Type 2, Type 3, and Type 4 systems (alone, or in combination with each other), allowing for decreased energy dissipation. Each also has a very low number of types of required primitives, with MLL and MFL only requiring two basic parts, and MCL requiring three, reducing the complexity of system design, manufacture, and assembly. Further, not only are a very small number of basic parts required, but none of the basic parts include gears, ratchets and pawls, detents, or many other common mechanisms that are widely used in other systems, but which are likely to dissipate excessive energy through friction or vibration. Finally, each are capable are creating computational systems which use dry switching; no power need be wasted by applying force to a basic part or mechanism, only to find that it will not move due to its logical state.

Given the teachings herein, including multiple embodiments that demonstrate the overarching design principles of being able to provide Turing-complete computing, reversible if desired, via Type 2-4 systems, with very few types of primitives, which lend themselves to the creation of energy-efficient mechanisms, both due to the nature of the mechanisms themselves, and because such mechanisms and systems can be designed to use dry switching, it will be apparent that variations using different mechanisms or primitives could be created, and it is the high-level design paradigms, not the specific embodiments, which should be seen as the boundaries of the invention.

The invention claimed is:

1. A computing system comprising:
   at least one clock providing at least one mechanical clock signal;
   an anchor block;
   an arithmetic/logic unit operated by said at least one clock, said arithmetic/logic unit receiving data inputs and having a plurality of combinatorial logic mechanisms that operate on said data inputs to provide outputs,
      wherein, for at least a subset of said plurality of combinatorial logic mechanisms, each of said combinatorial logic mechanisms can operate on at least one data input to provide at least one output, requiring only the use of primitives selected from the group consisting of rigid links, pulleys, cables, and knobs, selected ones of which are movably connected to said anchor block by joints selected from the group consisting of pivot joints and flexures;

a memory unit operated by said at least one clock and having a plurality of mechanical memory cells, said memory unit being connected to said arithmetic/logic unit so as to store selected outputs therefrom as memory states and to provide selected memory states as inputs to said arithmetic/logic unit, wherein, for at least a subset of said plurality of mechanical memory cells, each of said mechanical memory cells can store and provide outputs requiring only the use of primitives selected from the group consisting of rigid links, pulleys, cables, and knobs, selected ones of which are movably connected to said anchor block by joints selected from the group consisting of pivot joints and flexures and wherein at least a subset of said combinatorial logic mechanisms and said mechanical memory cells are each constructed from a plurality of locks and balances connected so as to perform a desired operation.

2. The computing system of claim 1 wherein, for at least a subset of mechanical memory cells in said plurality, the connections between primitives in such mechanical memory cells remain unbroken as said mechanical memory cells operate.

3. The computing system of claim 1 wherein, for at least a subset of combinatorial logic mechanisms in said plurality,
the connections between primitives in each of such combinatorial logic mechanisms remain unbroken as said combinatorial logic mechanisms operate, and
any non-trivial storage and release of potential required to operate such combinatorial logic mechanisms occurs at the speed of one of said mechanical clock signals.

4. The computing system of claim 1 wherein, for at least a subset of combinatorial logic mechanisms and mechanical memory cells in said pluralities, storage or release of non-trivial amounts of potential energy is not required to position said outputs.

5. The computing system of claim 1 wherein at least a subset of said combinatorial logic mechanisms are configured to provide reversible logic gates.

6. The computing system of claim 1 wherein at least a subset of said combinatorial logic mechanisms and said mechanical memory cells are configured such that operation does not require transmitting force to any part that is not free to move in response to such force.

7. The computing system of claim 6 wherein at least a subset of said combinatorial logic mechanisms and said mechanical memory cells are each constructed from a plurality of locks and balances connected so as to perform a desired operation,
each balance having a movable balance actuating element and a plurality of movable balance driven elements which move when said balance actuating element moves, unless blocked from such movement, and
said locks being connected to said balance driven elements and configured such that the positions of lock input elements determine which of said balance driven elements are blocked from moving when said balance actuating element moves.

8. A computing system comprising:
at least one clock providing at least one mechanical clock signal;
an anchor block;
an arithmetic/logic unit operated by said at least one clock, said arithmetic/logic unit receiving data inputs and having a plurality of combinatorial logic mechanisms that operate on said data inputs to provide outputs, wherein, for at least a subset of combinatorial logic mechanisms in said plurality, the connections between elements in each of such combinatorial logic mechanisms remain unbroken as said combinatorial logic mechanism operates;

a memory unit operated by said at least one clock and having a plurality of mechanical memory cells, said memory unit being connected to said arithmetic/logic unit so as to store selected outputs therefrom as memory states and to provide selected memory states as inputs to said arithmetic/logic unit, and wherein, for at least a subset of said mechanical memory cells in said plurality, the connections between elements in each of such mechanical memory cells remain unbroken as said mechanical memory cell operates and at least a subset of said combinatorial logic mechanisms and said mechanical memory cells are each constructed from a plurality of locks and balances connected so as to perform a desired operation.

9. The computing system of claim 8 wherein those combinatorial logic mechanisms and mechanical memory cells in which the connections between elements remain unbroken during operation are each operated by one of said mechanical clock signals, and any non-trivial storage and release of potential energy that is required to operate such combinatorial logic mechanisms and mechanical memory cells occurs at the speed of one of said mechanical clock signals.

10. The computing system of claim 8 wherein, for at least a subset of combinatorial logic mechanisms and mechanical memory cells in said pluralities, storage or release of non-trivial amounts of potential energy is not required to position said outputs.

11. The computing system of claim 8 wherein at least a subset of said combinatorial logic mechanisms are configured to provide reversible logic gates.

12. The computing system of claim 8 wherein at least a subset of said combinatorial logic mechanisms and said mechanical memory cells are configured such that operation does not require transmitting force to any part that is not free to move responsive to such force.

13. The computing system of claim 12 wherein at least a subset of said combinatorial logic mechanisms and said mechanical memory cells are each constructed from a plurality of locks and balances connected so as to perform a desired operation,
each balance having a movable balance actuating element and a plurality of movable balance driven elements which move when said balance actuating element moves, unless blocked from such movement, and
said locks being connected to said balance driven elements and configured such that the positions of lock input elements determine which of said balance driven elements are blocked from moving when said balance actuating element moves.

14. A computing system comprising:
at least one clock providing at least one mechanical clock signal;
an anchor block;
an arithmetic/logic unit operated by said at least one clock, said arithmetic/logic unit receiving data inputs and having a plurality of combinatorial logic mechanisms that operate on said data inputs to provide outputs, wherein, for at least a subset of said plurality of combinatorial logic mechanisms, said combinatorial logic mechanisms do not require storage or release of non-trivial amounts of potential energy to operate;

a memory unit operated by said at least one clock and having a plurality of mechanical memory cells, said memory unit being connected to said arithmetic/logic unit so as to store selected outputs therefrom as memory states and to provide selected memory states as inputs to said arithmetic/logic unit, and wherein, for at least a subset of said plurality of mechanical memory cells, said mechanical memory cells do not require storage or release of non-trivial amounts of potential energy to operate and at least a subset of said combinatorial logic mechanisms and said mechanical memory cells are each constructed from a plurality of locks and balances connected so as to perform a desired operation.

15. The computing system of claim 14 wherein at least a subset of said combinatorial logic mechanisms are configured to provide reversible logic gates.

16. The computing system of claim 14 wherein at least a subset of said combinatorial logic mechanisms and said mechanical memory cells are configured such that operation does not require transmitting force to any part that is not free to move responsive to such force.

17. The computing system of claim 16 wherein at least a subset of said combinatorial logic mechanisms and said mechanical memory cells are each constructed from a plurality of locks and balances connected so as to perform a desired operation, each balance having a movable balance actuating element and a plurality of movable balance driven elements which move when said balance actuating element moves, unless blocked from such movement, and said locks being connected to said balance driven elements and configured such that the positions of lock input elements determine which of said balance driven elements are blocked from moving when said balance actuating element moves.

18. A computing system comprising:

at least one clock providing at least one mechanical clock signal;

an anchor block;

an arithmetic/logic unit operated by said at least one clock, said arithmetic/logic unit receiving data inputs and having a plurality of combinatorial logic mechanisms configured to operate on said inputs to provide outputs;

a memory unit operated by said at least one clock and having a plurality of mechanical memory cells, said memory unit being connected to said arithmetic/logic unit so as to store selected outputs therefrom as memory states and to provide selected memory states as inputs to said arithmetic/logic unit;

wherein at least a subset of said combinatorial logic mechanisms and said mechanical memory cells are each constructed from a plurality of locks and balances connected so as to perform a desired operation, each balance having a movable balance actuating element and a plurality of movable balance driven elements which move when said balance actuating element moves, unless blocked from such movement, and said locks being connected to said balance driven elements and configured such that the positions of lock input elements determine which of said balance driven elements are blocked from moving when said balance actuating element moves.

19. The computing system of claim 18 wherein at least a subset of said combinatorial logic mechanisms are configured to provide reversible logic gates.

* * * * *